(12) United States Patent
Kelly et al.

(10) Patent No.: US 11,652,038 B2
(45) Date of Patent: *May 16, 2023

(54) SEMICONDUCTOR PACKAGE WITH FRONT SIDE AND BACK SIDE REDISTRIBUTION STRUCTURES AND FABRICATING METHOD THEREOF

(71) Applicant: Amkor Technology Singapore Holding Pte. Ltd., Singapore (SG)

(72) Inventors: Michael Kelly, Queen Creek, AZ (US); David Hiner, Chandler, AZ (US); Ronald Huemoeller, Gilbert, AZ (US); Roger St. Amand, Tempe, AZ (US)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/195,106

(22) Filed: Mar. 8, 2021

(65) Prior Publication Data

US 2021/0217692 A1 Jul. 15, 2021

Related U.S. Application Data

(63) Continuation of application No. 16/260,674, filed on Jan. 29, 2019, now Pat. No. 10,943,858, which is a
(Continued)

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC .............. H01L 23/49838; H01L 23/49827
(Continued)

(56) References Cited

U.S. PATENT DOCUMENTS 3,462,349 A 8/1969 Gorgenyi
3,868,724 A 2/1975 Perrino
(Continued)

FOREIGN PATENT DOCUMENTS

CN 202443963 U 9/2012
CN 104795382 A 7/2015
(Continued)

OTHER PUBLICATIONS

CN Decision of Rejection for CN Application No. 201610648773.X, dated Mar. 3, 2022, 38 pages.
(Continued)

*Primary Examiner* — Quoc D Hoang
(74) *Attorney, Agent, or Firm* — McAndrews, Held & Malloy, Ltd.

(57) ABSTRACT

A semiconductor device structure and a method for making a semiconductor device. As non-limiting examples, various aspects of this disclosure provide various semiconductor package structures, and methods for making thereof, that comprise a thin fine-pitch redistribution structure.

20 Claims, 28 Drawing Sheets

Related U.S. Application Data continuation of application No. 15/854,095, filed on Dec. 26, 2017, now Pat. No. 10,192,816, which is a continuation of application No. 15/400,041, filed on Jan. 6, 2017, now Pat. No. 9,852,976, which is a continuation of application No. 14/823,689, filed on Aug. 11, 2015, now Pat. No. 9,543,242.

(51) Int. Cl.
    *H01L 21/683* (2006.01)
    *H01L 23/31* (2006.01)
    *H01L 25/07* (2006.01)

(52) U.S. Cl.
    CPC ...... *H01L 21/6835* (2013.01); *H01L 23/3121* (2013.01); *H01L 23/49811* (2013.01); *H01L 23/49816* (2013.01); *H01L 23/49822* (2013.01); *H01L 23/49827* (2013.01); *H01L 25/071* (2013.01); *H01L 2221/6834* (2013.01); *H01L 2221/68327* (2013.01); *H01L 2221/68345* (2013.01); *H01L 2221/68377* (2013.01); *H01L 2221/68381* (2013.01); *H01L 2224/16227* (2013.01); *H01L 2224/16235* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01); *H01L 2924/0002* (2013.01); *H01L 2924/1531* (2013.01); *H01L 2924/15192* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01)

(58) Field of Classification Search
    USPC ...................................................... 257/688
    See application file for complete search history.

(56) References Cited

U.S. PATENT DOCUMENTS

| | | |
|---|---|---|
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | Maciver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Ojennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,193 A | 11/1998 | Eichelberger |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,051,888 A | 4/2000 | Dahl |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,137,062 A | 10/2000 | Zimmerman |
| 6,157,080 A | 12/2000 | Tamaki et al. |
| 6,159,767 A | 12/2000 | Eichelberger |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Pan chou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,294,408 B1 | 9/2001 | Edwards et al. |
| 6,307,161 B1 | 10/2001 | Grube et al. |
| 6,316,285 B1 | 11/2001 | Jiang et al. |
| 6,329,609 B1 | 12/2001 | Kaja et al. |
| 6,351,031 B1 | 2/2002 | Ijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |

(56) References Cited

U.S. PATENT DOCUMENTS

| | | |
|---|---|---|
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,486,005 B1 | 11/2002 | Kim |
| 6,486,554 B2 | 11/2002 | Johnson |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,573,598 B2 | 6/2003 | Ohuchi et al. |
| 6,577,013 B1 | 6/2003 | Glenn et al. |
| 6,586,682 B2 | 7/2003 | Strandberg |
| 6,608,382 B2 | 8/2003 | Liu et al. |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,576 B2 | 4/2004 | Hedler |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,765,287 B1 | 7/2004 | Lin |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leale et al. |
| 6,931,726 B2 | 8/2005 | Boyko et al. |
| 6,943,436 B2 | 9/2005 | Radu et al. |
| 6,953,995 B2 | 10/2005 | Farnworth et al. |
| 6,967,403 B2 | 11/2005 | Chuang et al. |
| 6,982,225 B2 | 1/2006 | Bohr |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,112,882 B2 | 9/2006 | Lee |
| 7,119,432 B2 | 10/2006 | Desai et al. |
| 7,125,744 B2 | 10/2006 | Takehara et al. |
| 7,185,426 B1 | 3/2007 | Hiner et al. |
| 7,192,807 B1 | 3/2007 | Huemoeller et al. |
| 7,196,408 B2 | 3/2007 | Yang et al. |
| 7,198,980 B2 | 4/2007 | Jiang et al. |
| 7,202,107 B2 | 4/2007 | Fuergut et al. |
| 7,215,026 B2 | 5/2007 | Park et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,262,082 B1 | 8/2007 | Lin et al. |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Foong |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,429,786 B2 | 9/2008 | Kamezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,675,131 B2 | 3/2010 | Derderian |
| 7,750,454 B2 | 7/2010 | Carson et al. |
| 7,777,351 B1 | 8/2010 | Berry et al. |
| 7,781,883 B2 | 8/2010 | Sri-Jayantha et al. |
| 7,800,238 B2 | 9/2010 | Pratt |
| 7,825,520 B1 | 11/2010 | Longo et al. |
| 7,902,660 B1 | 3/2011 | Lee et al. |
| 7,928,562 B2 | 4/2011 | Arvelo et al. |
| 7,948,095 B2 | 5/2011 | Ng et al. |
| 7,960,827 B1 | 6/2011 | Miller et al. |
| 7,982,298 B1 | 7/2011 | Kang et al. |
| 7,993,983 B1 | 8/2011 | Lin |
| 8,003,515 B2 | 8/2011 | Meyer et al. |
| 8,004,095 B2 | 8/2011 | Shim et al. |
| 8,008,770 B2 | 8/2011 | Lin et al. |
| 8,035,123 B2 | 10/2011 | Yan et al. |
| 8,058,726 B1 | 11/2011 | Jin et al. |
| 8,067,268 B2 | 11/2011 | Carson et al. |
| 8,106,500 B2 | 1/2012 | Chow |
| 8,222,538 B1 | 7/2012 | Yoshida et al. |
| 8,258,015 B2 | 9/2012 | Chow et al. |
| 8,269,348 B2 | 9/2012 | Fazelpour |
| 8,288,201 B2 | 10/2012 | Pagaila |
| 8,341,835 B1 | 1/2013 | Huemoeller et al. |
| 8,405,228 B2 | 3/2013 | Huang |
| 8,471,154 B1 | 6/2013 | Yoshida et al. |
| 8,471,376 B1 | 6/2013 | Liou et al. |
| 8,471,394 B2 | 6/2013 | Jang et al. |
| 8,508,954 B2 | 8/2013 | Kwon et al. |
| 8,536,462 B1 | 9/2013 | Darveaux et al. |
| 8,552,556 B1 | 10/2013 | Kim et al. |
| 8,604,615 B2 | 12/2013 | Lee et al. |
| 8,624,374 B2 | 1/2014 | Ding et al. |
| 8,643,163 B2 | 2/2014 | Shim et al. |
| 8,674,513 B2 | 3/2014 | Yu et al. |
| 8,759,147 B2 | 6/2014 | Choi et al. |
| 8,773,866 B2 | 7/2014 | Jin et al. |
| 8,829,678 B2 | 9/2014 | Lee et al. |
| 8,946,883 B2 | 2/2015 | Kim et al. |
| 8,981,550 B2 | 3/2015 | Park et al. |
| 9,000,586 B2 | 4/2015 | Do et al. |
| 9,012,789 B1 | 4/2015 | Yoshida et al. |
| 9,048,125 B2 | 6/2015 | Paek et al. |
| 9,064,718 B1 | 6/2015 | Muniandy et al. |
| 9,412,624 B1 | 8/2016 | Cuong |
| 9,543,242 B1 | 1/2017 | Kelly |
| 10,943,858 B2 * | 3/2021 | Kelly .................. H01L 21/4853 |
| 2002/0011657 A1 | 1/2002 | Saito |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0135057 A1 | 9/2002 | Kurita |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0036183 A1 | 2/2004 | Im et al. |
| 2004/0063246 A1 | 4/2004 | Karnezos |
| 2004/0145044 A1 | 7/2004 | Sugaya et al. |
| 2004/0159462 A1 | 8/2004 | Sugaya et al. |
| 2004/0165362 A1 | 8/2004 | Farnworth |
| 2004/0262774 A1 | 12/2004 | Kang et al. |
| 2005/0056928 A1 | 3/2005 | Kwon et al. |
| 2005/0062154 A1 | 3/2005 | Duchesne et al. |
| 2005/0133928 A1 | 6/2005 | Howard et al. |
| 2005/0133932 A1 | 6/2005 | Pohl et al. |
| 2005/0134507 A1 | 6/2005 | Dishongh et al. |
| 2005/0139985 A1 | 6/2005 | Takahashi |
| 2005/0242425 A1 | 11/2005 | Leal et al. |
| 2006/0192301 A1 | 8/2006 | Leal et al. |
| 2006/0208351 A1 | 9/2006 | Poo et al. |
| 2006/0231958 A1 | 10/2006 | Yang |
| 2006/0258044 A1 | 11/2006 | Meyer et al. |
| 2007/0059866 A1 | 3/2007 | Yang et al. |
| 2007/0064395 A1 | 3/2007 | Chen et al. |
| 2007/0069389 A1 | 3/2007 | Wollanke et al. |

(56) References Cited

U.S. PATENT DOCUMENTS

| | | |
|---|---|---|
| 2007/0080757 A1 | 4/2007 | Yahata et al. |
| 2007/0126085 A1 | 6/2007 | Kawano et al. |
| 2007/0132104 A1 | 6/2007 | Farnworth et al. |
| 2007/0273049 A1 | 11/2007 | Khan et al. |
| 2007/0281471 A1 | 12/2007 | Hurwitz et al. |
| 2007/0287265 A1 | 12/2007 | Hatano et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0175939 A1 | 7/2008 | Danovitch et al. |
| 2008/0182363 A1 | 7/2008 | Amrine et al. |
| 2008/0230887 A1 | 9/2008 | Sun et al. |
| 2008/0246133 A1 | 10/2008 | Derderian |
| 2008/0290492 A1 | 11/2008 | Chung et al. |
| 2008/0290496 A1 | 11/2008 | Park |
| 2009/0008765 A1 | 1/2009 | Yamano et al. |
| 2009/0051025 A1 | 2/2009 | Yang et al. |
| 2009/0085201 A1 | 4/2009 | Mathew |
| 2009/0140442 A1 | 6/2009 | Lin |
| 2009/0243073 A1 | 10/2009 | Carson et al. |
| 2009/0289343 A1 | 11/2009 | Chiu et al. |
| 2009/0309206 A1 | 12/2009 | Kim et al. |
| 2010/0007002 A1 | 1/2010 | Pendse |
| 2010/0007032 A1 | 1/2010 | Gallegos |
| 2010/0020503 A1 | 1/2010 | Beaumier et al. |
| 2010/0130000 A1 | 5/2010 | Sutou et al. |
| 2010/0140772 A1 | 6/2010 | Lin et al. |
| 2010/0140779 A1 | 6/2010 | Lin et al. |
| 2010/0144091 A1 | 6/2010 | Kawano et al. |
| 2010/0167451 A1 | 7/2010 | Derderian |
| 2010/0181665 A1 | 7/2010 | Casey et al. |
| 2010/0208432 A1 | 8/2010 | Bhagwagar et al. |
| 2010/0327439 A1 | 12/2010 | Hwang et al. |
| 2011/0031598 A1 | 2/2011 | Lee et al. |
| 2011/0057327 A1 | 3/2011 | Yoshida et al. |
| 2011/0062592 A1 | 3/2011 | Lee et al. |
| 2011/0062602 A1 | 3/2011 | Ahn et al. |
| 2011/0068427 A1 | 3/2011 | Paek et al. |
| 2011/0068478 A1 | 3/2011 | Pagaila et al. |
| 2011/0084382 A1 | 4/2011 | Chen et al. |
| 2011/0175235 A1 | 7/2011 | Horiuchi et al. |
| 2011/0204505 A1 | 8/2011 | Pagaila et al. |
| 2011/0227223 A1 | 9/2011 | Wu et al. |
| 2011/0233782 A1 | 9/2011 | Chang et al. |
| 2011/0237026 A1 | 9/2011 | Farooq et al. |
| 2011/0254156 A1 | 10/2011 | Lin |
| 2012/0056329 A1 | 3/2012 | Pagaila et al. |
| 2012/0061855 A1 | 3/2012 | Do et al. |
| 2012/0069683 A1 | 3/2012 | Kamata et al. |
| 2012/0088332 A1 | 4/2012 | Lee et al. |
| 2012/0094443 A1 | 4/2012 | Pratt et al. |
| 2012/0139097 A1 | 6/2012 | Jin et al. |
| 2012/0153453 A1 | 6/2012 | Ankireddi et al. |
| 2012/0168917 A1 | 7/2012 | Yim et al. |
| 2012/0178218 A1 | 7/2012 | Bauer et al. |
| 2012/0326307 A1 | 12/2012 | Jeong et al. |
| 2012/0326324 A1 | 12/2012 | Lee et al. |
| 2013/0017643 A1 | 1/2013 | Lin et al. |
| 2013/0037942 A1 | 2/2013 | Hwang et al. |
| 2013/0040427 A1 | 2/2013 | Hu et al. |
| 2013/0052775 A1 | 2/2013 | Kim et al. |
| 2013/0062786 A1 | 3/2013 | Leung et al. |
| 2013/0075924 A1 | 3/2013 | Lin et al. |
| 2013/0078765 A1 | 3/2013 | Lin et al. |
| 2013/0078915 A1 | 3/2013 | Zhao et al. |
| 2013/0082399 A1 | 4/2013 | Kim et al. |
| 2013/0134559 A1 | 5/2013 | Lin et al. |
| 2013/0168849 A1 | 7/2013 | Scanlan |
| 2013/0175702 A1 | 7/2013 | Choi et al. |
| 2013/0214402 A1 | 8/2013 | Park et al. |
| 2013/0241039 A1 | 9/2013 | Choi et al. |
| 2013/0249532 A1 | 9/2013 | Lin et al. |
| 2013/0309814 A1 | 11/2013 | Too et al. |
| 2013/0320517 A1 | 12/2013 | Shirley |
| 2013/0328192 A1 | 12/2013 | Lee et al. |
| 2014/0048906 A1 | 2/2014 | Shim et al. |
| 2014/0061893 A1 | 3/2014 | Saeidi et al. |
| 2014/0077366 A1 | 3/2014 | Kim et al. |
| 2014/0084456 A1 | 3/2014 | Kang et al. |
| 2014/0091471 A1* | 4/2014 | Chen .................. H01L 21/6836 |
| | | 257/770 |
| 2014/0124949 A1 | 5/2014 | Paek |
| 2014/0131856 A1 | 5/2014 | Do |
| 2014/0131886 A1 | 5/2014 | Paek et al. |
| 2014/0138817 A1 | 5/2014 | Paek et al. |
| 2014/0210109 A1 | 7/2014 | Tanaka et al. |
| 2014/0217619 A1 | 8/2014 | Zhao et al. |
| 2014/0246779 A1 | 9/2014 | Lin et al. |
| 2014/0252647 A1 | 9/2014 | Huang et al. |
| 2014/0264933 A1 | 9/2014 | Yu et al. |
| 2014/0273354 A1 | 9/2014 | Ramaswami et al. |
| 2014/0284785 A1 | 9/2014 | Sung et al. |
| 2014/0319661 A1 | 10/2014 | Pagaila |
| 2015/0021791 A1 | 1/2015 | Park |
| 2015/0097277 A1 | 4/2015 | Chen et al. |
| 2015/0125993 A1 | 5/2015 | Lee et al. |
| 2015/0137384 A1 | 5/2015 | Huemoeller et al. |
| 2015/0206855 A1 | 7/2015 | Lin |
| 2015/0318262 A1 | 11/2015 | Gu |
| 2016/0071779 A1 | 3/2016 | Chen |
| 2016/0240391 A1* | 8/2016 | Chen ....................... H01L 24/97 |
| 2017/0133310 A1 | 5/2017 | Kelly et al. |

FOREIGN PATENT DOCUMENTS

| | | |
|---|---|---|
| JP | 05-109975 | 4/1993 |
| JP | 05-136323 | 6/1993 |
| JP | 07-017175 | 1/1995 |
| JP | 08-190615 | 7/1996 |
| JP | 10-334205 | 12/1998 |
| JP | 2001-118947 | 10/1999 |
| JP | 2005-333052 | 12/2005 |
| JP | 2006-073622 | 3/2006 |
| JP | 2006-294692 | 10/2006 |
| JP | 2007-043090 | 2/2007 |
| JP | 2011-134818 | 7/2011 |
| KR | 10-1997-005712 | 4/1997 |
| KR | 20-0412028 | 3/2006 |
| KR | 1020060050579 | 5/2006 |
| KR | 10-0787894 | 12/2007 |
| KR | 10-2009-0100895 | 9/2009 |
| KR | 10-0990939 | 11/2010 |
| KR | 10-1056749 | 8/2011 |
| KR | 1020120053332 | 5/2012 |
| KR | 10-1151258 | 6/2012 |
| KR | 1020130092208 | 8/2013 |
| KR | 1020140058268 | 5/2014 |
| TW | 201322411 | 6/2013 |
| TW | 201324735 | 6/2013 |
| TW | 201340284 | 10/2013 |
| TW | 201342502 | 10/2013 |
| TW | 201347132 | 11/2013 |
| TW | 201526125 | 7/2015 |

OTHER PUBLICATIONS

Search Report of Taiwan Patent Application No. 106102772, dated Apr. 26, 2017.
Search Report of Taiwan Patent Application No. 106145325, dated Aug. 22, 2019.
First Notice of Preliminary Rejection, KR10-2019-0058964, dated Aug. 30, 2021, 14 pages.
Second Official Letter, PRC Patent Application No. CN201510648773.X, dated Aug. 20, 2021.
Office Action corresponding to Korean Patent Application No. 10-2012-0061321, 5 pages, dated Jun. 13, 2013.
Office Action corresponding to Korean Patent Application No. 10-2012-0015799, 4 pages, dated May 7, 2013.Office Action corresponding to Korean Patent Application No. 10-2012-0104330,4 pages, dated Nov. 5, 2013.

(56) References Cited

OTHER PUBLICATIONS

Office Action corresponding to Korean Patent Application No. 10-2012-0104330,4 pages, Nov. 5, 2013.
CAD_CIM Requirements Article IMAPS, Sep./Oct. 1994.
IBM Technical Disclosure Bulletin, "Microstructure Solder Mask by Means of a Laser", vol. 36, Issue 11, p. 589, Nov. 1, 1993.
Kim et al., "Application of Through Mold Via (TMV) as PoP base package", 58.sup.th ECTC Proceedings, May 2008, Lake Buena Vista, FL, 6 pages, IEEE.
Scanlan, "Package-on-package (PoP) with Through-mold Vias", Advanced Packaging, Jan. 2008, 3 pages, vol. 17, Issue 1, PennWell Corporation.
Nicholls et al., "Methods and Structures for Increasing the Allowable Die Size in TMV Packages," U.S. Appl. No. 13/398,646, filed Feb. 16, 2012.
Nicholls et al., "Methods and Structures for Increasing the Allowable Die Size in TMV Packages," U.S. Appl. No. 61/444,306, filed Feb. 18, 2011.
Huemoeller et al., "Build Up Motherboard Fabrication Method and Structure", U.S. Appl. No. 11/824,395, filed Jun. 29, 2007.
Hiner et al., "Printed Wiring Motherboard Having Bonded Interconnect Redistribution Mesa", U.S. Appl. No. 10/992,371, filed Nov. 18, 2004.
PCT, Notification of Transmittal of the International Search Report and the Written Opinion of the International Searching Authority, or the Declaration, in International application No. PCT/US13/69057 dated Apr. 4, 2014 (17 pages).
Office Action corresponding to Korean Patent Application No. 10-2013-0132666,10 pages, dated Mar. 4, 2015.
Zohni, Wael (Invensas Corporation), Ultra high-bandwidth PoP infrastructure development, 4 pages, Nov.-Dec. 2013.
Invensas™ BVA PoP for Mobile Computing: Untra-High 10 without TSVs, 4 pages, Jun. 26, 2012.
Taiwanese Office Action for Application No. 111132300, completed Nov. 14, 2022, 9 pages.
Chinese Office Action for Application 202211201187.2, dated Oct. 28, 2022, 2 pages.

\* cited by examiner

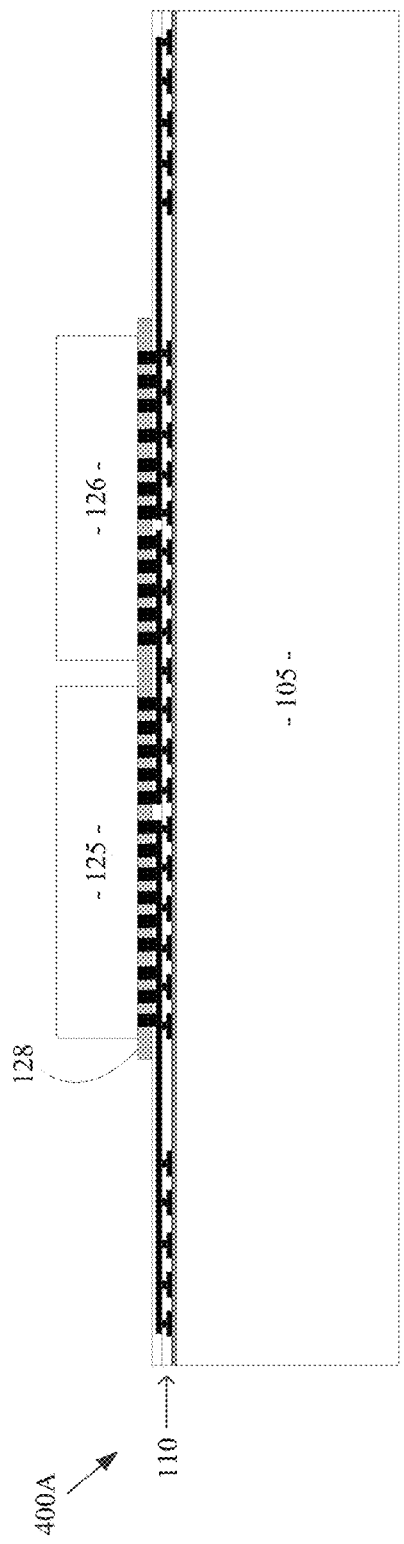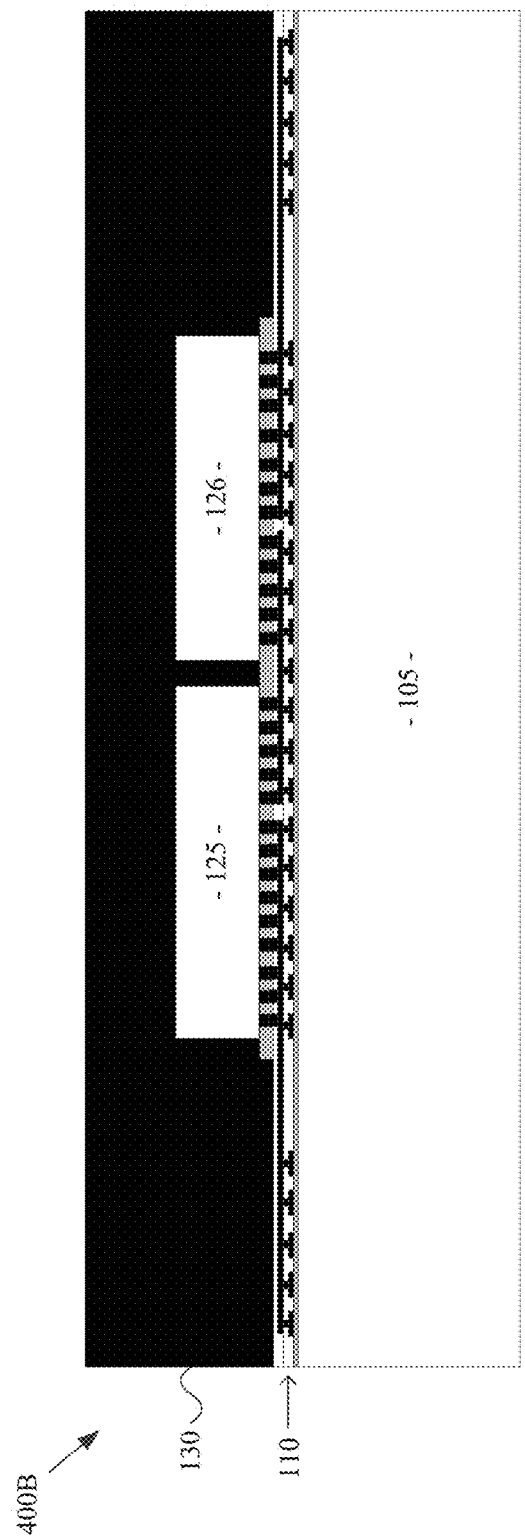

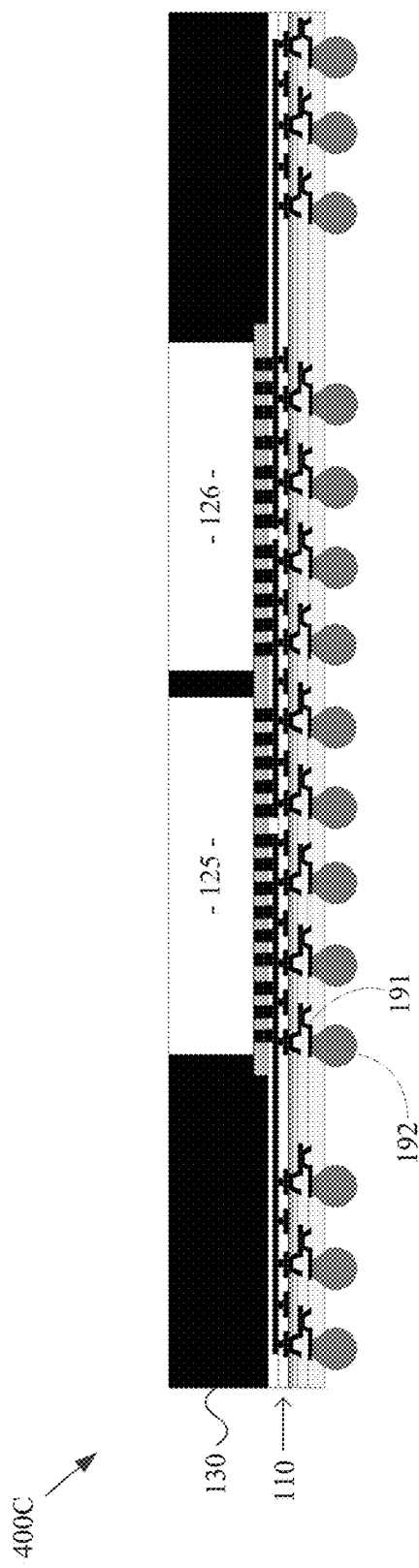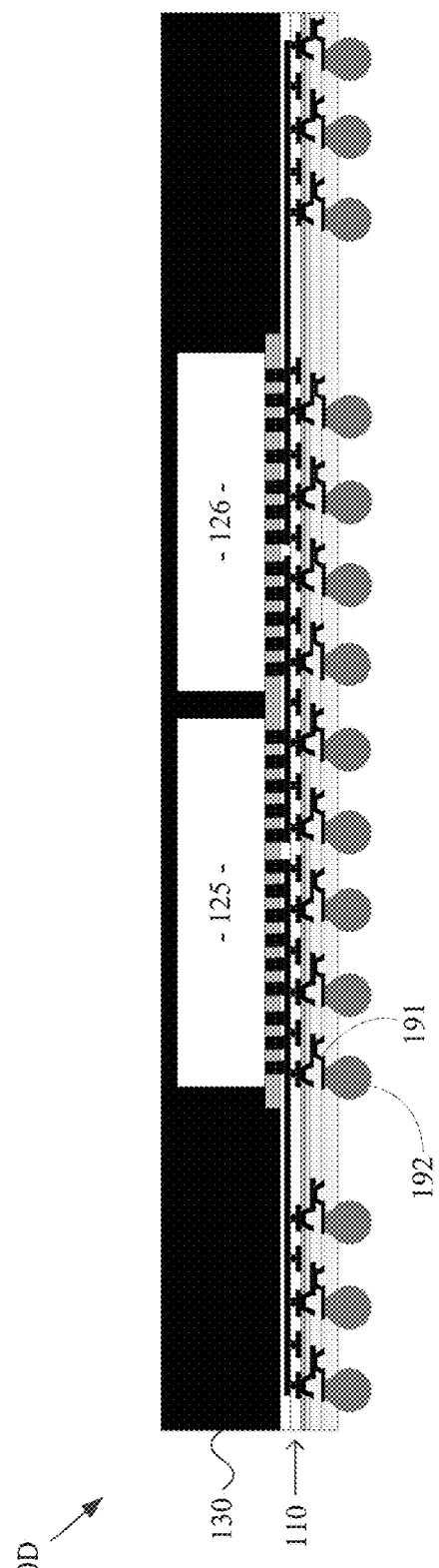

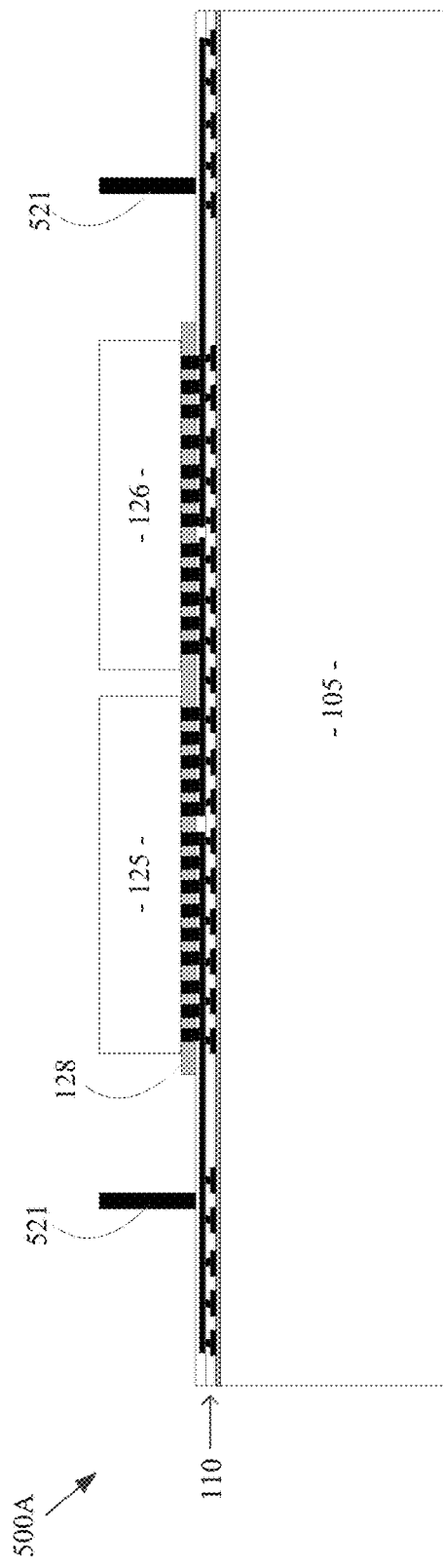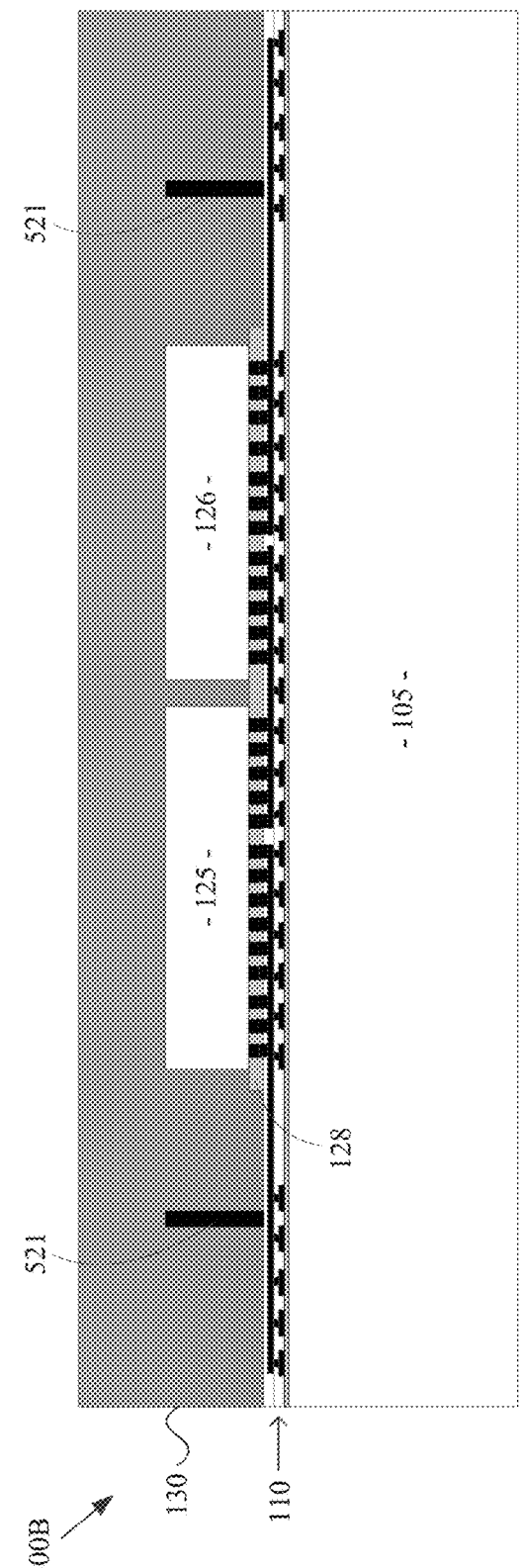
Figure 5A
Figure 5B

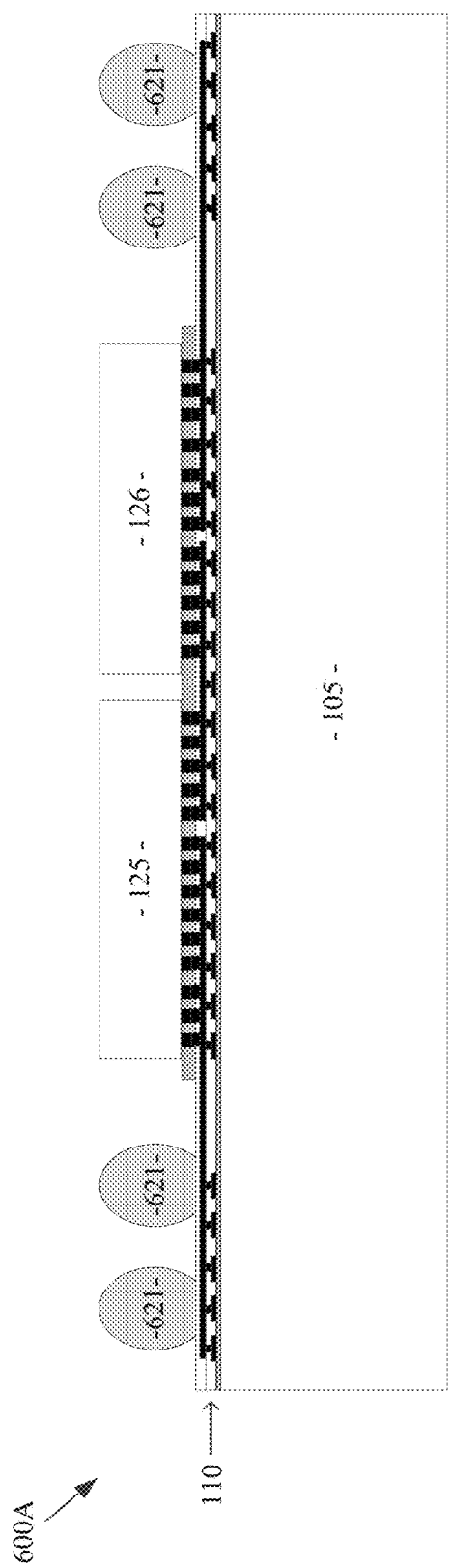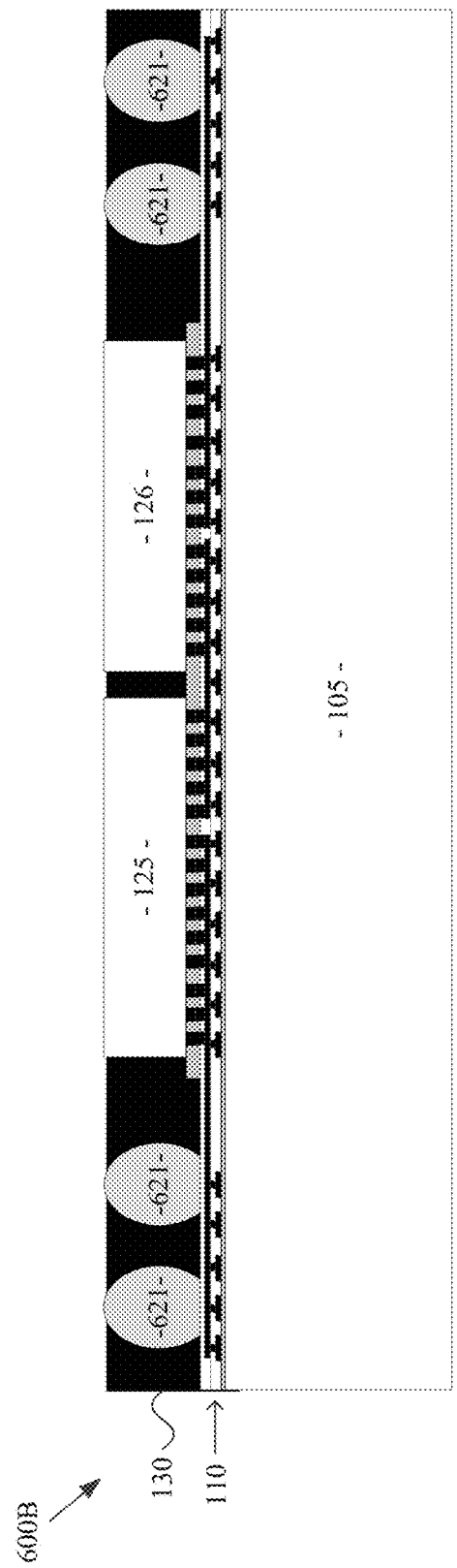
Figure 6A
Figure 6B

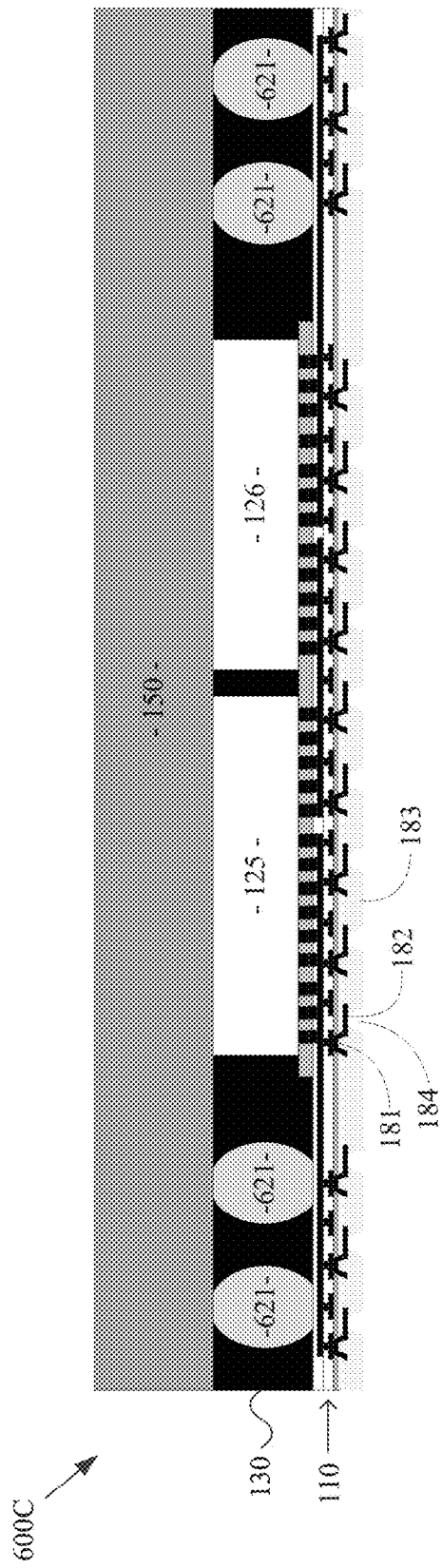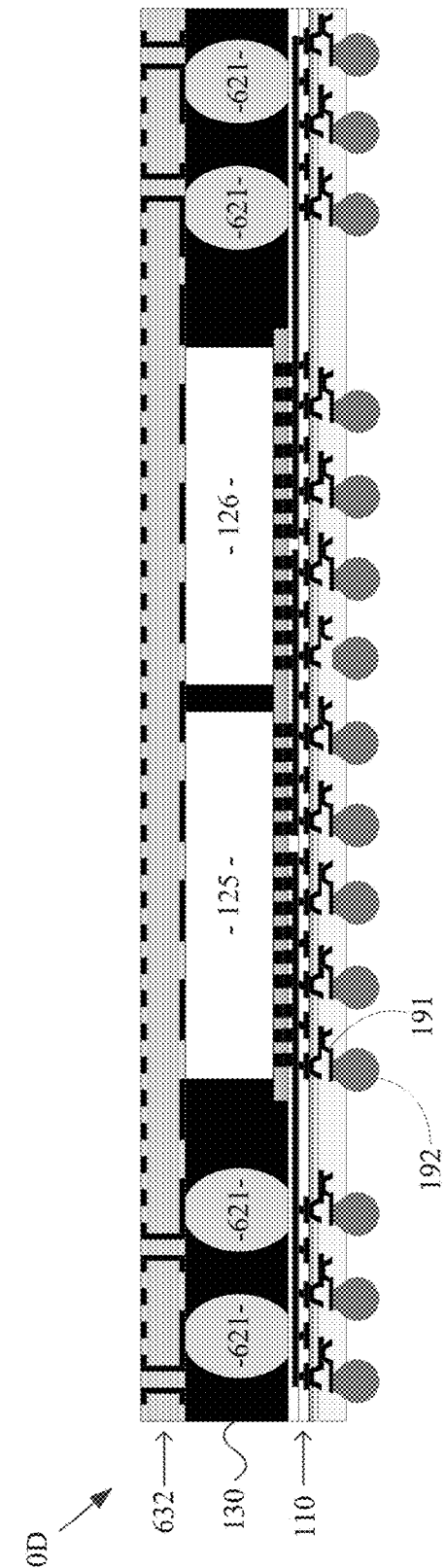
Figure 6C
Figure 6D

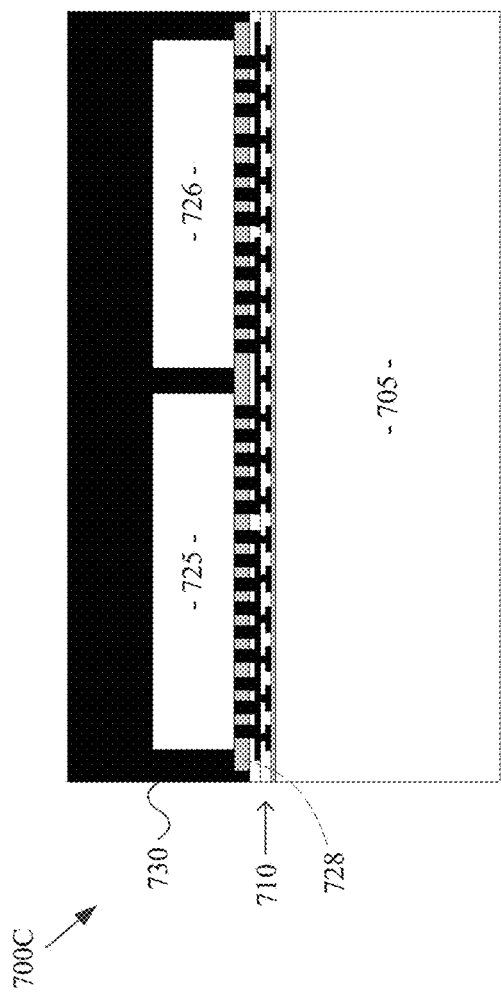
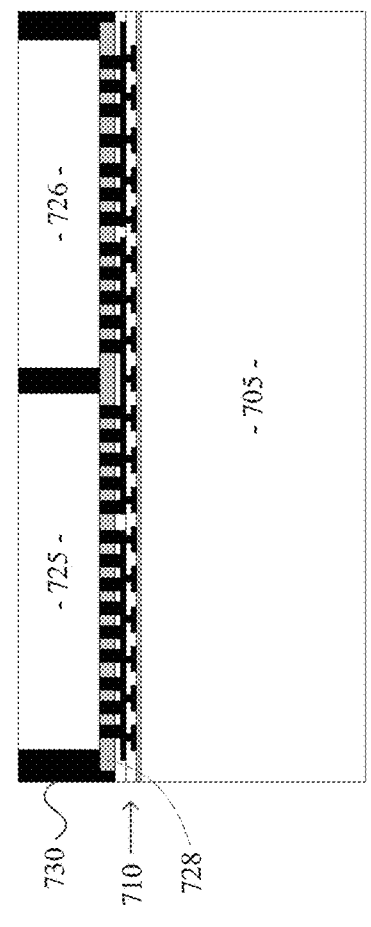
Figure 7C
Figure 7D

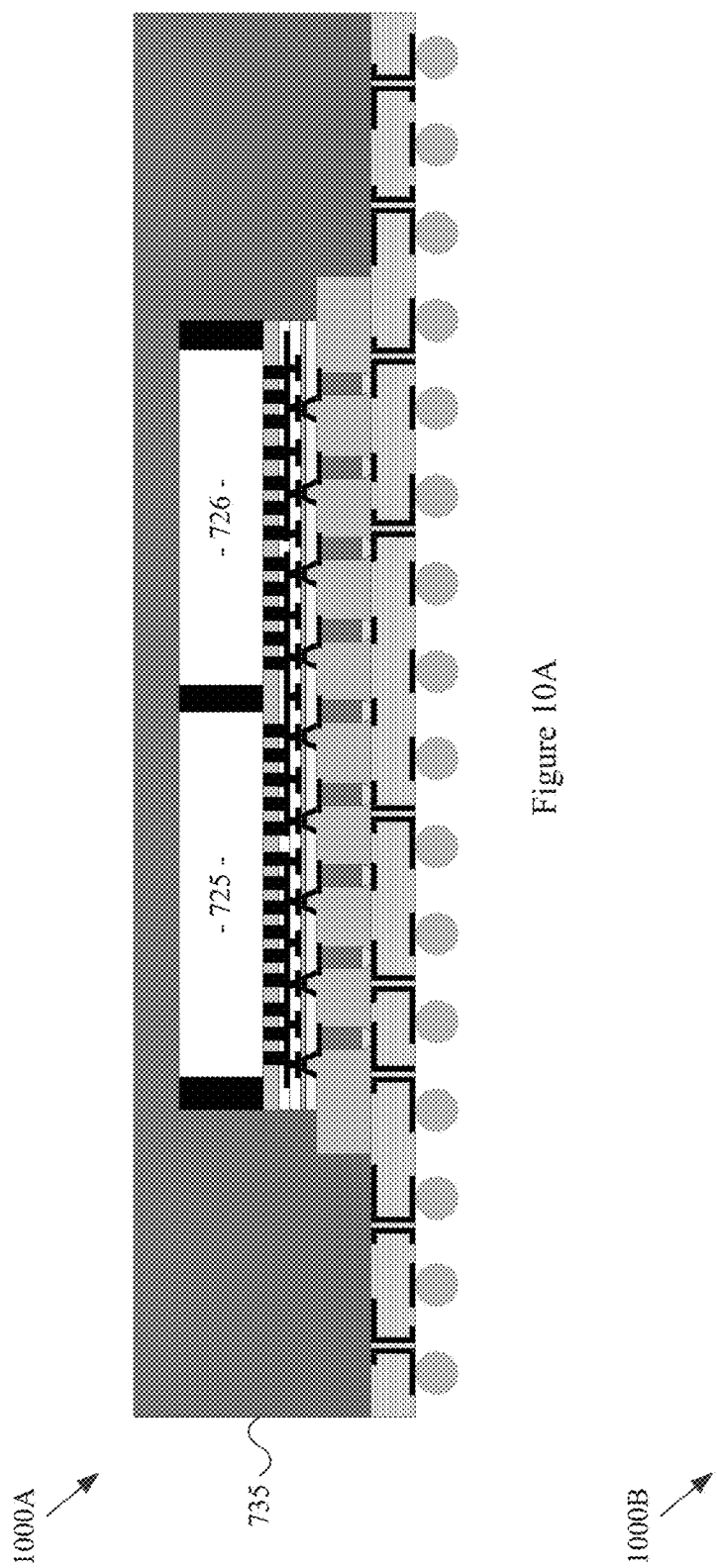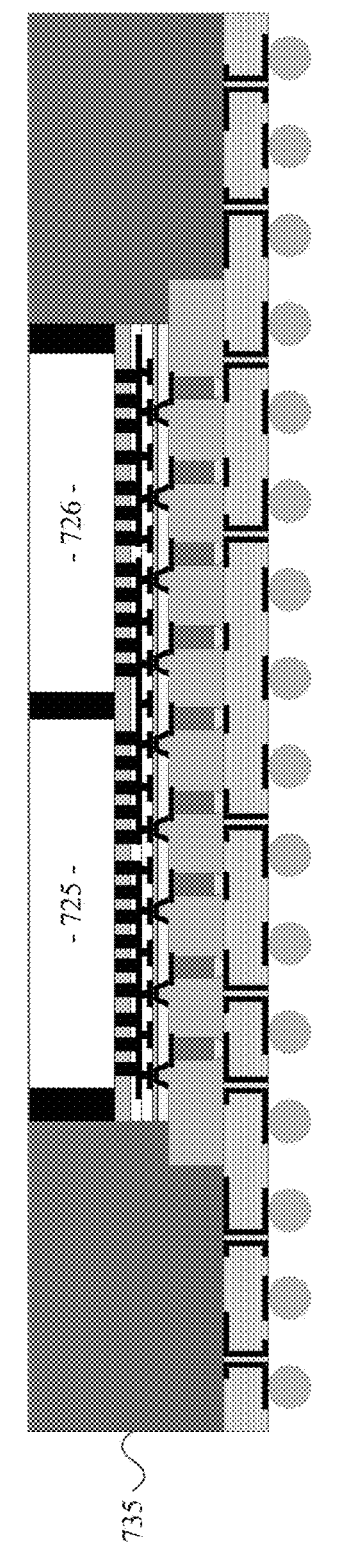
Figure 10A
Figure 10B

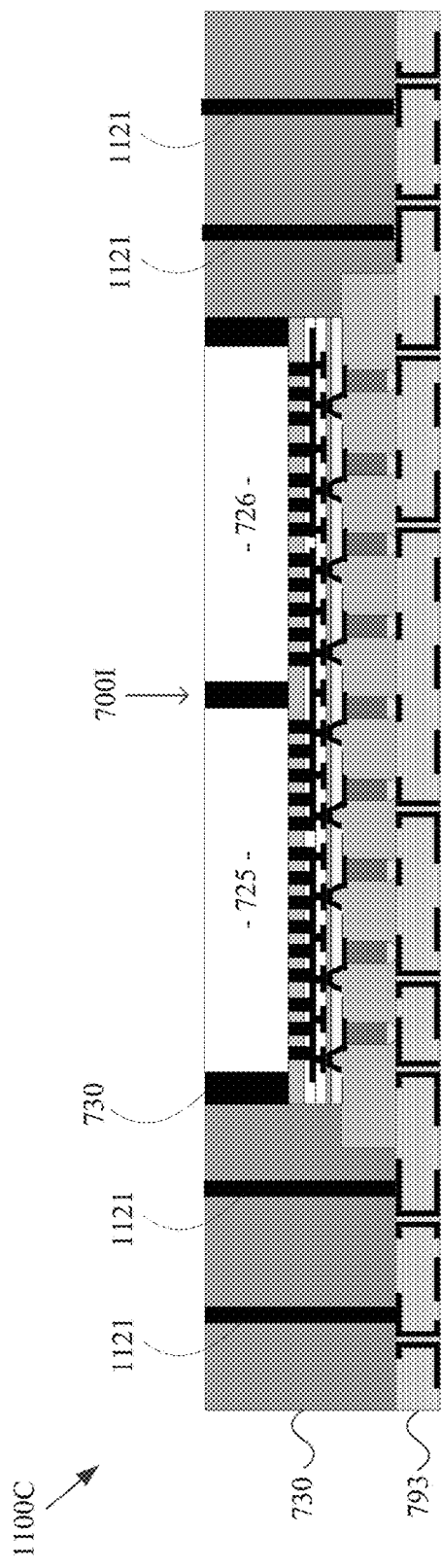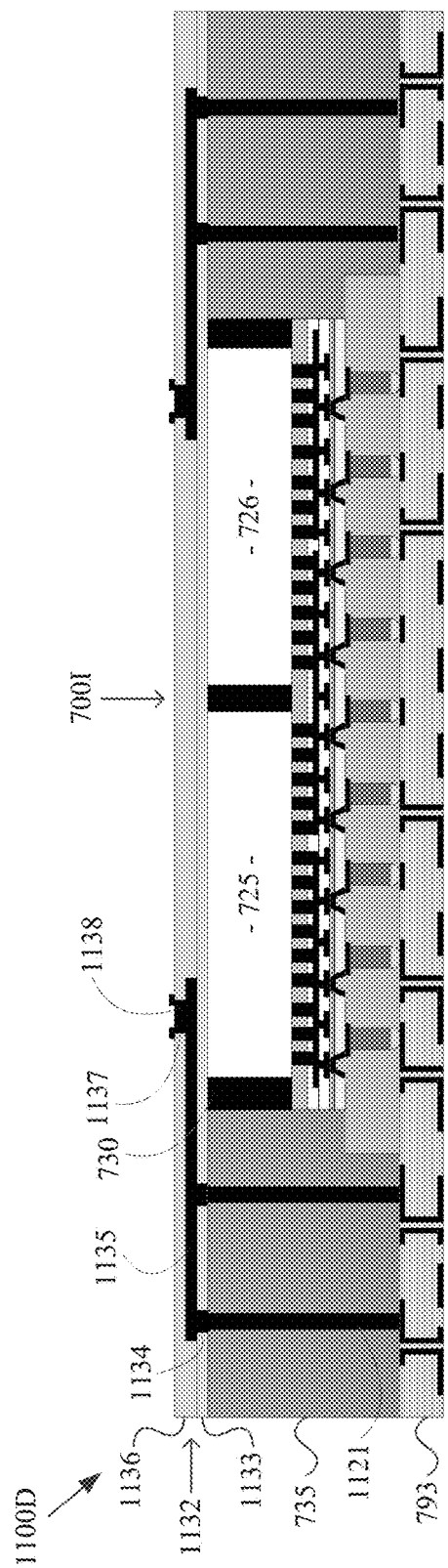

SEMICONDUCTOR PACKAGE WITH FRONT SIDE AND BACK SIDE REDISTRIBUTION STRUCTURES AND FABRICATING METHOD THEREOF

CROSS-REFERENCE TO RELATED APPLICATIONS/INCORPORATION BY REFERENCE

The present application is a continuation of U.S. patent application Ser. No. 16/260,674, filed Jan. 29, 2019, and titled "SEMICONDUCTOR PACKAGE AND FABRICATING METHOD THEREOF," expected to issue as U.S. Pat. No. 10,943,858; which is a continuation of U.S. patent application Ser. No. 15/854,095, filed Dec. 26, 2017, and titled "SEMICONDUCTOR PACKAGE AND FABRICATING METHOD THEREOF," now U.S. Pat. No. 10,192,816; which is a CONTINUATION of U.S. patent application Ser. No. 15/400,041, filed Jan. 6, 2017, and titled "SEMICONDUCTOR PACKAGE AND FABRICATING METHOD THEREOF," now U.S. Pat. No. 9,852,976; which is a CONTINUATION of U.S. patent application Ser. No. 14/823,689, filed Aug. 11, 2015, and titled "SEMICONDUCTOR PACKAGE AND FABRICATING METHOD THEREOF," now U.S. Pat. No. 9,543,242; the contents of each of which are hereby incorporated herein by reference in their entirety.

This application is related to U.S. patent application Ser. No. 13/753,120, filed Jan. 29, 2013, and titled "SEMICONDUCTOR DEVICE AND METHOD OF MANUFACTURING SEMICONDUCTOR DEVICE"; U.S. patent application Ser. No. 13/863,457, filed on Apr. 16, 2013, and titled "SEMICONDUCTOR DEVICE AND MANUFACTURING METHOD THEREOF"; U.S. patent application Ser. No. 14/083,779, filed on Nov. 19, 2013, and titled "SEMICONDUCTOR DEVICE WITH THROUGH-SILICON VIA-LESS DEEP WELLS"; U.S. patent application Ser. No. 14/218,265, filed Mar. 18, 2014, and titled "SEMICONDUCTOR DEVICE AND MANUFACTURING METHOD THEREOF"; U.S. patent application Ser. No. 14/313,724, filed Jun. 24, 2014, and titled "SEMICONDUCTOR DEVICE AND MANUFACTURING METHOD THEREOF"; U.S. patent application Ser. No. 14/444,450, Jul. 28, 2014, and titled "SEMICONDUCTOR DEVICE WITH THIN REDISTRIBUTION LAYERS"; U.S. patent application Ser. No. 14/524,443, filed Oct. 27, 2014, and titled "SEMICONDUCTOR DEVICE WITH REDUCED THICKNESS"; U.S. patent application Ser. No. 14/532,532, filed Nov. 4, 2014, and titled "INTERPOSER, MANUFACTURING METHOD THEREOF, SEMICONDUCTOR PACKAGE USING THE SAME, AND METHOD FOR FABRICATING THE SEMICONDUCTOR PACKAGE"; U.S. patent application Ser. No. 14/546,484, filed Nov. 18, 2014, and titled "SEMICONDUCTOR DEVICE WITH REDUCED WARPAGE"; and U.S. patent application Ser. No. 14/671,095, filed Mar. 27, 2015, and titled "SEMICONDUCTOR DEVICE AND MANUFACTURING METHOD THEREOF;" the contents of each of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings:

FIGS. 4A-4D show cross-sectional views illustrating an example semiconductor package and an example method of making a semiconductor package, in accordance with various aspects of the present disclosure.

FIGS. 5A-5F show cross-sectional views illustrating an example semiconductor package and an example method of making a semiconductor package, in accordance with various aspects of the present disclosure.

FIGS. 6A-6D show cross-sectional views illustrating an example semiconductor package and an example method of making a semiconductor package, in accordance with various aspects of the present disclosure.

FIGS. 7A-7L show cross-sectional views illustrating an example semiconductor package and an example method of making a semiconductor package, in accordance with various aspects of the present disclosure.

FIGS. 10A-10B show cross-sectional views illustrating an example semiconductor package and an example method of making a semiconductor package, in accordance with various aspects of the present disclosure.

FIGS. 11A-11D show cross-sectional views illustrating an example semiconductor package and an example method of making a semiconductor package, in accordance with various aspects of the present disclosure.

SUMMARY

Figure 1A:
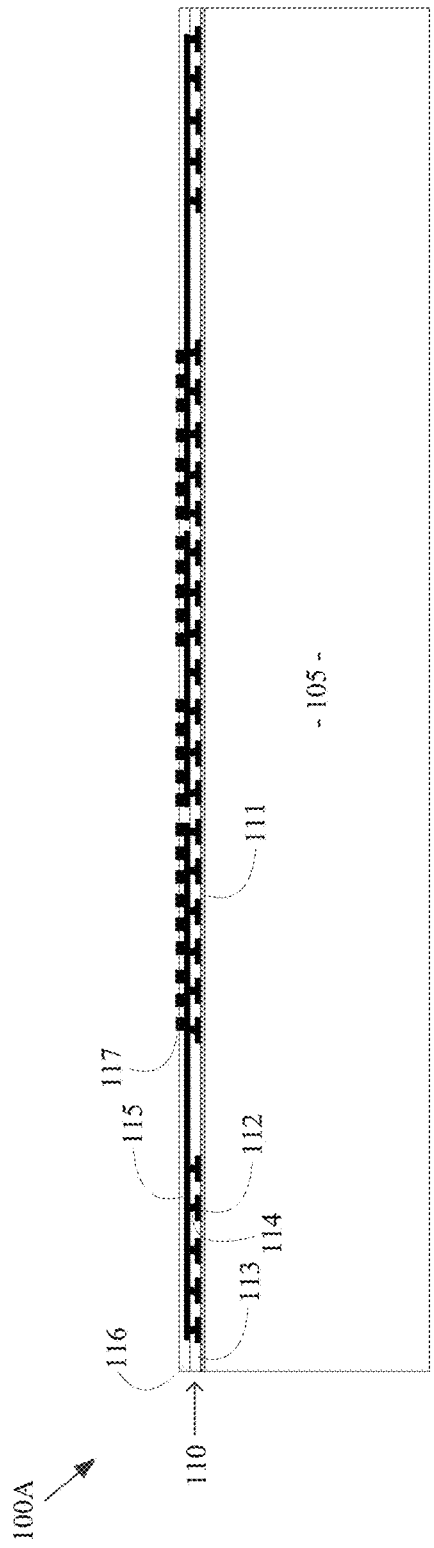
FIGS. 1A-1J show cross-sectional views illustrating an example semiconductor package and an example method of making a semiconductor package, in accordance with various aspects of the present disclosure.

Various aspects of this disclosure provide a semiconductor device structure and a method for making a semiconductor device. As non-limiting examples, various aspects of this disclosure provide various semiconductor package structures, and methods for making thereof, that comprise a thin fine-pitch redistribution structure.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide a semiconductor device or package and a fabricating (or manufacturing) method thereof, which can decrease the cost, increase the reliability, and/or increase the manufacturability of the semiconductor device.

The above and other aspects of the present disclosure will be described in or be apparent from the following description of various example implementations. Various aspects of the present disclosure will now be presented with reference to accompanying drawings, such that those skilled in the art may readily practice the various aspects.

FIGS. 1A-1J show cross-sectional views illustrating an example semiconductor package and an example method of making a semiconductor package, in accordance with various aspects of the present disclosure. The structures shown in 1A-1J may share any or all characteristics with analogous structures shown in FIGS. 3A-3B, 4A-4D, 5A-5F, 6A-6D, 7A-7L, 9, 10A-10B, 11A-11D, 12A-12B, 13, 14, 15, and 16. FIG. 2 is a flow diagram of an example method 200 of making a semiconductor package, in accordance with various aspects of the present disclosure. FIGS. 1A-1K may, for example, illustrate an example semiconductor package at various steps (or blocks) of the method 200 of FIG. 2. FIGS. 1A-1K and FIG. 2 will now be discussed together. It should be noted that the order of the example blocks of the method 200 may vary without departing from the scope of this disclosure.

The example method 200 may, at block 205, comprise preparing a logic wafer for processing (e.g., for packaging). Block 205 may comprise preparing a logic wafer for processing in any of a variety of manners, non-limiting manner of which are presented herein.

For example, block 205 may comprise receiving a logic wafer, for example from supplier shipping, from an upstream process at a manufacturing site, etc. The logic wafer may, for example, comprise a semiconductor wafer that comprises a plurality of active semiconductor die. The semiconductor die may, for example, comprise a processor die, memory die, programmable logic die, application specific integrated circuit die, general logic die, etc.

Block 205 may, for example, comprise forming conductive interconnection structures on the logic wafer. Such conductive interconnection structures may, for example, comprise conductive pads, lands, bumps or balls, conductive pillars, etc. The forming may, for example, comprise attaching preformed interconnection structures to the logic wafer, plating the interconnection structures on the logic wafer, etc.

In an example implementation, the conductive structures may comprise conductive pillars comprising copper and/or nickel, and may comprise a solder cap (e.g., comprising tin and/or silver). For example, conductive structures comprising conductive pillars may comprise: (a) an under bump metallization ("UBM") structure that includes (i) a layer of titanium-tungsten (TiW) formed by sputtering (which may be referred to as a "seed layer"), and (ii) a layer of copper (Cu) on the titanium-tungsten layer formed by sputtering, (b) a copper pillar formed on the UBM by electroplating, and (c) a layer of solder formed on the copper pillar or a layer of nickel formed on the copper pillar with a layer of solder formed on the nickel layer.

Also, in an example implementation, the conductive structures may comprise a lead and/or lead-free wafer bump. For example, lead-free wafer bumps (or interconnect structures) may be formed, at least in part, by: (a) forming an under bump metallization (UBM) structure by (i) forming a layer of titanium (Ti) or titanium-tungsten (TiW) by sputtering, (ii) forming a layer of copper (Cu) on the titanium or titanium-tungsten layer by sputtering, (iii) and forming a layer of nickel (Ni) on the copper layer by electroplating; and (b) forming a lead free solder material on the nickel layer of the UBM structure by electroplating, wherein the lead free solder material has a composition by weight of 1% to 4% silver (Ag) and the remainder of the composition by weight is tin (Sn).

Block 205 may, for example, comprise performing partial or full thinning of the logic wafer (e.g., grinding, etching, etc.). Block 205 may also, for example, comprise dicing the logic wafer into separate die or die sets for later attachment. Block 205 may also comprise receiving the logic wafer from an adjacent or upstream manufacturing station at a manufacturing facility, from another geographical location, etc. The logic wafer may, for example, be received already prepared or additional preparation steps may be performed.

In general, block 205 may comprise preparing a logic wafer for processing (e.g., for packaging). Accordingly, the scope of this disclosure should not be limited by characteristics of particular types of logic wafer and/or die processing.

The example method 200 may, at block 210, comprise preparing a carrier, substrate, or wafer. The prepared (or received) wafer may be referred to as a redistribution structure wafer or RD wafer. Block 210 may comprise preparing an RD wafer for processing in any of a variety of manners, non-limiting example of which are presented herein.

The RD wafer may, for example, comprise an interposer wafer, wafer of package substrates, etc. The RD wafer may, for example, comprise a redistribution structure formed (e.g., on a die-by-die basis) on a semiconductor (e.g., silicon) wafer. The RD wafer might, for example, comprise only electrical pathways and not electronic devices (e.g., semiconductor devices). The RD wafer might also, for example, comprise passive electronic devices but not active semiconductor devices. For example, the RD wafer may comprise one or more conductive layers or traces formed on (e.g., directly or indirectly on) or coupled to a substrate or carrier. Examples of the carrier or substrate may include a semiconductor (e.g., silicon) wafer or a glass substrate. Examples of processes used to form conductive layers (e.g., copper, aluminum, tungsten, etc.) on a semiconductor wafer include utilizing semiconductor wafer fabrication processes, which may also be referred to herein as back end of line (BEOL) processes. In an example implementation, the conductive layers may be deposited on or over a substrate using a puttering and/or electroplating process. The conductive layers may be referred to as redistribution layers. The redistribution layers may be used to route an electrical signal between two or more electrical connections and/or to route an electrical connection to a wider or narrower pitch.

In an example implementation, various portions of the redistribution structure (e.g., interconnection structures (e.g., lands, traces, etc.) that may be attached to electronic devices) may be formed having a sub-micron pitch (or center-to-center spacing) and/or less than a 2 micron pitch. In various other implementations, a 2-5 micron pitch may be utilized.

In an example implementation, a silicon wafer on which the redistribution structure is formed may comprise silicon that is a lower grade than can be adequately utilized to form the semiconductor die ultimately attached to the redistribution structure. In another example implementation, the silicon wafer may be a reclaimed silicon wafer from a failed semiconductor device wafer fabrication. In a further example implementation, the silicon wafer may comprise a silicon layer that is thinner than can be adequately utilized to form the semiconductor die ultimately attached to the redistribution structure. Block 210 may also comprise receiving the RD wafer from an adjacent or upstream manufacturing station at a manufacturing facility, from another geographical location, etc. The RD wafer may, for example, be received already prepared or additional preparation steps may be performed.

Figure 2:
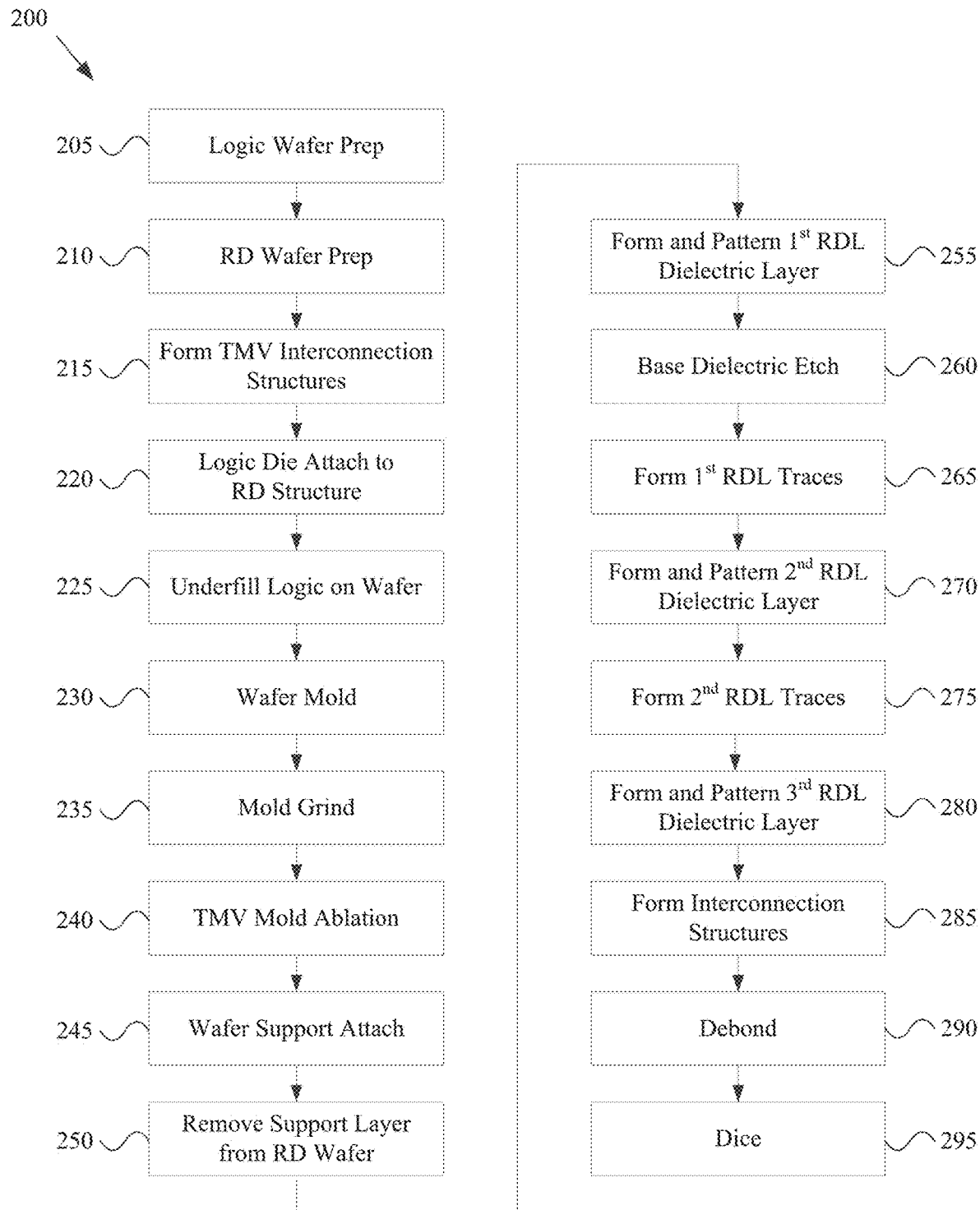
FIG. 2 is a flow diagram of an example method of making a semiconductor package, in accordance with various aspects of the present disclosure.

FIG. 1A provides an example illustration of various aspects of block 210. Referring to FIG. 1A, the RD wafer 100A may, for example, comprise a support layer 105 (e.g., a silicon or other semiconductor layer, a glass layer, etc.). A redistribution (RD) structure 110 may be formed on the support layer 105. The RD structure 110 may, for example, comprise a base dielectric layer 111, a first dielectric layer 113, first conductive traces 112, a second dielectric layer 116, second conductive traces 115, and interconnection structures 117.

The base dielectric layer 111 may, for example, be on the support layer 105. The base dielectric layer 111 may, for example, comprise an oxide layer, a nitride layer, etc. The base dielectric layer 111 may, for example, be formed to specification and/or may be native. Dielectric layer 111 may be referred to as a passivation layer. Dielectric layer 111 may be or comprise, for example, a silicon dioxide layer formed using a low pressure chemical vapor deposition (LPCVD) process.

The RD wafer 100A may also, for example, comprise first conductive traces 112 and a first dielectric layer 113. The first conductive traces 112 may, for example, comprise deposited conductive metal (e.g., copper, aluminum, tungsten, etc.). Conductive traces 112 may be formed by sputtering and/or electro-plating. The conductive traces 112 may, for example, be formed at a sub-micron or sub-two-micron pitch (or center-to-center spacing). The first dielectric layer 113 may, for example, comprise an inorganic dielectric material (e.g., silicon oxide, silicon nitride, etc.). Note that in various implementations, the dielectric layer 113 may be formed prior to the first conductive traces 112, for example formed with apertures which are then filled with the first conductive traces 112 or a portion thereof. In an example implementation, for example comprising copper conductive traces, a dual damascene process may be utilized to deposit the traces.

In an alternative assembly, the first dielectric layer 113 may comprise an organic dielectric material. For example, the first dielectric layer 113 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The organic dielectric material may be formed in any of a variety of manners, for example chemical vapor deposition (CVD). In such an alternative assembly, the first conductive traces 112 may, for example, be at a 2-5 micron pitch (or center-to-center spacing).

The RD wafer 100A may also, for example, comprise second conductive traces 115 and a second dielectric layer 116. The second conductive traces 115 may, for example, comprise deposited conductive metal (e.g., copper, etc.). The second conductive traces 115 may, for example, be connected to respective first conductive traces 112 through respective conductive vias 114 (e.g., in the first dielectric layer 113). The second dielectric layer 116 may, for example, comprise an inorganic dielectric material (e.g., silicon oxide, silicon nitride, etc.). In an alternative assembly, the second dielectric layer 116 may comprise an organic dielectric material. For example, the second dielectric layer 116 may comprise bismaleimidetriazine (BT), phenolic resin, polyimide (PI), benzo cyclo butene (BCB), poly benz oxazole (PBO), epoxy and equivalents thereof and compounds thereof, but aspects of the present disclosure are not limited thereto. The second dielectric layer 116 may, for example, be formed using a CVD process, but the scope of this disclosure is not limited thereto.

Though two sets of dielectric layers and conductive traces are illustrated in FIG. 1A, it should be understood that the RD structure 110 of the RD wafer 100A may comprise any number of such layers and traces. For example, the RD structure 110 might comprise only one dielectric layer and/or set of conductive traces, three sets of dielectric layers and/or conductive traces, etc.

As with the logic wafer prep at block 205, block 210 may comprise forming interconnection structures (e.g., conductive bumps, conductive balls, conductive pillars, conductive lands or pads, etc.) on a surface of the RD structure 110. Examples of such interconnection structures 117 are shown in FIG. 1A, in which the RD structure 110 comprises interconnection structures 117, which are shown formed on the front (or top) side of the RD structure 110 and electrically connected to respective second conductive traces 115 through conductive vias in the second dielectric layer 116. Such interconnection structures 117 may, for example, be utilized to couple the RD structure 110 to various electronic components (e.g., active semiconductor components or die, passive components, etc.).

The interconnection structures 117 may, for example, comprise any of a variety of conductive materials (e.g., any one of or a combination of copper, nickel, gold, etc.). The interconnection structures 117 may also, for example, comprise solder.

In general, block 210 may comprise preparing a redistribution structure wafer (RD wafer). Accordingly, the scope of this disclosure should not be limited by characteristics of any particular manner of performing such preparing.

The example method 200 may, at block 215, comprise forming interconnection structures (e.g., through mold via (TMV) interconnection structures) on the RD wafer. Block 215 may comprise forming such interconnection structures in any of a variety of manners.

The interconnection structures may comprise any of a variety of characteristics. For example, the interconnection structures may comprise solder balls or bumps, multi-ball solder columns, elongated solder balls, metal (e.g., copper) core balls with a layer of solder over a metal core, plated pillar structures (e.g., copper pillars, etc.), wire structures (e.g., wire bonding wires), etc.

The interconnection structures may comprise any of a variety of dimensions. For example, the interconnection structures may extend from the RD wafer to a height less than the heights of the electronic components coupled to the RD wafer (e.g., at block 220). Also for example, the interconnection structures may extend from the RD wafer to a height greater than or equal to the heights of the electronic components coupled to the RD wafer. The significance of such relative heights will become apparent in the discussion herein (e.g., in the discussions of mold thinning, package stacking, top substrate attaching, top redistribution structure formation, etc.). The interconnection structures may also, for example, be formed at various pitches (or center-to-center spacing). For example, the interconnection structures (e.g., conductive posts or pillars) may be plated and/or bonded at a 150-250 micron pitch or less. Also for example, the interconnection structures (e.g., elongated and/or metal-filled solder structures) may be attached at a 250-350 micron pitch or less. Additionally for example, the interconnection structures (e.g., solder balls) may be attached at a 350-450 micron pitch or less.

Block 215 may comprise attaching the interconnection structures in any of a variety of manners. For example, block 215 may comprise reflow-attaching the interconnection structures on the RD wafer, plating the interconnection structures on the RD wafer, wire-bonding the interconnection structures on the RD wafer, attaching preformed interconnection structures to the RD wafer with conductive epoxy, etc.

Figure 1B:
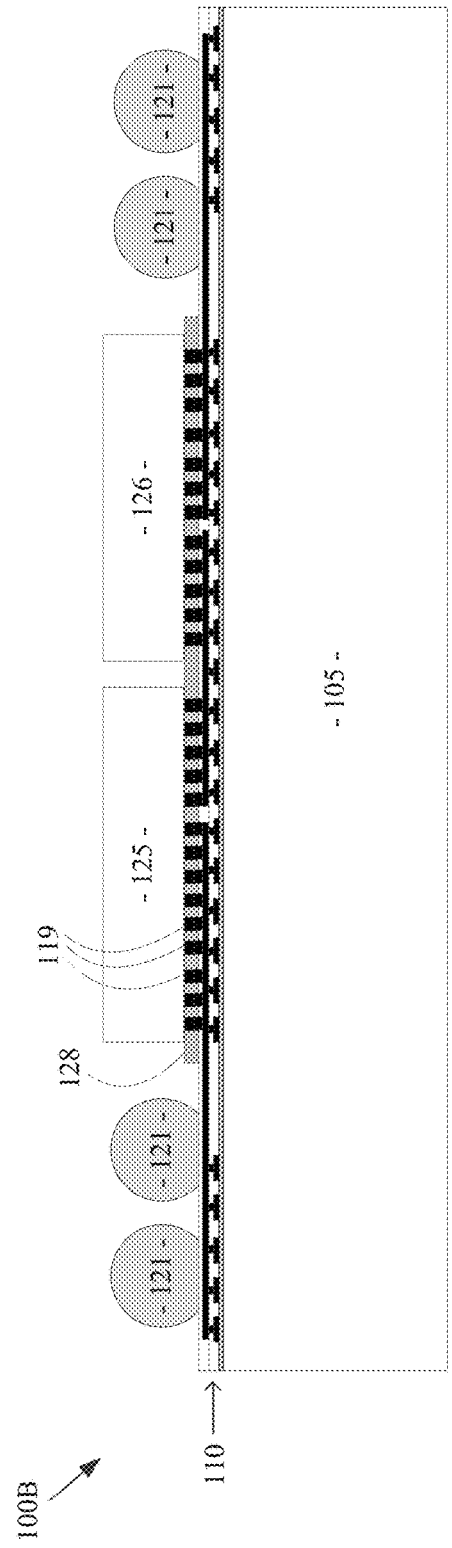

FIG. 1B provides an example illustration of various aspects of block 215, for example interconnection structure formation aspects. In the example assembly 100, the interconnection structures 121 (e.g., solder balls) are attached (e.g., reflow attached, attached using a solder ball drop process, etc.) to the RD structure 110 of the RD wafer 100A.

Though two rows of interconnection structures 121 are shown, various implementations may comprise a single row, three rows, or any number of rows. As will be discussed herein, various example implementations might have none of such interconnection structures 121 and thus block 215 might be included in example method 200.

Note that although in the example method 200, the block 215 is performed before the wafer molding operation at block 230, the interconnection structures may be formed after the wafer molding operation instead (e.g., forming via apertures in the mold material and then filling such apertures with conductive material). Also note that block 215 may be performed after the block 220 die attachment operation as shown in FIG. 2, for example instead of before die attachment.

In general, block 215 may comprise forming interconnection structures on the RD wafer. Accordingly, the scope of this disclosure should not be limited by characteristics of particular types of interconnection structures or by characteristics of any particular manner of forming such interconnection structures.

The example method 200 may, at block 220, comprise attaching one or more semiconductor die to the RD structure (e.g., of the RD wafer). Block 220 may comprise attaching the die to the RD structure in any of a variety of manners, non-limiting examples of which are provided herein.

The semiconductor die may comprise characteristics of any of a variety of types of semiconductor die. For example, the semiconductor die may comprise a processor die, a memory die, an application specific integrated circuit die, general logic die, active semiconductor components, etc.). Note that passive components may also be attached at block 220.

Block 220 may comprise attaching the semiconductor die (e.g., as prepared at block 205) in any of a variety of manners. For example, block 220 may comprise attaching the semiconductor die utilizing mass reflow, thermocompression bonding (TCB), conductive epoxy, etc.

FIG. 1B provides an example illustration of various aspects of block 220, for example die attachment aspects. For example, the first die 125 (e.g., which may have been diced from a logic wafer prepared at block 205) is electrically and mechanically attached the redistribution structure 110. Similarly, the second die 126 (e.g., which may have been diced from a logic wafer prepared at block 205) is electrically and mechanically attached to the redistribution structure 110. For example, as explained at block 205, the logic wafer (or die thereof) may have been prepared with various interconnection structures (e.g., conductive pads, lands, bumps, balls, wafer bumps, conductive pillars, etc.) formed thereon. Such structures are shown generally in FIG. 1B as items 119. Block 220 may, for example, comprise electrically and mechanically attaching such interconnection structures to the redistribution structure 110 utilizing any of a variety of attachment processes (e.g., mass reflow, thermocompression bonding (TCB), conductive epoxy, etc.).

The first die 125 and the second die 126 may comprise any of a variety of die characteristics. In an example scenario, the first die 125 may comprise a processor die and the second die 126 may comprise a memory die. In another example scenario, the first die 125 may comprise a processor die, and the second die 126 may comprise a co-processor die. In another example scenario, the first die 125 may comprise a sensor die, and the second die 126 may comprise a sensor processing die. Though the assembly 100 at FIG. 1B is shown with two die 125, 126, there may be any number of die. For example, there might be only one die, three die, four die, or more than four die.

Additionally, though the first die 125 and the second die 126 are shown attached to the redistribution structure 110 laterally relative to each other, they may also be arranged in a vertical assembly. Various non-limiting examples of such structures are shown and discussed herein (e.g., die-on-die stacking, die attachment to opposite substrate sides, etc.). Also, though the first die 125 and the second die 126 are shown with generally similar dimensions, such die 125, 126 may comprise different respective characteristics (e.g., die height, footprint, connection pitch, etc.).

The first die 125 and the second die 126 are illustrated with generally consistent pitch, but this need not be the case. For example, most or all of the contacts 119 of the first die 125 in a region of the first die footprint immediately adjacent to the second die 126 and/or most of the contacts 119 of the second die 126 in a region of the second die footprint immediately adjacent to the first die 125 may have substantially finer pitch than most or all of the other contacts 119. For example, a first 5, 10, or n rows of contacts 119 of the first die 125 closest to the second die 126 (and/or of the second die 126 closest to the first die 125) may have a 30 micron pitch, while other contacts 119 may generally have an 80 micron and/or 200 micron pitch. The RD structure 110 may thus have corresponding contact structures and/or traces at the corresponding pitch.

In general, block 220 comprises attaching one or more semiconductor die to the redistribution structure (e.g., of a redistribution wafer). Accordingly, the scope of this disclosure should not be limited by characteristics of any particular die, or by characteristics of any particular multi-die layout, or by characteristics of any particular manner of attaching such die, etc.

The example method 200 may, at block 225, comprise underfilling the semiconductor die and/or other components attached to the RD structure at block 220. Block 225 may comprise performing such underfilling in any of a variety of manners, non-limiting examples of which are presented herein.

For example, after die attachment at block 220, block 225 may comprise underfilling the semiconductor die utilizing a capillary underfill. For example, the underfill may comprise a reinforced polymer material viscous enough to flow between the attached die and the RD wafer in a capillary action.

Also for example, block 225 may comprise underfilling the semiconductor die utilizing a non-conductive paste (NCP) and/or a non-conductive film (NCF) or tape while the die are being attached at block 220 (e.g., utilizing a thermocompression bonding process). For example, such underfill materials may be deposited (e.g., printed, sprayed, etc.) prior to attaching the semiconductor die.

As with all of the blocks illustrated in the example method 200, block 225 may be performed at any location in the method 200 flow so long as the space between the die and the redistribution structure is accessible.

The underfilling may also occur at a different block of the example method 200. For example, the underfilling may be performed as part of the wafer molding block 230 (e.g., utilizing a molded underfill).

FIG. 1B provides an example illustration of various aspects of block 225, for example the underfilling aspects. The underfill 128 is positioned between the first semiconductor die 125 and the redistribution structure 110 and between the second semiconductor die 126 and the redistribution structure 110, for example surrounding the contacts 119.

Though the underfill 128 is generally illustrated to be flat, the underfill may rise up and form fillets on the sides of the semiconductor die and/or other components. In an example scenario, at least a fourth or at least a half of the die side surfaces may be covered by the underfill material. In another example scenario, one or more or all of the entire side surfaces may be covered by the underfill material. Also for example, a substantial portion of the space directly between the semiconductor die, between the semiconductor die and other components, and/or between other components may be filled with the underfill material. For example, at least half of the space or all of the space between laterally adjacent semiconductor die, between the die and other components, and/or between other components may be filled with the underfill material. In an example implementation, the underfill 128 may cover the entire redistribution structure 110 of the RD wafer. In such example implementation, when the RD wafer is later diced, such dicing may also cut through the underfill 128.

In general, block 225 may comprise underfilling the semiconductor die and/or other components attached to the RD structure at block 220. Accordingly, the scope of this disclosure should not be limited by characteristics of any particular type of underfill or of any particular manner of performing such underfilling.

The example method 200 may, at block 230, comprise molding the RD wafer (e.g., or an RD structure). Block 230 may comprise molding the RD wafer in any of a variety of manners, non-limiting examples of which are presented herein.

For example, block 230 may comprise molding over the top surface of the RD wafer, over the die and/or other components attached at block 220, over interconnection structures formed at block 215 (e.g., conductive balls, ellipsoids, columns or pillars (e.g., plated pillars, wires or wirebond wires, etc.), etc.), over the underfill formed at block 225, etc.

Block 230 may, for example, comprise utilizing compression molding (e.g., utilizing liquid, powder and/or film) or vacuum molding. Also for example, block 230 may comprise utilizing a transfer molding process (e.g., a wafer-level transfer molding process).

The molding material may, for example, comprise any of a variety of characteristics. For example, the molding material (e.g., epoxy mold compound (EMC), epoxy resin molding compound, etc.) may comprise a relatively high modulus, for example to provide wafer support in a subsequent process. Also for example, the molding material may comprise a relatively low modulus, to provide wafer flexibility in a subsequent process.

As explained herein, for example with regard to block 225, the molding process of block 230 may provide underfill between the die and the RD wafer. In such an example, there may be uniformity of material between the molded underfill material and the mold material encapsulating the semiconductor die.

Figure 1C:
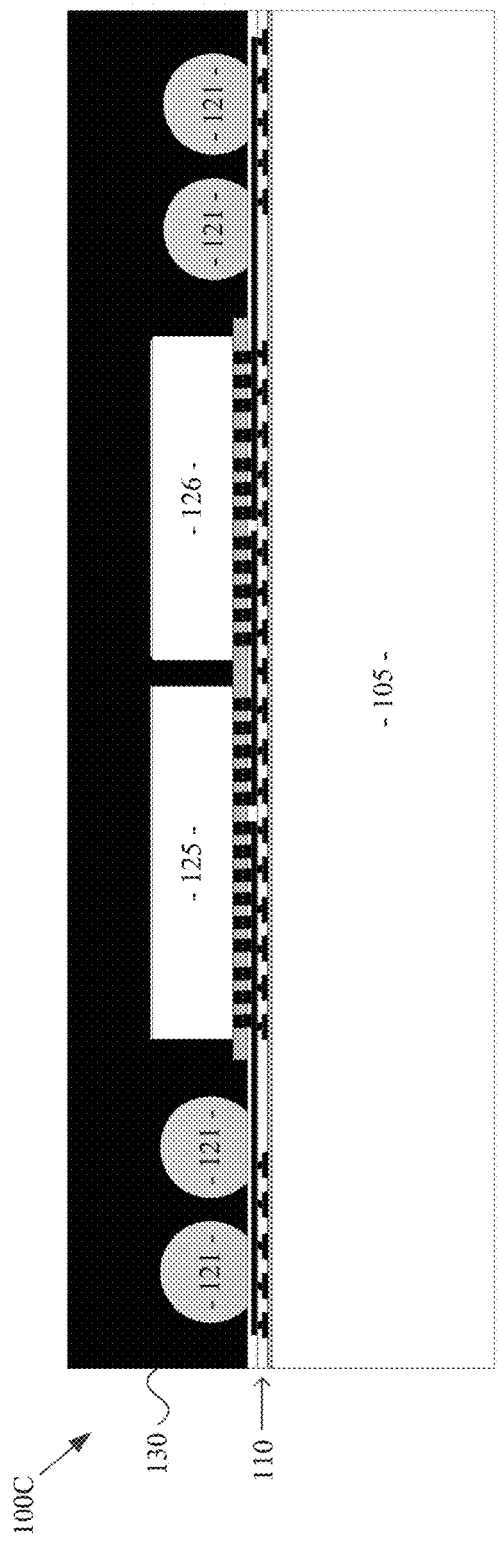

FIG. 1C provides an example illustration of various aspects of block 230, for example molding aspects. For example, the molded assembly 100C is shown with the mold material 130 covering the interconnection structures 121, first semiconductor die 125, second semiconductor die 126, underfill 128, and the top surface of the redistribution structure 110. Though the mold material 130, which may also be referred to herein as encapsulant, is shown completely covering the sides and tops of the first semiconductor die 125 and second semiconductor die 126, this need not be the case. For example, block 230 may comprise utilizing a film assist or die seal molding technique to keep the die tops free of mold material.

The mold material 130 may generally, for example, directly contact and cover portions of the die 125, 126 that are not covered by the underfill 128. For example in a scenario in which at least a first portion of the sides of the die 125, 126 is covered by underfill 128, the mold material 130 may directly contact and cover a second portion of the sides of the die 125, 126. The mold material 130 may also, for example, fill the space between the die 125, 126 (e.g., at least a portion of the space that is not already filled with underfill 128).

In general, block 230 may comprise molding the RD wafer. Accordingly, the scope of this disclosure should not be limited by characteristics of any particular molding material, structure and/or technique.

The example method 200 may, at block 235, comprise grinding (or otherwise thinning) the mold material applied at block 230. Block 235 may comprise grinding (or thinning) the mold material in any of a variety of manners, non-limiting examples of which are presented herein.

Block 235 may, for example, comprise mechanically grinding the mold material to thin the mold material. Such thinning may, for example, leave the die and/or interconnection structures over molded, or such thinning may expose one or more die and/or one or more interconnection structures.

Block 235 may, for example, comprise grinding other components in addition to the mold compound. For example, block 235 may comprise grinding the top sides (e.g., backsides or inactive sides) of the die attached at block 220. Block 235 may also, for example, comprise grinding the interconnect structures formed at block 215. Additionally, in a scenario in which the underfill applied at block 225 or block 230 extends upward enough, block 235 may also comprise grinding such underfill material. Such grinding may, for example, result in a flat planar surface at the top of the ground material.

Block 235 may, for example, be skipped in a scenario in which the height of the mold material is originally formed at a desired thickness.

Figure 1D:
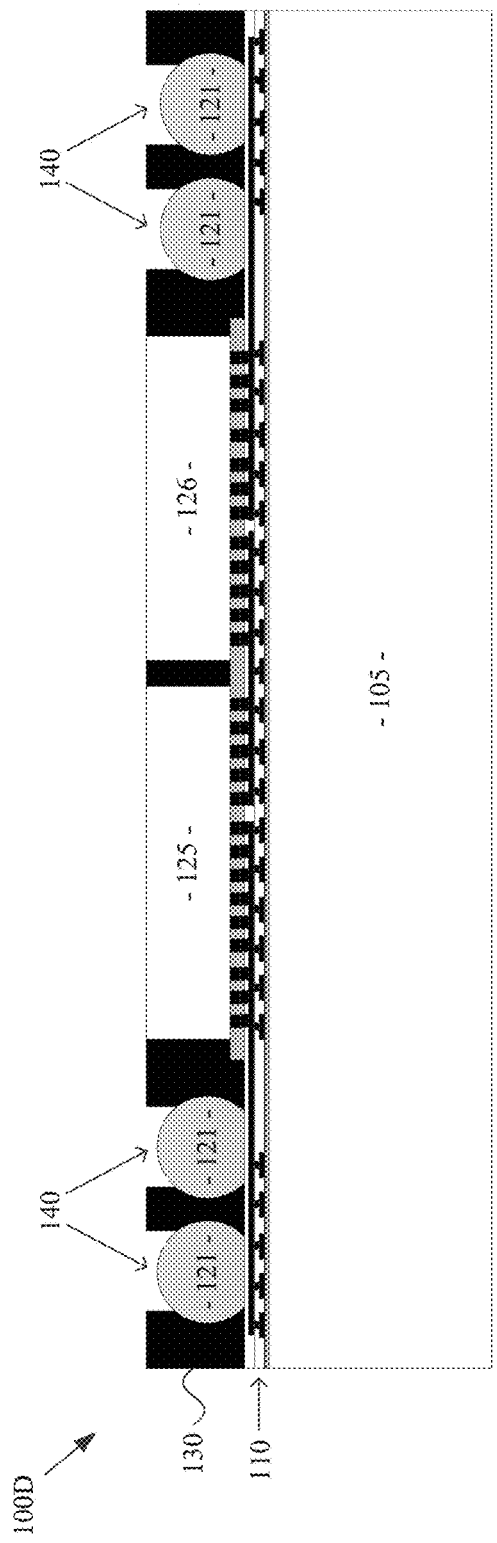

FIG. 1D provides an example illustration of various aspects of block 235, for example the mold grinding aspects. The assembly 100D is illustrated with the mold material 130 (e.g., relative to the mold material 130 illustrated at FIG. 1C) thinned to reveal top surfaces of the die 125, 126. In such an example, the die 125, 126 may also have been ground (or otherwise thinned).

Though as illustrated in FIG. 1D, the top surface of the mold material is above the interconnection structures 121, and thus the interconnection structures 121 were not ground, the interconnection structures 121 may be ground as well. Such an example implementation may, for example, result in a top surface at this stage that includes a top surface of the die 125, 126, a top surface of the mold material 130, and a top surface of the interconnection structures 121, all in a common plane.

As explained herein, the mold material 130 may be left covering the die 125, 126 in an overmold configuration. For example, the mold material 130 might not be ground, or the mold material 130 might be ground but not to a height that exposes the die 125, 126.

In general, block 235 may comprise grinding (or otherwise thinning) the mold material applied at block 230. Accordingly, the scope of this disclosure should not be limited by characteristics of any particular amount or type of grinding (or thinning).

The example method 200 may, at block 240, comprise ablating the mold material applied at block 230. Block 240 may comprise ablating the mold material in any of a variety of manners, non-limiting examples of which are provided herein.

As discussed herein, the mold material may cover the interconnection structures formed at block 215. If the mold material covers the interconnection structures and the interconnection structures need to be revealed (e.g., for subsequent package attachment, top-side redistribution layer formation, top side laminate substrate attachment, electrical connection, heat sink connection, electromagnetic shield connection, etc.), block 240 may comprise ablating the mold material to reveal the connecting structures.

Block 240 may, for example, comprise exposing the interconnection structures through the mold material utilizing laser ablation. Also for example, block 240 may comprise utilizing soft beam drilling, mechanical drilling, chemical drilling, etc.

FIG. 1D provides an example illustration of various aspects of block 240, for example the ablation aspects. For example, the assembly 100D is shown comprising ablated vias 140 extending through the mold material 130 to the interconnection structures 121. Though the ablated vias 140 are shown with vertical side walls, it should be understood that the vias 140 may comprise any of a variety of shapes. For example the side walls may be sloped (e.g., with larger openings at the top surface of the mold material 130 than at the interconnection structure 121).

Though block 240 is illustrated in FIG. 2 as being immediately after wafer molding at block 230 and mold grinding at block 235, block 240 may be performed at any point later in the method 200. For example, block 240 may be performed after the wafer support structure (e.g., attached at block 245) is removed.

In general, block 240 may comprise ablating the mold material applied at block 230 (e.g., to expose the interconnection structures formed at block 215). Accordingly, the scope of this disclosure should not be limited by characteristics of any particular manner of performing such ablation or by characteristics of any particular ablated via structure.

The example method 200 may, at block 245, comprise attaching the molded RD wafer (e.g., the top or mold side thereof) to a wafer support structure. Block 245 may comprise attaching the molded RD wafer to the wafer support structure in any of a variety of manners, non-limiting examples of which are provided herein.

The wafer support structure may, for example, comprise a wafer or fixture formed of silicon, glass, or various other materials (e.g., dielectric materials). Block 245 may, for example, comprise attaching the molded RD wafer to the wafer support structure utilizing an adhesive, a vacuum fixture, etc. Note that as illustrated and explained herein, a redistribution structure may be formed on the top side (or backside) of the die and mold material prior to the wafer support attachment.

Figure 1E:
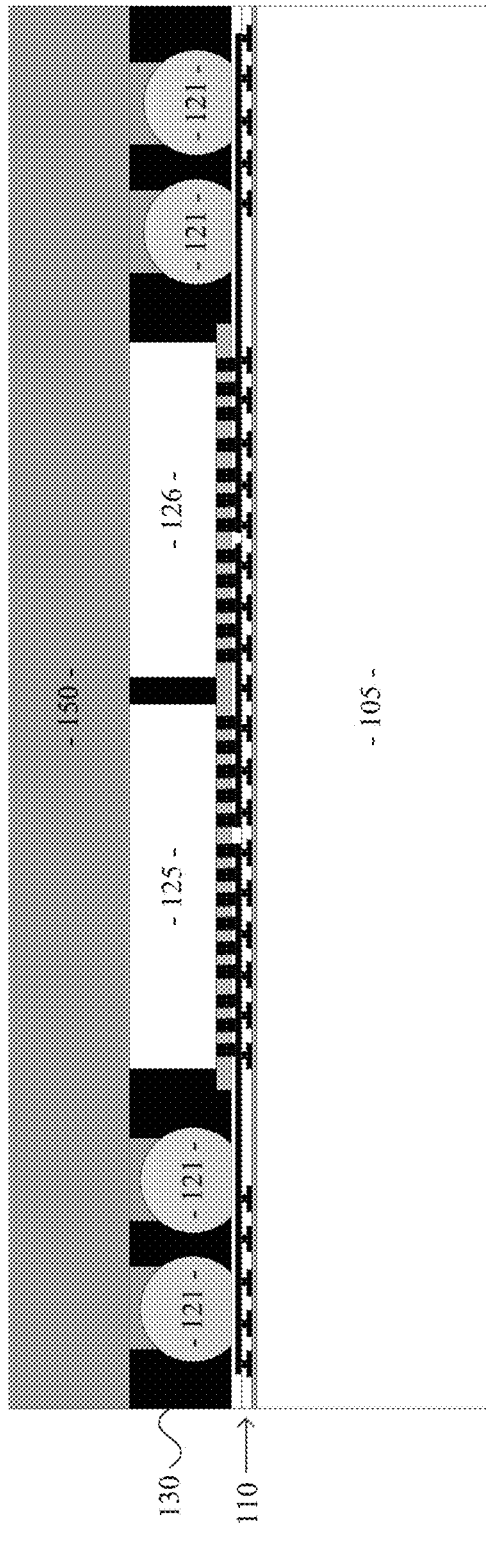

FIG. 1E provides an example illustration of various aspects of block 245, for example wafer support attaching aspects. The wafer support structure 150 is attached to the top side of the mold material 130 and die 125, 126. The wafer support structure 150 may, for example, be attached with an adhesive, and such adhesive may also be formed in the vias 140 and contacting the interconnection structures 121. In another example assembly, the adhesive does not enter the vias 140 and/or does not contact the interconnection structures 121. Note that in an assembly in which the tops of the die 125, 126 are covered with the mold material 130, the wafer support structure 150 might only be directly coupled to the top of the mold material 130.

In general, block 245 may comprise attaching the molded RD wafer (e.g., the top or mold side thereof) to a wafer support structure. Accordingly, the scope of this disclosure should not be limited by characteristics of any particular type of wafer support structure or by characteristics of any particular manner of attaching a wafer support structure.

The example method 200 may, at block 250, comprise removing a support layer from the RD wafer. Block 250 may comprise removing the support layer in any of a variety of manners, non-limiting examples of which are presented herein.

As discussed herein, the RD wafer may comprise a support layer on which an RD structure is formed and/or carried. The support layer may, for example, comprise a semiconductor material (e.g., silicon). In an example scenario in which the support layer comprises a silicon wafer layer, block 250 may comprise removing the silicon (e.g., removing all of the silicon from the RD wafer, removing almost all of the silicon, for example at least 90% or 95%, from the RD wafer, etc.). For example, block 250 may comprise mechanically grinding almost all of the silicon, followed by a dry or wet chemical etch to remove the remainder (or almost all of the remainder). In an example scenario in which the support layer is loosely attached to the RD structure formed (or carried) thereon, block 250 may comprise pulling or peeling to separate the support layer from the RD structure.

Figure 1F:
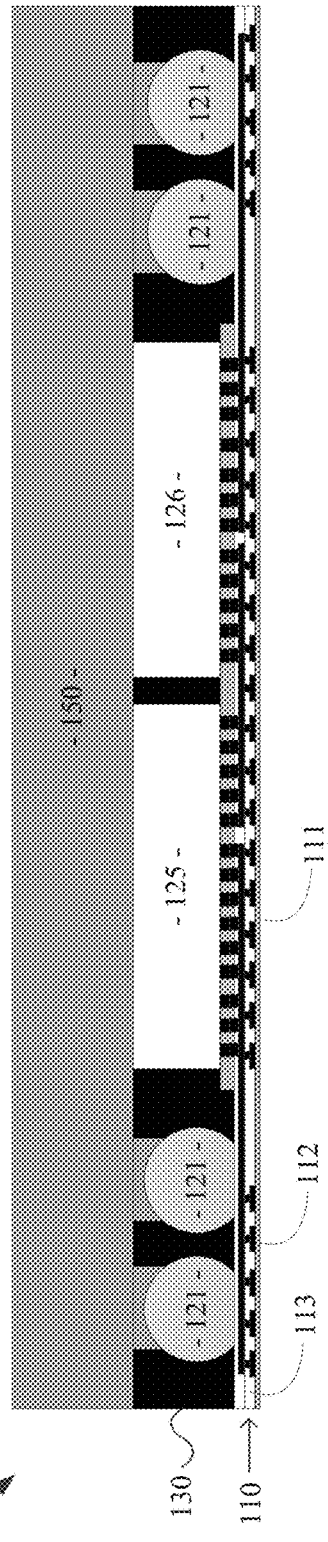

FIG. 1F provides an example illustration of various aspects of block 250, for example support layer removing aspects. For example, the support layer 105 (shown in FIG. 1E) is removed from the RD structure 110. In the illustrated example, the RD structure 110 may still comprise a base dielectric layer 111 (e.g., an oxide, nitride, etc.) as discussed herein.

In general, block 250 may comprise removing a support layer from the RD wafer. Accordingly, the scope of this disclosure should not be limited by characteristics of any particular type of wafer material or by characteristics of any particular manner of wafer material removal.

The example method 200 may, at block 255, comprise forming and patterning a first redistribution layer (RDL) dielectric layer for etching an oxide layer of the RD structure. Block 255 may comprise forming and patterning the first RDL dielectric layer in any of a variety of manners, non-limiting examples of which are presented herein.

In the examples generally discussed herein, the RD structure of the RD wafer is generally formed on an oxide layer (or nitride or other dielectric). To enable metal-to-metal attachment to the RD structure portions of the oxide layer covering traces (or pads or lands) of the RD structure may be removed, for example by etching. Note that the oxide layer need not necessarily be removed or completely removed so long as it has acceptable conductivity.

The first RDL dielectric layer may, for example, comprise a polyimide or a polybenzoxazole (PBO) material. The first RDL dielectric layer may, for example, comprise a laminated film or other materials. The first RDL dielectric layer may, for example, generally comprise an organic material. In various example implementations, however, the first RDL dielectric layer may comprise an inorganic material.

In an example implementation, the first RDL dielectric layer may comprise an organic material (e.g., polyimide, PBO, etc.) formed on a first side of the base dielectric layer of the RD structure, which may comprise an oxide or nitride or other dielectric material.

The first RDL dielectric layer may, for example, be utilized as a mask for etching the base dielectric layer, for example an oxide or nitride layer (e.g., at block 260). Also for example, after etching, the first RDL dielectric layer may remain, for example to utilize in forming conductive RDL traces thereon.

In an alternative example scenario (not shown), a temporary mask layer (e.g., a temporary photoresist layer) may be utilized. For example, after etching, the temporary mask layer may be removed and replaced by a permanent RDL dielectric layer.

Figure 1G:
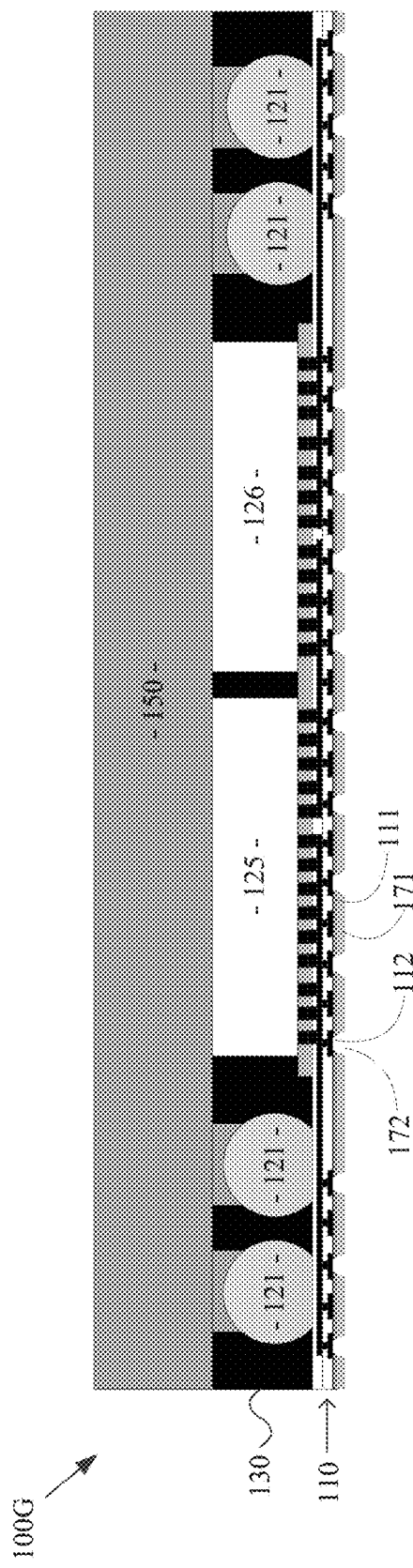

FIG. 1G provides an example illustration of various aspects of block 255. For example, the first RDL dielectric layer 171 is formed and patterned on the base dielectric layer 111. The patterned first RDL dielectric layer 171 may, for example, comprise vias 172 through the first RDL dielectric layer 171, for example through which the base dielectric layer 111 may be etched (e.g., at block 260) and in which first traces (or portions thereof) may be formed (e.g., at block 265).

In general, block 255 may comprise forming and patterning a first dielectric layer (e.g., a first RDL dielectric layer), for example on the base dielectric layer. Accordingly, the scope of this disclosure should not be limited by characteristics of a particular dielectric layer or by characteristics of a particular manner of forming a dielectric layer.

The example method 200 may, at block 260, comprise etching the base dielectric layer (e.g., oxide layer, nitride layer, etc.), for example unmasked portions thereof, from the RD structure. Block 260 may comprise performing the etching in any of a variety of manners, non-limiting examples of which are presented herein.

For example, block 260 may comprise performing a dry etch process (or alternatively a wet etch process) to etch through portions of the base dielectric layer (e.g., oxide, nitride, etc.) exposed by vias through the first dielectric layer, which functions as a mask for the etching.

FIG. 1G provides an example illustration of various aspects of block 260, for example dielectric etching aspects. For example, portions of the base dielectric layer 111 that were shown below the first conductive traces 112 in FIG. 1F are removed from FIG. 1G. This, for example, enables a metal-to-metal contact between the first conductive traces 112 and first RDL traces formed at block 265.

In general, block 260 may, for example, comprise etching the base dielectric layer. Accordingly, the scope of this disclosure should not be limited by any particular manner of performing such etching.

The example method 200 may, at block 265, comprise forming first redistribution layer (RDL) traces. Block 265 may comprise forming the first RDL traces in any of a variety of manners, non-limiting examples of which are presented herein.

As discussed herein, the first RDL dielectric layer (e.g., formed at block 255) may be utilized for etching (e.g., at block 260) and then remain for formation of the first RDL traces. Alternatively, the first RDL dielectric layer may be formed and patterned after the etching process. In yet another alternative implementation discussed herein, the etching process for the base dielectric layer may be skipped (e.g., in an implementation in which the base dielectric layer (e.g., a thin oxide or nitride layer) is conductive enough to adequately serve as a conductive path between metal traces.

Block 265 may comprise forming the first RDL traces attached to the first conductive traces of the RD structure that are exposed through the patterned first RDL dielectric layer. The first RDL traces may also be formed on the first RDL dielectric layer. Block 265 may comprise forming the first RDL traces in any of a variety of manners, for example by plating, but the scope of this disclosure is not limited by the characteristics of any particular manner of forming such traces.

The first RDL traces may comprise any of a variety of materials (e.g., copper, gold, nickel, etc.). The first RDL traces may, for example, comprise any of a variety of dimensional characteristics. For example, a typical pitch for the first RDL traces may, for example, be 5 microns. In an example implementation, the first RDL traces may, for example, be formed at a center-to-center pitch that is approximately or at least an order of magnitude greater than a pitch at which various traces of the RD structure of the RD wafer were formed (e.g., at a sub-micron pitch, approximately 0.5 micron pitch, etc.).

Figure 1H:
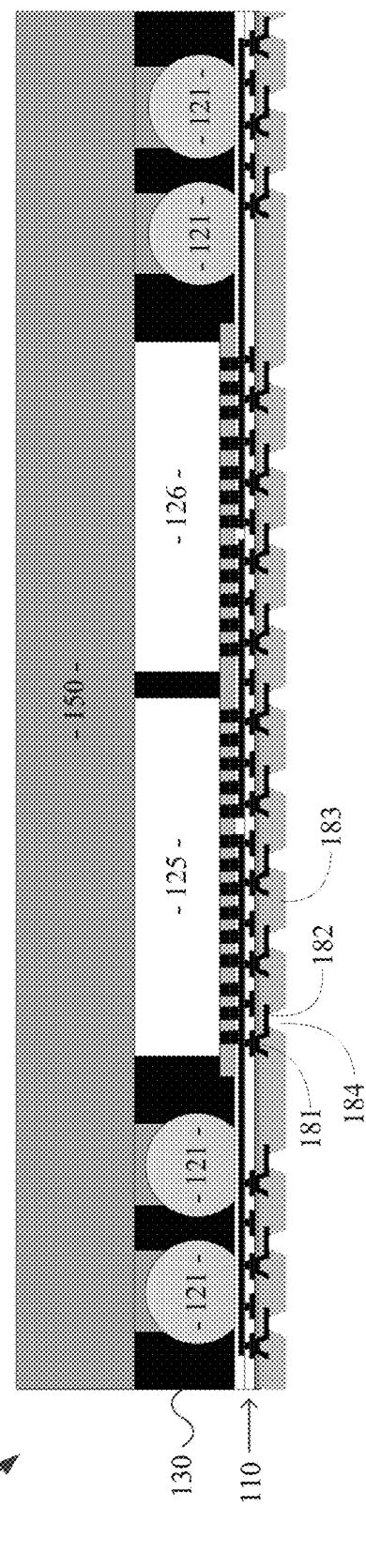

FIGS. 1G and 1H provide an example illustration of various aspects of block 265, for example RDL trace forming aspects. For example, a first portion 181 of the first RDL traces may be formed in the vias 172 of the first RDL dielectric layer 171 and contacting the first conductive traces 112 of the RD structure 110 exposed by such vias 172. Also for example, a second portion 182 of the first RDL traces may be formed on the first RDL dielectric layer 171.

In general, block 265 may comprise forming first redistribution layer (RDL) traces. Accordingly, the scope of this disclosure should not be limited by characteristics of any particular RDL traces or by characteristics of any particular manner of forming such RDL traces.

The example method 200 may, at block 270, comprise forming and patterning a second RDL dielectric layer over the first RDL traces (e.g., formed at block 265) and the first RDL dielectric layer (e.g., formed at block 255). Block 270 may comprise forming and patterning the second dielectric layer in any of a variety of manners, non-limiting examples of which are presented herein.

For example, block 270 may share any or all characteristics with block 255. The second RDL dielectric layer may, for example, be formed utilizing a same material as the first RDL dielectric layer formed at block 255.

The second RDL dielectric layer may, for example, comprise a polyimide or a polybenzoxazole (PBO) material. The second RDL dielectric layer may, for example, generally comprise an organic material. In various example implementations, however, the first RDL dielectric layer may comprise an inorganic material.

FIG. 1H provides an example illustration of various aspects of block 270. For example, the second RDL dielectric layer 183 is formed on the first RDL traces 181, 182 and on the first RDL dielectric layer 171. As shown in FIG. 1H, vias 184 are formed in the second RDL layer 183 through which conductive contact can be made with the first RDL traces 182 exposed by such vias 184.

In general, block 270 may comprise forming and/or patterning a second RDL dielectric layer. Accordingly, the scope of this disclosure should not be limited by characteristics of any particular dielectric layer or by characteristics of any particular manner of forming a dielectric layer.

The example method 200 may, at block 275, comprise forming second redistribution layer (RDL) traces. Block 275 may comprise forming the second RDL traces in any of a variety of manners, non-limiting examples of which are presented herein. Block 275 may, for example, share any or all characteristics with block 265.

Block 275 may comprise forming the second RDL traces attached to the first RDL traces (e.g., formed at block 265) that are exposed through vias in the patterned second RDL dielectric layer (e.g., formed at block 270). The second RDL traces may also be formed on the second RDL dielectric layer. Block 275 may comprise forming the second RDL traces in any of a variety of manners, for example by plating, but the scope of this disclosure is not limited by the characteristics of any particular manner.

As with the first RDL traces, the second RDL traces may comprise any of a variety of materials (e.g., copper, etc.). Additionally, the second RDL traces may, for example, comprise any of a variety of dimensional characteristics.

Figure 1I:
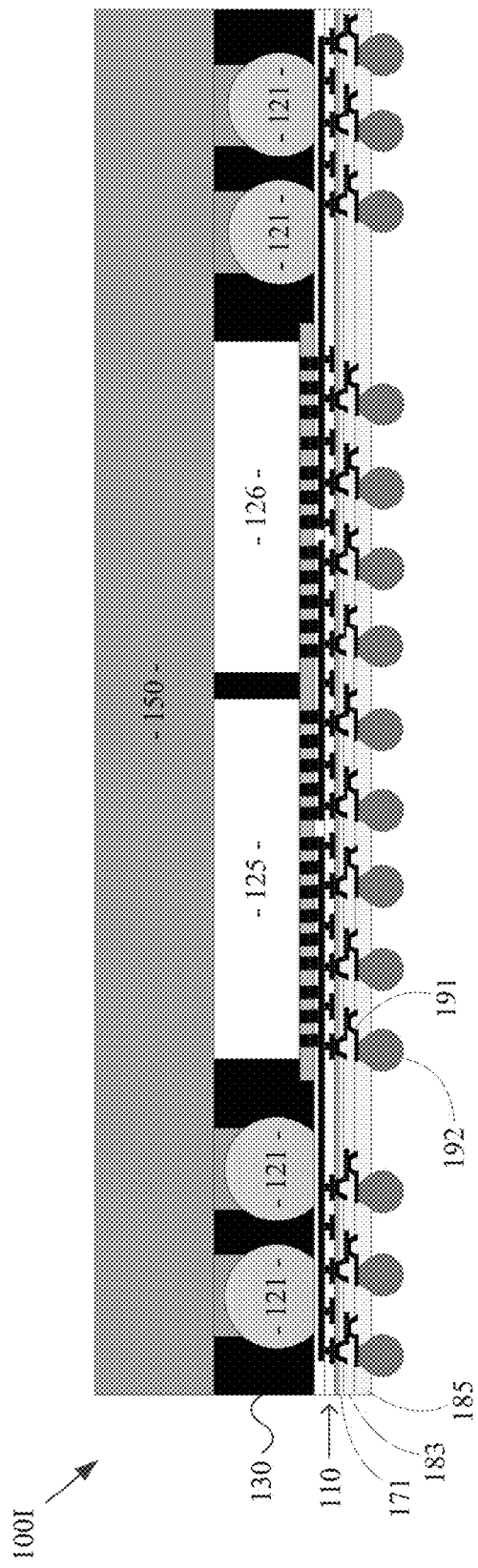

FIGS. 1H and 1I provide an example illustration of various aspects of block 275. For example, the second RDL traces 191 may be formed in vias 184 in the second RDL dielectric layer 183 to contact the first RDL traces 181 exposed through such vias 184. Additionally, the second RDL traces 191 may be formed on the second RDL dielectric layer 183.

In general, block 275 may comprise forming second redistribution layer (RDL) traces. Accordingly, the scope of this disclosure should not be limited by characteristics of any particular RDL traces or by characteristics of any particular manner of forming such RDL traces The example method 200 may, at block 280, comprise forming and patterning a third RDL dielectric layer over the second RDL traces (e.g., formed at block 275) and the second RDL dielectric layer (e.g., formed at block 270). Block 280 may comprise forming and patterning the third dielectric layer in any of a variety of manners, non-limiting examples of which are presented herein.

For example, block 280 may share any or all characteristics with blocks 270 and 255. The third RDL dielectric layer may, for example, be formed utilizing a same material as the first RDL dielectric layer formed at block 255 (and/or after etching at block 260 and stripping a temporary mask layer), and/or utilizing a same material as the second RDL dielectric layer formed at block 270.

The third RDL dielectric layer may, for example, comprise a polyimide or a polybenzoxazole (PBO) material. The third RDL dielectric layer may, for example, generally comprise an organic material. In various example implementations, however, the third RDL dielectric layer may comprise an inorganic material.

FIG. 1I provides an example illustration of various aspects of block 280. For example, the third RDL layer 185 may be formed on the second RDL traces 191 and on the second RDL layer 183. As shown in FIG. 1I, vias are formed in the third RDL layer 185 through which conductive contact can be made with the second RDL traces 191 exposed by such vias.

In general, block 280 may comprise forming and/or patterning a third RDL dielectric layer. Accordingly, the scope of this disclosure should not be limited by characteristics of any particular dielectric layer or by characteristics of any particular manner of forming a dielectric layer.

The example method 200 may, at block 285, comprise forming interconnection structures on the second RDL traces and/or on the third RDL dielectric layer. Block 285 may comprise forming the interconnection structures in any of a variety of manners, non-limiting examples of which are presented herein.

Block 285 may, for example, comprise forming an underbump metal on portions of the second RDL traces exposed through vias in the third dielectric layer. Block 285 may then, for example, comprise attaching conductive bumps or balls to the underbump metal. Other interconnection structures may be utilized as well, examples of which are presented herein (e.g., conductive posts or pillars, solder balls, solder bumps, etc.).

FIG. 1I provides an example illustration of various aspects of block 285, for example interconnection structure forming aspects. For example, interconnection structures 192 are attached to the second RDL traces 191 through vias formed in the third RDL dielectric layer 185. Note that although the interconnection structures 192 are illustrated as being smaller than the interconnection structures 121, this disclosure is not so limited. For example, the interconnection structures 192 may be the same size as the interconnection structures 121 or larger than the interconnection structures 121. Additionally, the interconnection structures 192 may be the same type of interconnection structure as the interconnections structures 121 or may be a different type.

Though the redistribution layer(s) formed at blocks 255-285, which may also be referred to as the frontside redistribution layer (RDL), are generally illustrated in FIG. 1 in a fan-out assembly (e.g., extending outside of the footprint of the die 125, 126), they may also be formed in a fan-in assembly, for example in which the interconnection structures 192 do not generally extend outside the footprint of the die 125, 126. Non-limiting examples of such an assembly are presented herein.

In general, block 285 may comprise forming interconnection structures, for example on the second RDL traces and/or on the third RDL dielectric layer. Accordingly, the scope of this disclosure should not be limited by characteristics of any particular interconnection structures or by any particular manner of forming interconnection structures.

The example method 200 may, at block 290, comprise debonding (or de-attaching) the wafer support that was attached at block 245. Block 290 may comprise performing such debonding in any of a variety of manners, non-limiting aspects of which are presented herein.

For example, in an example scenario in which the wafer support is adhesively attached, the adhesive may be released (e.g., using heat and/or force). Also for example, chemical release agents may be utilized. In another example scenario in which the wafer support is attached utilizing a vacuum force, the vacuum force may be released. Note that in a scenario involving adhesives or other substances to aid in the wafer support attachment, block 285 may comprise cleaning residue from the electrical assembly and/or from the wafer support after the debonding.

Figure 1J:
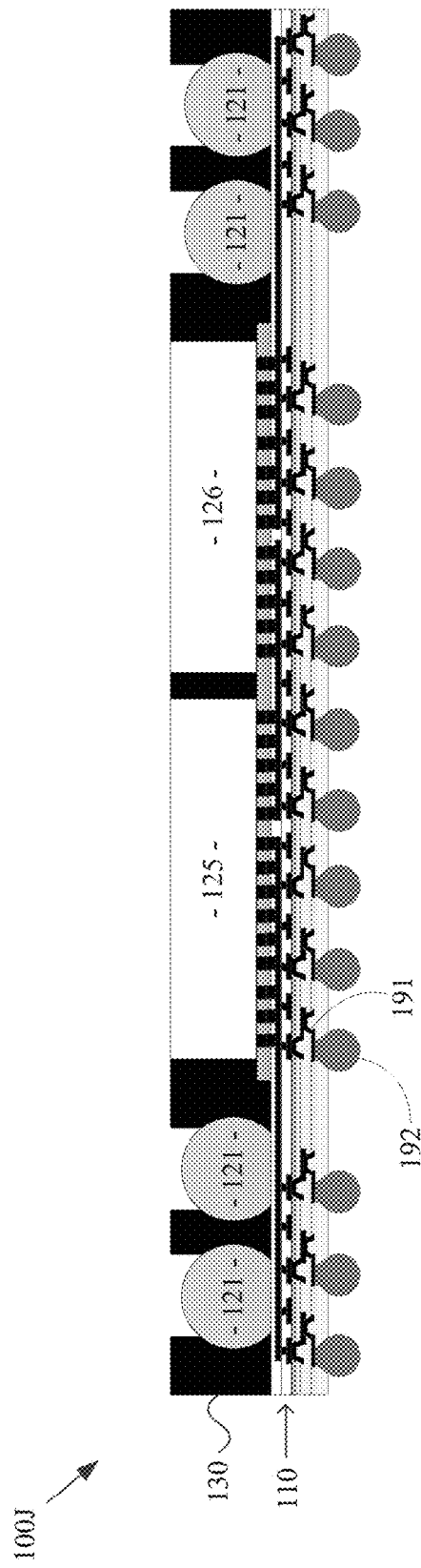

FIGS. 1I and 1J provide an example illustration of various aspects of block 290. For example, the wafer support 150 illustrated in FIG. 1I is removed in FIG. 1J.

In general, block 290 may comprise debonding the wafer support. Accordingly, the scope of this disclosure should not be limited by characteristics of any particular type of wafer support or by any particular manner of debonding a wafer support.

The example method 200 may, at block 295, comprise dicing the wafer. Block 295 may comprise dicing the wafer in any of a variety of manners, non-limiting examples of which are presented herein.

The discussion herein has generally focused on processing of a single die of the RD wafer. Such focus on a single die of the RD wafer is for illustrative clarity only. It should be understood that all of the process steps discussed herein may be performed on an entire wafer. For example, each of the illustrations provided at FIGS. 1A-1J and other figures herein may be replicated tens or hundreds of times on a single wafer. For example, until dicing, there might be no separation between one of the illustrated assemblies and a neighboring assembly of the wafer.

Block 295 may, for example, comprise dicing (e.g., mechanical punch-cutting, mechanical saw-cutting, later cutting, soft beam cutting, plasma cutting, etc.) the individual packages from the wafer. The end result of such dicing may, for example, be the package shown in FIG. 1J. For example, the dicing may form side surfaces of the package comprising coplanar side surfaces of a plurality of components of the package. For example, side surfaces of any or all of the mold material 130, the RD structure 110 dielectric layers, the various RDL dielectric layers, underfill 128, etc., may be coplanar.

In general, block 295 may comprise dicing the wafer. Accordingly, the scope of this disclosure should not be limited by characteristics of any particular manner of dicing a wafer.

FIGS. 1 and 2 presented various example method aspects and variations thereof. Other example method aspects will now be presented with reference to additional figures.

As discussed herein in the discussion of FIGS. 1 and 2, block 235 may comprise grinding (or otherwise thinning) the mold material 130 to expose one or more of the die 125, 126. An example is provided at FIG. 1D.

Figure 3A:
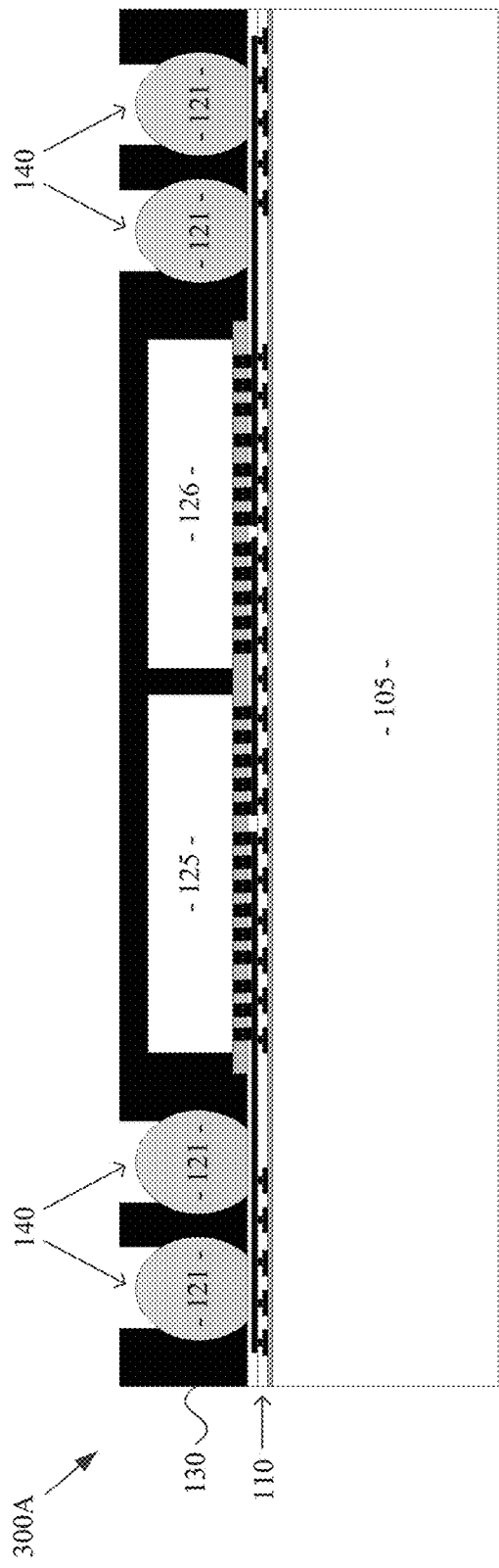
FIGS. 3A-3B show cross-sectional views illustrating an example semiconductor package and an example method of making a semiconductor package, in accordance with various aspects of the present disclosure.
Figure 3B:
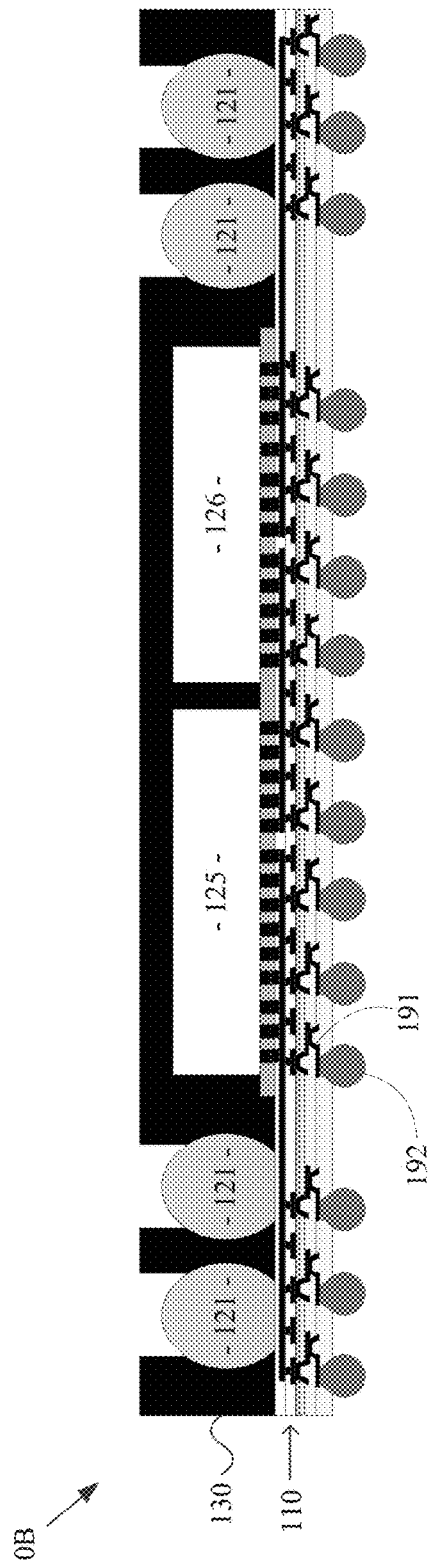

As also discussed, the mold grinding (or thinning) at block 235 need not be performed or may be performed to an extent that still leaves the tops of the die 125, 126 covered with mold material 130. An example is provided at FIG. 3. As shown in FIG. 3A, the mold material 130 covers the tops of the semiconductor die 125, 126. Note that the interconnection structures 121 may be shorter or taller than the die 125, 126. Continuing the comparison, rather than the resulting package 100J appearing as shown in FIG. 1J, the resulting package 300B may appear as shown in FIG. 3B.

Also, as discussed herein in the discussion of FIGS. 1 and 2, block 215, forming TMV interconnection structures, and block 240, TMV mold ablation, may be skipped. An example is provided at FIG. 4. As shown in FIG. 4A, as opposed to block 215 and FIG. 1B, there are no TMV interconnection structures 121 formed. As shown in FIG. 4B, as opposed to block 230 and FIG. 1C, the mold material 130 does not cover interconnection structures.

Continuing the comparison, as explained herein, the mold grinding (or thinning) at block 235 may be performed to an extent that exposes one or more of the tops of the die 125, 126 from the mold material 130. FIG. 4C provides an example illustration of such processing. Generally, the FIG. 4C assembly 400C is similar to the FIG. 1J assembly 100J, less the interconnection structures 121 and the ablated vias exposing the interconnection structures through the mold material 130.

Also for example, as explained herein, the mold grinding (or thinning) at block 235 may be skipped or performed to an extent that leaves the tops of the die 125, 126 covered with mold material 130. FIG. 4D provides an example illustration of such processing. Generally, the FIG. 4D assembly 400D is similar to the FIG. 1J assembly 100J, less the interconnection structures 121 and the ablated vias exposing the interconnection structures through the mold material 130, and with mold material 130 covering the die 125, 126.

In another example, as explained herein in the discussion of block 215, the TMV interconnections may comprise any of a variety of structures, for example a conductive pillar (e.g., plated post or pillar, vertical wire, etc.). FIG. 5A provides an example illustration of conductive pillars 521 attached to the RD structure 110. The conductive pillars 521 may, for example, be plated on the RD structure 110. The conductive pillars 521 may also, for example, comprise wires (e.g., wire-bond wires) attached (e.g., wire-bond attached, soldered, etc.) to the RD structure 110 and extending vertically. The conductive pillars 521 may, for example, extend from the RD structure 110 to a height greater than a height of the die 125, 126, equal to the height of one or more of the die 125, 126, less than a height of the die 125, 126, etc. In an example implementation, the pillars may have a height greater than or equal to 200 microns at a center-to-center pitch of 100-150 microns. Note that any number of rows of the pillars 521 may be formed. Generally, the FIG. 5A assembly 500A is similar to the FIG. 1B assembly 100B with conductive pillars 521 as interconnection structures instead of conductive balls 121.

Continuing the example, FIG. 5B illustrates the RD structure 110, conductive pillars 521, semiconductor die 125, 126, and underfill 128 covered with mold material 130. The molding may, for example, be performed in accordance with block 230 of the example method 200. Generally, the FIG. 5B assembly 500B is similar to the FIG. 1C assembly 100C with conductive pillars 521 as interconnection structures instead of conductive balls 121.

Figure 5C:
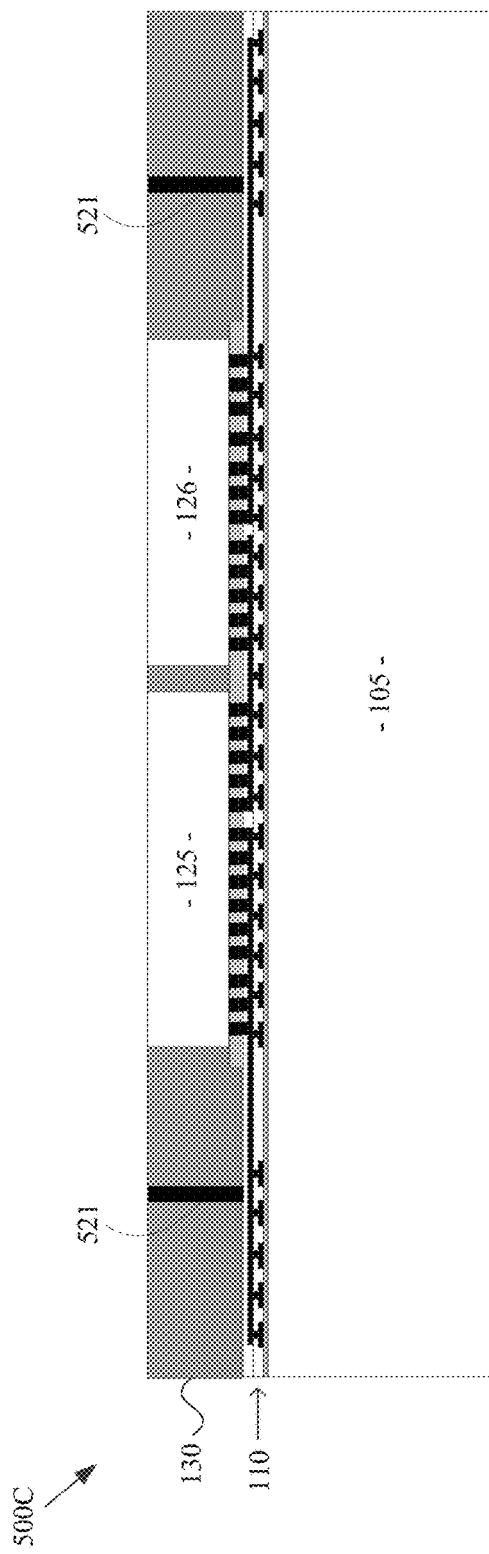

Still continuing the example, FIG. 5C illustrates the mold material 130 having been thinned (e.g., ground) to a desired thickness. The thinning may, for example, be performed in accordance with block 235 of the example method 200. Note, for example, that the conductive pillars 521 and/or the semiconductor die 125, 126 may also be thinned. Generally, the FIG. 5D assembly 500D is similar to the FIG. 1D assembly 100D with conductive pillars 521 as interconnection structures instead of conductive balls 121, and also without the ablated vias 140 of FIG. 1D. For example, the thinning of the mold material 130 may expose the top ends of the conductive pillars 521. If instead, however, the thinning of the mold material 130 does not expose the top ends of the conductive pillars 521, a mold ablating operation (e.g., in accordance with block 240) may be performed. Note that although the assembly is shown with the tops of the semiconductor die 125, 126 being exposed, the tops need not be exposed. For example, the pillars 521 may stand taller than the semiconductor die 125, 126. Such an example configuration may, for example allow the pillars 521 to be exposed from and/or protrude from the mold material 130 while the mold material 130 continues to cover the backside surfaces of the semiconductor die 125, 126, which may, for example, provide protection for the semiconductor die 125, 126, prevent or reduce warpage, etc.

In an example implementation in which the pillars 521 are formed with a height less than the die 125, 126, the thinning may comprise first grinding the mold material 130, then grinding both the mold material 130 and the back (or inactive) sides of the die 125, 126 until the pillars 521 are exposed. At this point, the thinning may be stopped or may be continued, for example grinding the mold material 130, the die 125, 126 and the pillars 521.

Figure 5D:
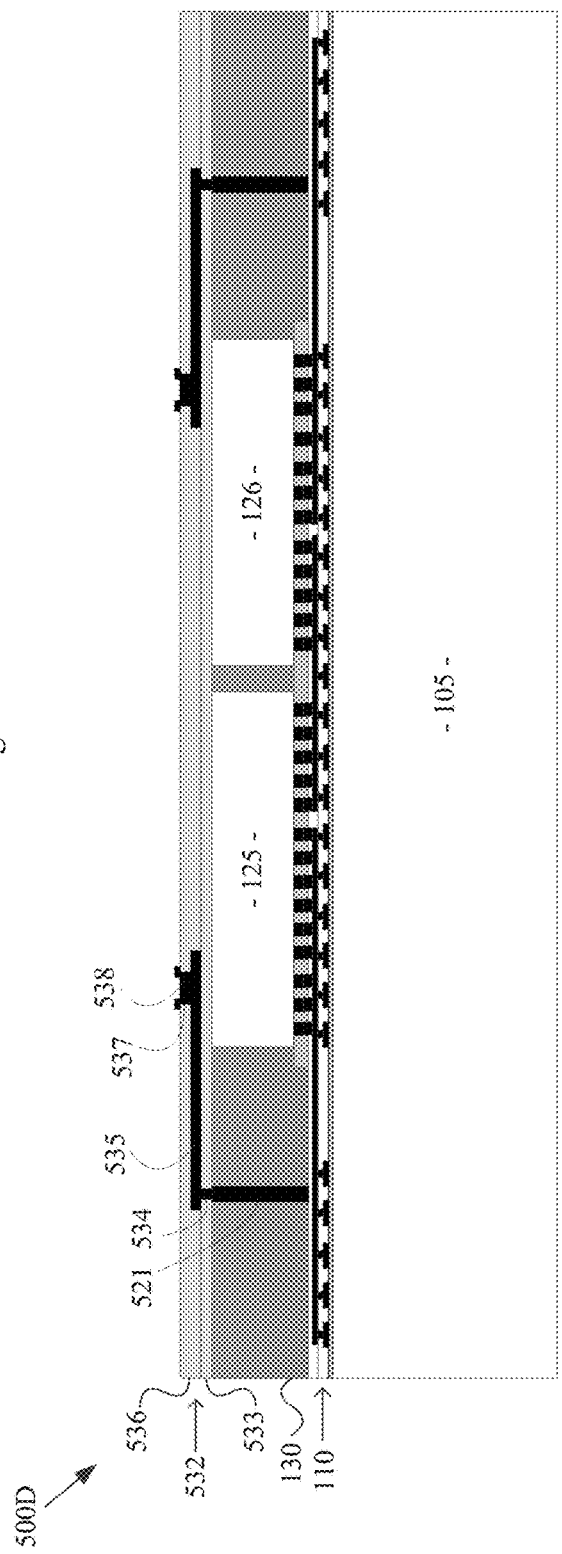

Continuing the example, the assembly 500C shown in FIG. 5C may be further processed by forming a redistribution layer (RDL) 532 over the mold material 130 and die 125, 126. FIG. 5D shows an example of such processing. The redistribution layer 532 may also be referred to herein as the backside redistribution (RDL) layer 532. Though such backside RDL formation is not explicitly shown in one of the blocks of the example method 200, such operation may be performed in any of the blocks, for example after the block 235 mold grinding operation and before the block 245 wafer support attaching (e.g., at block 235, at block 240, at block 245, or between any of such blocks).

As shown in FIG. 5D, a first backside dielectric layer 533 may be formed and patterned on the mold material 130 and the die 125, 126. The first backside dielectric layer 533 may, for example, be formed and patterned in a same or similar manner to the first RDL dielectric layer 171 formed at block 260, albeit on a different surface. For example, the first backside dielectric layer 533 may be formed on the mold material 130 and on the semiconductor die 125, 126 (e.g., directly on exposed backside surfaces of the die 125, 126, on mold material 130 covering the backside surfaces of the die 125, 126, etc.), and vias 534 may be formed (e.g., by etching, ablating, etc.) in the first backside dielectric layer 533 to expose at least the tops of the conductive pillars 521. Note that in an example configuration in which the mold material 130 covers the backside surfaces of the semiconductor die 125, 126, the first backside dielectric layer 533 may still be formed, but need not be (e.g., the backside traces 535 discussed below may be formed directly on the mold material 130 rather than on the first backside dielectric layer 533).

Backside traces 535 may be formed on the first backside dielectric layer 533 and in the vias 534 of the first backside dielectric layer 533. The backside traces 535 may thus be electrically connected to the conductive pillars 521. The backside traces 535 may, for example, be formed in a same or similar manner to the first RDL traces formed at block 265. At least some, if not all, of the backside traces 535 may, for example, extend horizontally from the conductive pillars 521 to locations directly above the semiconductor die 125, 126. At least some of the backside traces 535 may also, for example, extend from the conductive pillars 521 to locations that are not directly above the semiconductor die 125, 126.

A second backside dielectric layer 536 may be formed and patterned on the first backside dielectric layer 533 and backside traces 535. The second backside dielectric layer 536 may, for example, be formed and patterned in a same or similar manner to the second RDL dielectric layer 183 formed at block 270, albeit on a different surface. For example, the second backside dielectric layer 536 may be formed over the first backside dielectric layer 533 and over the backside traces 535 and vias 537 may be formed (e.g., by etching, ablating, etc.) in the second backside dielectric layer 536 to expose contact areas of the backside traces 535.

Backside interconnection pads 538 (e.g., ball contact pads) may be formed on the second backside dielectric layer 536 and/or in the vias 537 of the second backside dielectric layer 536. The backside interconnection pads 538 may thus be electrically connected to the backside traces 535. The backside interconnection pads 538 may, for example, be formed in a same or similar manner to the second RDL traces formed at block 275. The backside interconnection pads 538 may, for example, be formed by forming metal contact pads and/or forming under bump metallization (e.g., to enhance subsequent attachment to the backside traces 535 by interconnection structures).

Though the backside RDL layer 532 is shown with two backside dielectric layers 533, 536 and one layer of backside traces 535, it should be understood that any number of dielectric and/or trace layers may be formed.

Figure 5E:
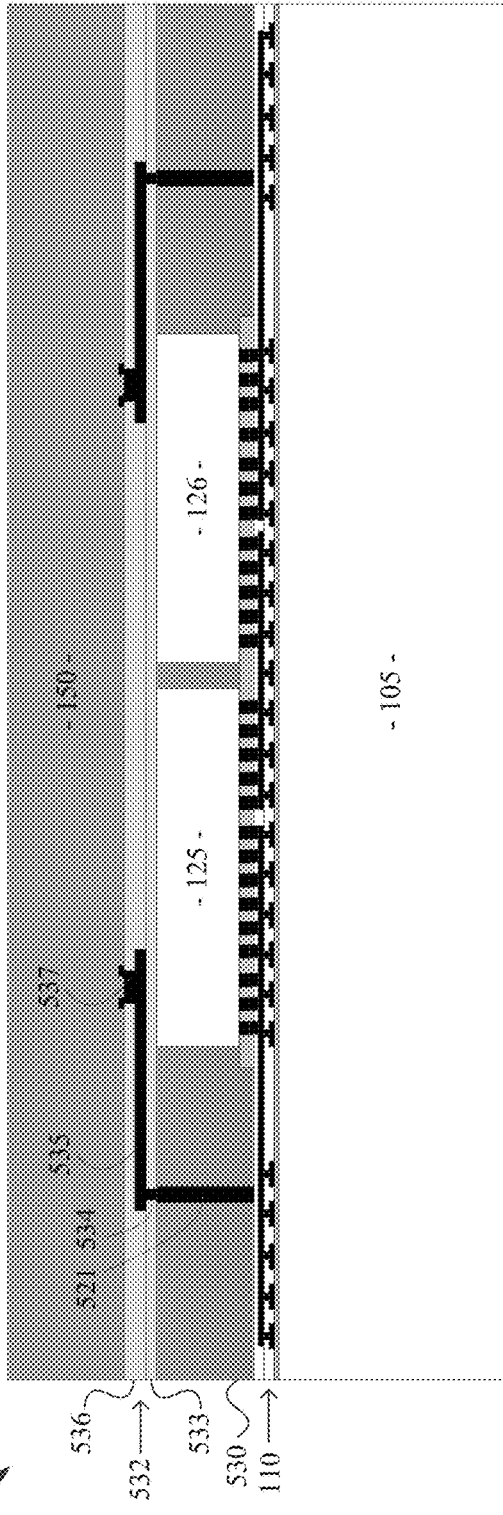

As shown by example in FIG. 5E, after the backside RDL layer 532 is formed, a wafer support structure 150 may be attached to the backside RDL layer 532 (e.g., directly, with an intervening adhesive layer, utilizing vacuum force, etc.). The wafer support 150 may, for example, be attached in a same or similar manner to the wafer support 150 attached at block 245. For example, FIG. 5E shows the wafer support 150 attachment in a manner similar to that of FIG. 1E, albeit with attachment to the RDL layer 532 rather than attachment to the mold layer 130 and semiconductor die 125, 126.

Figure 5F:
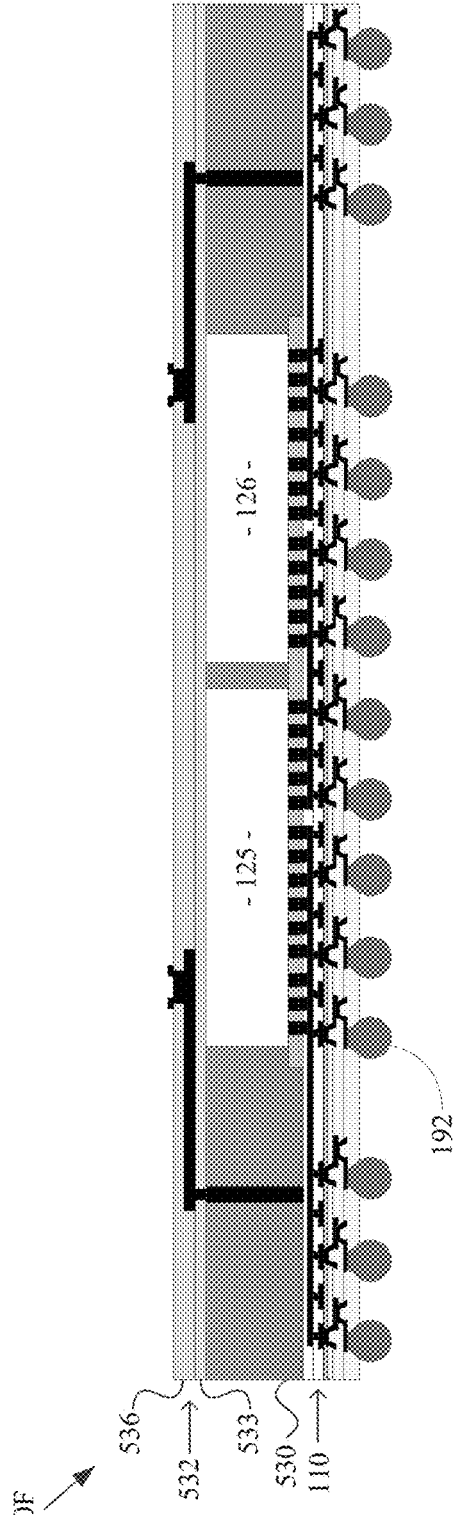

As illustrated by example in FIG. 5F, the support layer 105 (shown in FIG. 5E) may be removed from the RD wafer, a frontside redistribution layer may be formed on a side of the RD structure 110 opposite the die 125, 126, interconnection structures 192 may be formed, and the wafer support 150 may be removed.

For example, the support layer 105 may be removed in a same or similar manner to that discussed herein with regard to block 250 and FIGS. 1E-1F. Also for example, a frontside redistribution layer may be formed in a same or similar manner to that discussed herein with regard to blocks 255-280 and FIGS. 1G-1H. Additionally for example, interconnection structures 192 may be formed in a same or similar manner to that discussed herein with regard to block 285 and FIG. 1I. Further for example, the wafer support 150 may be removed in a same or similar manner to that discussed herein with regard to block 290 and FIG. 1J.

In another example implementation, a substrate (e.g., a laminate substrate, package substrate, etc.) may be attached above the semiconductor die 125, 126, for example instead of or in addition to the backside RDL discussed herein with regard to FIG. 5. For example, as illustrated in FIG. 6A, the interconnection structures 621 may be formed at a height that will extend to the height of the die 125, 126. Note that this height is not necessarily present, for example in a scenario in which the backside substrate has its own interconnection structures or in which additional interconnection structures are utilized between the interconnection structures 621 and the backside substrate. The interconnection structures 621 may, for example, be attached in a same or similar manner as that discussed herein with regard to block 215 and FIG. 1B.

Continuing the example, as illustrated in FIG. 6B, the assembly 600B may be molded and the mold may be thinned if necessary. Such molding and/or thinning may, for example, be performed in a same or similar manner to that discussed herein with regard to blocks 230 and 235, and FIGS. 1C and 1D.

As shown in FIG. 6C, a wafer support 150 may be attached, support layer 105 may be removed, and a front side RDL may be formed. For example, a wafer support 150 may be attached in a same or similar manner as that discussed herein with regard to block 245 and FIG. 1E. Also for example, support layer 105 may be removed in a same or similar manner as that discussed herein with regard to block 250 and FIG. 1F. Additionally for example, a frontside RDL may be formed in a same or similar manner as that discussed herein with regard to blocks 255-280 and FIGS. 1G-1H.

As illustrated in FIG. 6D, interconnection structures 192 may be attached, the wafer support 150 may be removed, and the backside substrate 632 may be attached. For example, the interconnection structures 192 may be attached in a same or similar manner as that discussed herein with regard to block 285 and FIG. 1I. Also for example, the wafer support 150 may be removed in a same or similar manner as that discussed herein with regard to block 290 and FIG. 1J. Further for example, the backside substrate 632 may be electrically attached to the interconnection structures 621 and/or mechanically attached to the mold material 130 and/or the die 125, 126. The backside substrate 632 may, for example, be attached in wafer (or panel) form and/or single package form, and may for example be attached before or after dicing (e.g., as discussed at block 295).

The example methods and assemblies shown in FIGS. 1-7 and discussed herein are merely non-limiting examples presented to illustrate various aspects of this disclosure. Such methods and assemblies may also share any or all characteristics with the methods and assemblies shown and discussed in the following co-pending United States patent applications: U.S. patent application Ser. No. 13/753,120, filed Jan. 29, 2013, and titled "SEMICONDUCTOR DEVICE AND METHOD OF MANUFACTURING SEMICONDUCTOR DEVICE"; U.S. patent application Ser. No. 13/863,457, filed on Apr. 16, 2013, and titled "SEMICONDUCTOR DEVICE AND MANUFACTURING METHOD THEREOF"; U.S. patent application Ser. No. 14/083,779, filed on Nov. 19, 2013, and titled "SEMICONDUCTOR DEVICE WITH THROUGH-SILICON VIA-LESS DEEP WELLS"; U.S. patent application Ser. No. 14/218,265, filed Mar. 18, 2014, and titled "SEMICONDUCTOR DEVICE AND MANUFACTURING METHOD THEREOF"; U.S. patent application Ser. No. 14/313,724, filed Jun. 24, 2014, and titled "SEMICONDUCTOR DEVICE AND MANUFACTURING METHOD THEREOF"; U.S. patent application Ser. No. 14/444,450, Jul. 28, 2014, and titled "SEMICONDUCTOR DEVICE WITH THIN REDISTRIBUTION LAYERS"; U.S. patent application Ser. No. 14/524,443, filed Oct. 27, 2014, and titled "SEMICONDUCTOR DEVICE WITH REDUCED THICKNESS"; U.S. patent application Ser. No. 14/532,532, filed Nov. 4, 2014, and titled "INTERPOSER, MANUFACTURING METHOD THEREOF, SEMICONDUCTOR PACKAGE USING THE SAME, AND METHOD FOR FABRICATING THE SEMICONDUCTOR PACKAGE"; U.S. patent application Ser. No. 14/546,484, filed Nov. 18, 2014, and titled "SEMICON- DUCTOR DEVICE WITH REDUCED WARPAGE"; and U.S. patent application Ser. No. 14/671,095, filed Mar. 27, 2015, and titled "SEMICONDUCTOR DEVICE AND MANUFACTURING METHOD THEREOF;" the contents of each of which are hereby incorporated herein by reference in their entirety.

It should be noted that any or all of the semiconductor packages discussed herein may be, but need not be, attached to a package substrate. Various non-limiting examples of such semiconductor device packages and methods of manufacturing thereof will now be discussed.

FIGS. 7A-7L show cross-sectional views illustrating an example semiconductor package and an example method of making a semiconductor package, in accordance with various aspects of the present disclosure. The structures shown in 7A-7L may, for example, share any or all characteristics with analogous structures shown in FIGS. 1A-1J, 3A-3B, 4A-4D, 5A-5F, 6A-6D, 9, 10A-10B, 11A-11D, 12A-12B, 13, and 14. FIG. 8 is a flow diagram of an example method 800 of making a semiconductor package, in accordance with various aspects of the present disclosure. The example method 800 may, for example, share any or all characteristics with the example method 200 illustrated in FIG. 2 and discussed herein and with any methods discussed herein. FIGS. 7A-7L may, for example, illustrate an example semiconductor package at various steps (or blocks) of the production method 800 of FIG. 8. FIGS. 7A-7L and FIG. 8 will now be discussed together.

The example method 800 may, at block 805, comprise preparing a logic wafer for processing (e.g., for packaging). Block 805 may comprise preparing a logic wafer for processing in any of a variety of manners, non-limiting examples of which are presented herein. Block 805 may, for example, share any or all characteristics with block 205 of the example method 200 shown in FIG. 2 and discussed herein.

The example method 800 may, at block 810, comprise preparing a redistribution structure wafer (RD wafer). Block 810 may comprise preparing an RD wafer for processing in any of a variety of manners, non-limiting examples of which are provided herein. Block 810 may, for example, share any or all characteristics with block 210 of the example method 200 shown in FIG. 2 and discussed herein.

Figure 7A:
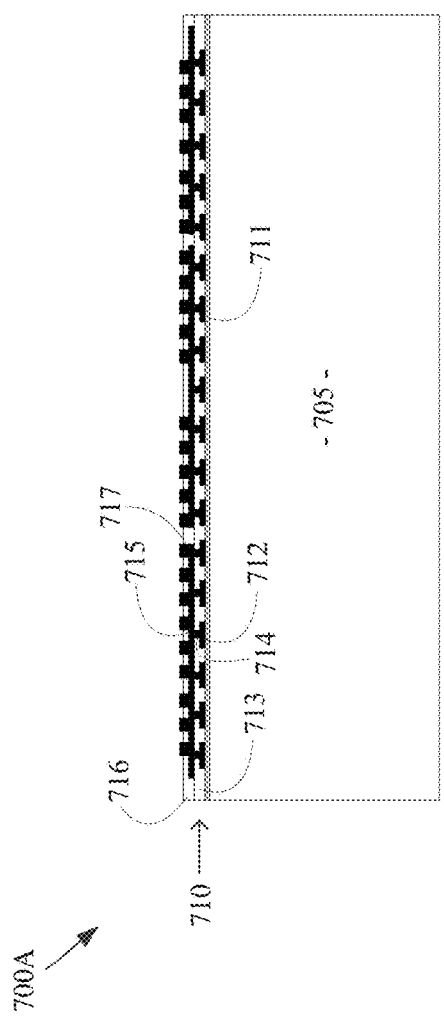
Figure 8:
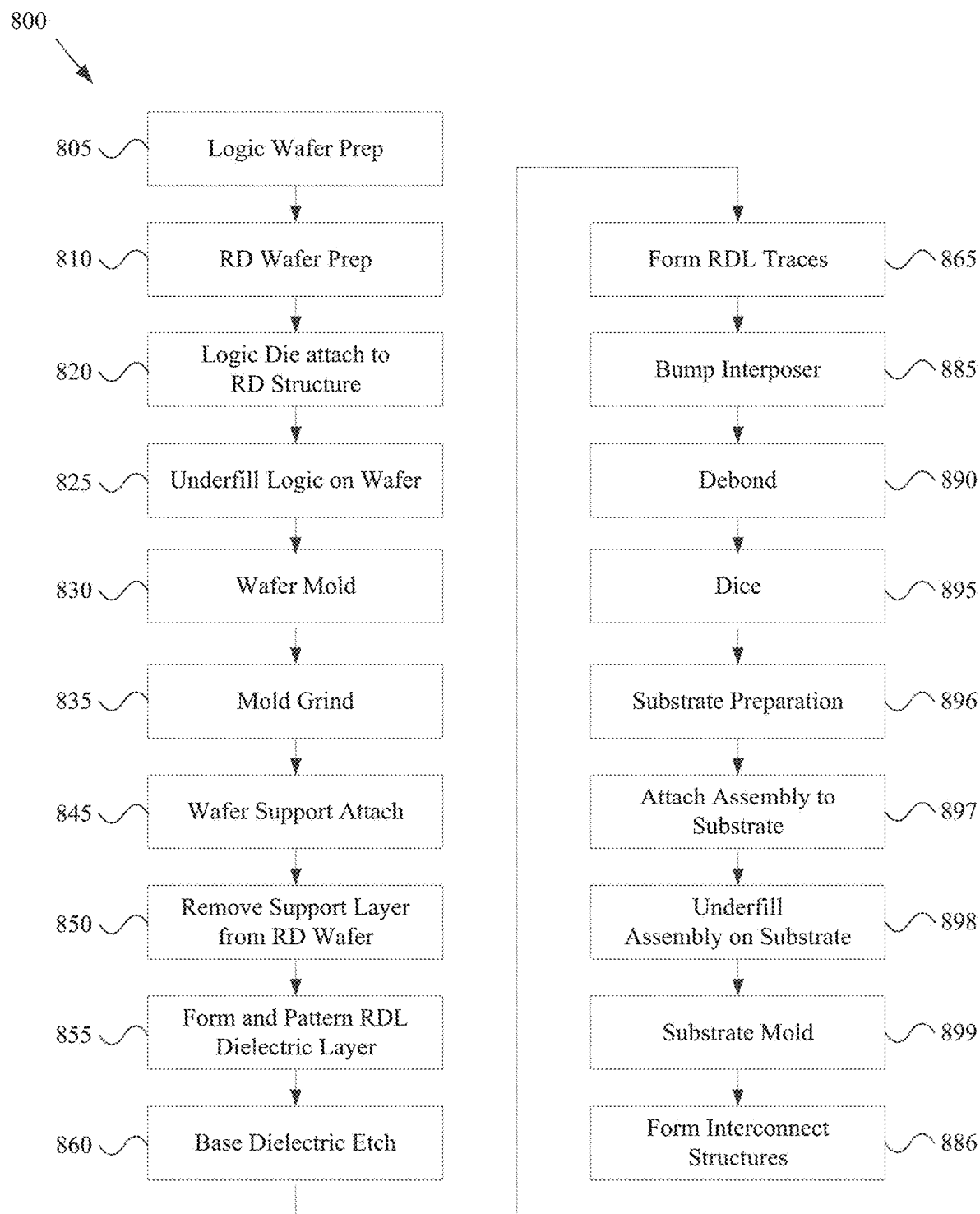
FIG. 8 is a flow diagram of an example method of making a semiconductor package, in accordance with various aspects of the present disclosure.
Figure 9:
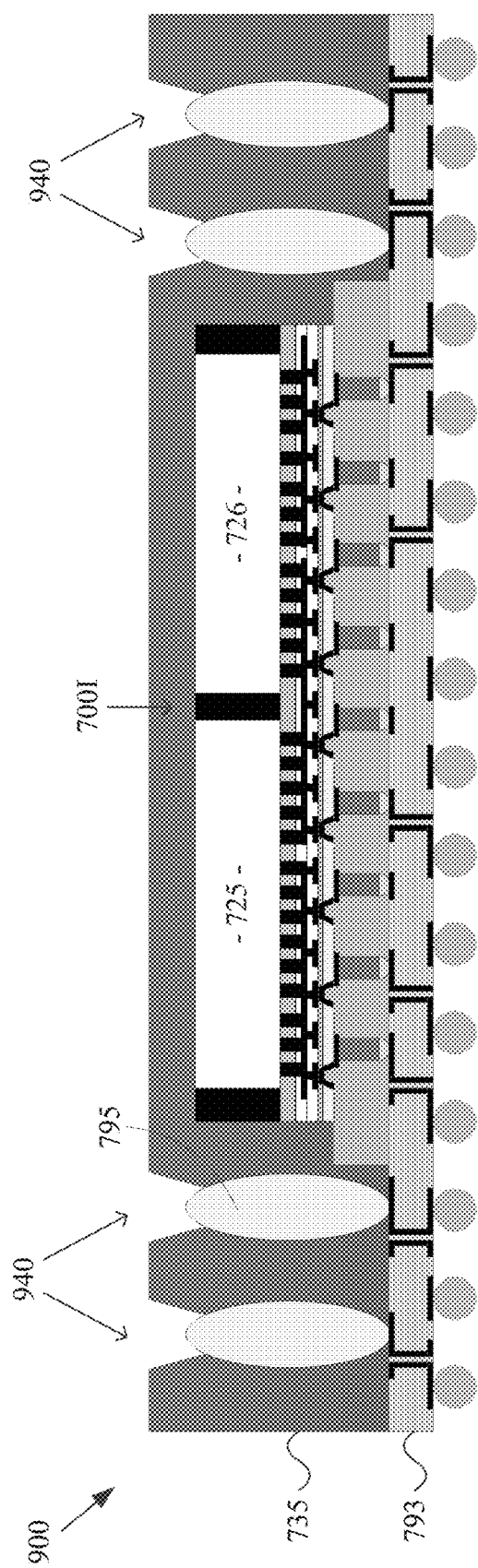
FIG. 9 shows a cross-sectional view illustrating an example semiconductor package and an example method of making a semiconductor package, in accordance with various aspects of the present disclosure.

FIG. 7A provides an example illustration of various aspects of block 810. Referring to FIG. 7A, the RD wafer 700A may, for example, comprise a support layer 705 (e.g., a silicon layer). A redistribution (RD) structure 710 may be formed on the support layer 105. The RD structure 710 may, for example, comprise a base dielectric layer 711, a first dielectric layer 713, first conductive traces 712, a second dielectric layer 716, second conductive traces 715, and interconnection structures 717.

The base dielectric layer 711 may, for example, be on the support layer 705. The base dielectric layer 711 may, for example, comprise an oxide layer, a nitride layer, etc. The base dielectric layer 711 may, for example, be formed to specification and/or may be native.

The RD wafer 700A may also, for example, comprise first conductive traces 712 and a first dielectric layer 713. The first conductive traces 712 may, for example, comprise deposited conductive metal (e.g., copper, etc.). The first dielectric layer 713 may, for example, comprise an inorganic dielectric material (e.g., silicon oxide, silicon nitride, etc.). In an alternative assembly, the first dielectric layer 713 may comprise an organic dielectric material.

The RD wafer 700A may also, for example, comprise second conductive traces 715 and a second dielectric layer 716. The second conductive traces 715 may, for example, comprise deposited conductive metal (e.g., copper, etc.). The second conductive traces 715 may, for example, be connected to respective first conductive traces 712 through respective conductive vias 714 (e.g., in the first dielectric layer 713). The second dielectric layer 716 may, for example, comprise an inorganic dielectric material (e.g., silicon oxide, silicon nitride, etc.). In an alternative assembly, the second dielectric layer 716 may comprise an organic dielectric material.

Though two sets of dielectric layers and conductive traces are illustrated in FIG. 7A, it should be understood that the RD structure 710 of the RD wafer 700A may comprise any number of such layers and traces. For example, the RD structure 710 might comprise only one dielectric layer and/or set of conductive traces, three sets of dielectric layers and/or conductive traces, etc.

As with the logic wafer prep at block 205, block 210 may comprise forming interconnection structures (e.g., conductive bumps, conductive balls, conductive pillars, conductive lands or pads, etc.) on a surface of the RD structure 710. Examples of such interconnection structures 717 are shown in FIG. 7A, in which the RD structure 710 comprises interconnection structures 717, which are shown formed on the front (or top) side of the RD structure 710 and electrically connected to respective second conductive traces 715 through conductive vias in the second dielectric layer 716. Such interconnection structures 717 may, for example, be utilized to couple the RD structure 710 to various electronic components (e.g., active semiconductor components or die, passive components, etc.).

The interconnection structures 717 may, for example, comprise any of a variety of conductive materials (e.g., any one of or a combination of copper, nickel, gold, etc.). The interconnection structures 717 may also, for example, comprise solder.

In general, block 810 may comprise preparing a redistribution structure wafer (RD wafer). Accordingly, the scope of this disclosure should not be limited by characteristics of any particular manner of performing such preparing.

The example method 800 may, at block 820, comprise attaching one or more semiconductor die to the RD structure (e.g., of the RD wafer). Block 820 may comprise attaching the die to the RD structure in any of a variety of manners, non-limiting examples of which are provided herein. Block 820 may, for example, share any or all characteristics with block 220 of the example method 200 shown in FIG. 2 and discussed herein.

Figure 7B:
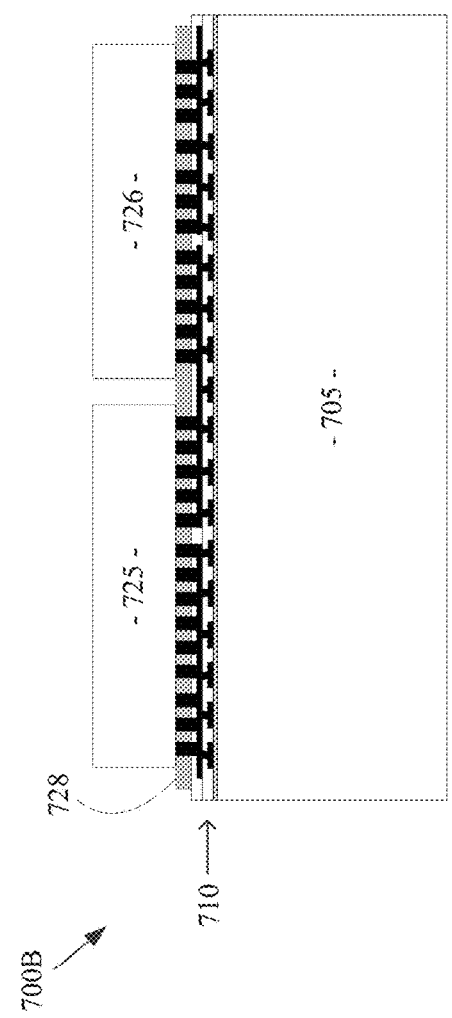

FIG. 7B provides an example illustration of various aspects of block 820, for example the die attachment. For example, the first die 725 (e.g., which may have been diced from a logic wafer prepared at block 805) is electrically and mechanically attached to the redistribution structure 710. Similarly, the second die 726 (e.g., which may have been diced from a logic wafer prepared at block 805) is electrically and mechanically attached to the redistribution structure 710.

The first die 725 and the second die 726 may comprise any of a variety of die characteristics. In an example scenario, the first die 725 may comprise a processor die and the second die 726 may comprise a memory die. In another example scenario, the first die 725 may comprise a processor die, and the second die 726 may comprise a co-processor die. In another example scenario, the first die 725 may comprise a sensor die, and the second die 726 may comprise a sensor processing die. Though the assembly 700B at FIG. 7B is shown with two die 725, 726, there may be any number of die. For example, there might be only one die, three die, four die, or more than four die.

Additionally, though the first die 725 and the second die 726 are shown attached to the redistribution structure 710 laterally relative to each other, they may also be arranged in a vertical assembly. Various non-limiting example assemblies of such structures are shown and discussed herein (e.g., die-on-die stacking, die attach to opposite substrate side, etc.). Also, though the first die 725 and the second die 726 are shown with generally similar dimensions, such die 725, 726 may comprise different respective characteristics (e.g., die height, footprint, connection pitch, etc.).

The first die 725 and the second die 726 are illustrated with generally consistent pitch, but this need not be the case. For example, most or all of the contacts of the first die 725 in a region of the first die footprint immediately adjacent to the second die 726 and/or most of the contacts of the second die 726 in a region of the second die footprint immediately adjacent to the first die 725 may have substantially finer pitch than most or all of the other contacts. For example, a first 5, 10, or n rows of contacts of the first die 725 closest to the second die 726 (and/or of the second die 726 closest to the first die 725) may have a 30 micron pitch, while other contacts may generally have an 80 micron and/or 200 micron pitch. The RD structure 710 may thus have corresponding contact structures and/or traces at the corresponding pitch.

In general, block 820 comprises attaching one or more semiconductor die to the redistribution structure (e.g., of a redistribution wafer). Accordingly, the scope of this disclosure should not be limited by characteristics of any particular die or by characteristics of any particular multi-die layout, or by characteristics of any particular manner of attaching such die, etc.

The example method 800 may, at block 825, comprise underfilling the semiconductor die and/or other components attached to the RD structure at block 820. Block 825 may comprise performing such underfilling in any of a variety of manners, non-limiting examples of which are presented herein. Block 825 may, for example, share any or all characteristics with block 225 of the example method 200 shown in FIG. 2 and discussed herein.

FIG. 7B provides an example illustration of various aspects of block 825, for example the underfilling. The underfill 728 is positioned between the first semiconductor die 725 and the redistribution structure 710 and between the second semiconductor die 726 and the redistribution structure 710.

Though the underfill 728 is generally illustrated to be flat, the underfill may rise up and form fillets on the sides of the semiconductor die and/or other components. In an example scenario, at least a fourth or at least a half of the die side surfaces may be covered by the underfill material. In another example scenario, one or more or all of the entire side surfaces may be covered by the underfill material. Also for example, a substantial portion of the space directly between the semiconductor die, between the semiconductor die and other components, and/or between other components may be filled with the underfill material. For example, at least half of the space or all of the space between laterally adjacent semiconductor die, between the semiconductor die and other components, and/or between other components may be filled with the underfill material. In an example implementation, the underfill 728 may cover the entire redistribution structure 710 of the RD wafer. In such example implementation, when the RD wafer is later diced, such dicing may also cut through the underfill 728.

In general, block 825 may comprise underfilling the semiconductor die and/or other components attached to the RD structure at block 820. Accordingly, the scope of this disclosure should not be limited by characteristics of any particular type of underfill or of any particular manner of performing such underfilling.

The example method 800 may, at block 830, comprise molding the RD wafer (or RD structure). Block 830 may comprise molding the RD wafer in any of a variety of manners, non-limiting examples of which are presented herein. Block 830 may, for example, share any or all characteristics with block 230 of the example method 200 shown in FIG. 2 and discussed herein.

FIG. 7C provides an example illustration of various aspects of block 830, for example molding aspects. For example, the molded assembly 700C is shown with the mold material 730 covering the first semiconductor die 725, second semiconductor die 726, underfill 728, and the top surface of the redistribution structure 710. Though the mold material 730, which may also be referred to herein as encapsulant, is shown completely covering the sides and tops of the first semiconductor die 725 and second semiconductor die 726, this need not be the case. For example, block 830 may comprise utilizing a film assist or die seal molding technique to keep the die tops free of mold material.

The mold material 730 may generally, for example, directly contact and cover portions of the die 725, 726 that are not covered by the underfill 728. For example in a scenario in which at least a first portion of the sides of the die 725, 726 is covered by underfill 728, the mold material 730 may directly contact and cover a second portion of the sides of the die 725, 726. The mold material 730 may also, for example, fill the space between the die 725, 726 (e.g., at least a portion of the space that is not already filled with underfill 728).

In general, block 830 may comprise molding the RD wafer. Accordingly, the scope of this disclosure should not be limited by characteristics of any particular molding material, structure and/or technique.

The example method 800 may, at block 835, comprise grinding (or otherwise thinning) the mold material applied at block 830. Block 835 may comprise grinding (or thinning) the mold material in any of a variety of manners, non-limiting examples of which are presented herein. Block 835 may, for example, share any or all characteristics with block 235 of the example method 200 shown in FIG. 2 and discussed herein.

FIG. 7D provides an example illustration of various aspects of block 835, for example the mold grinding aspects. The assembly 700D is illustrated with the mold material 730 (e.g., relative to the mold material 730 illustrated at FIG. 7C) thinned to reveal top surfaces of the die 725, 726. In such an example, the die 725, 726 may also have been ground (or otherwise thinned).

As explained herein, the mold material 730 may be left covering the die 725, 726 in an overmold assembly. For example, the mold material 730 might not be ground, or the mold material 730 might be ground but not to a height that exposes the die 725, 726.

In general, block 835 may comprise grinding (or otherwise thinning) the mold material applied at block 830. Accordingly, the scope of this disclosure should not be limited by characteristics of any particular amount or type of grinding (or thinning).

The example method 800 may, at block 845, comprise attaching the molded RD wafer (e.g., the top or mold side thereof) to a wafer support structure. Block 845 may comprise attaching the molded RD wafer to the wafer support structure in any of a variety of manners, non-limiting examples of which are provided herein. Block 845 may, for example, share any or all characteristics with block 245 of the example method 200 shown in FIG. 2 and discussed herein.

Figure 7E:
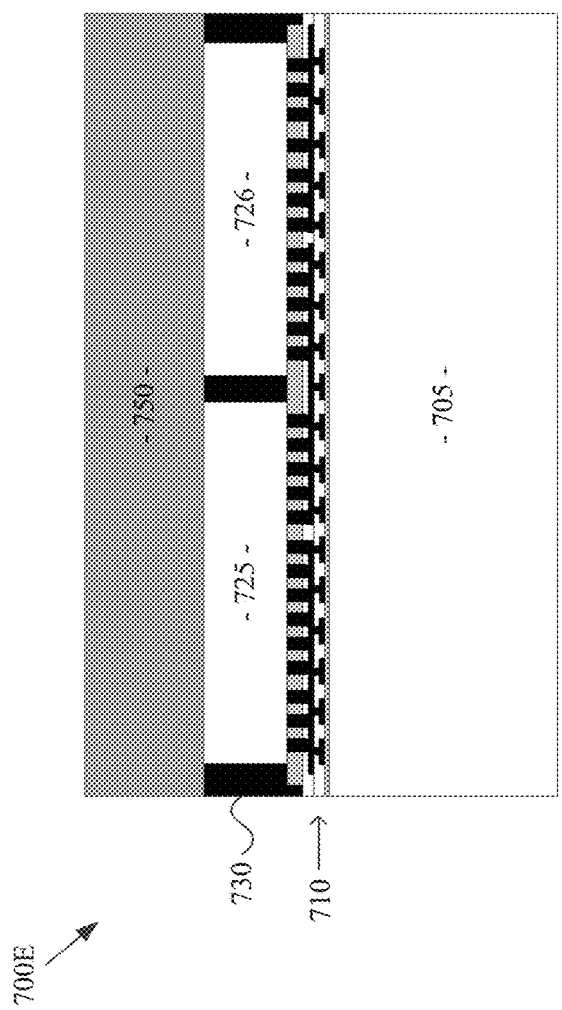

FIG. 7E provides an example illustration of various aspects of block 845, for example wafer support attaching aspects. The wafer support structure 750 is attached to the top side of the mold material 730 and die 725, 726. The wafer support structure 750 may, for example, be attached with an adhesive. Note that in an assembly in which the tops of the die 725, 726 are covered with the mold material 730, the wafer support structure 750 might only be directly coupled to the top of the mold material 730.

In general, block 845 may comprise attaching the molded RD wafer (e.g., the top or mold side thereof) to a wafer support structure. Accordingly, the scope of this disclosure should not be limited by characteristics of any particular type of wafer support structure or by characteristics of any particular manner of attaching a wafer support structure.

The example method 200 may, at block 850, comprise removing a support layer from the RD wafer. Block 850 may comprise removing the support layer in any of a variety of manners, non-limiting examples of which are presented herein. Block 850 may, for example, share any or all characteristics with block 250 of the example method 200 shown in FIG. 2 and discussed herein.

As discussed herein, the RD wafer may comprise a support layer on which an RD structure is formed and/or carried. The support layer may, for example, comprise a semiconductor material (e.g., silicon). In an example scenario in which the support layer comprises a silicon wafer layer, block 850 may comprise removing the silicon (e.g., removing all of the silicon from the RD wafer, removing almost all of the silicon, for example at least 90% or 95%, from the RD wafer, etc.). For example, block 850 may comprise mechanically grinding almost all of the silicon, followed by a dry or wet chemical etch to remove the remainder (or almost all of the remainder). In an example scenario in which the support layer is loosely attached to the RD structure formed (or carried) thereon, block 850 may comprise pulling or peeling to separate the support layer from the RD structure.

Figure 7F:
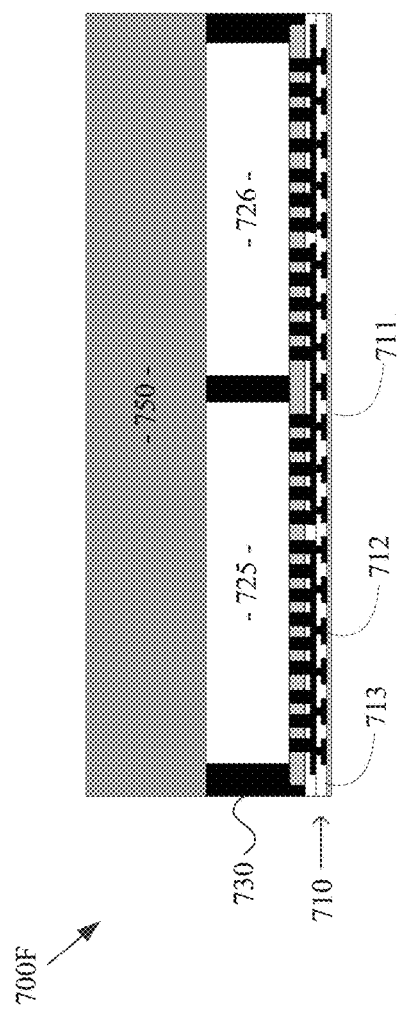

FIG. 7F provides an example illustration of various aspects of block 850, for example support layer removing aspects. For example, the support layer 705 (shown in FIG. 7E) is removed from the RD structure 710. In the illustrated example, the RD structure 710 may still comprise a base dielectric layer 711 (e.g., an oxide, nitride, etc.) as discussed herein.

In general, block 850 may comprise removing a support layer from the RD wafer. Accordingly, the scope of this disclosure should not be limited by characteristics of any particular type of wafer material or by characteristics of any particular manner of wafer material removal.

The example method 800 may, at block 855, comprise forming and patterning a redistribution layer (RDL) dielectric layer for etching an oxide layer of the RD structure. Block 855 may comprise forming and patterning the RDL dielectric layer in any of a variety of manners, non-limiting examples of which are presented herein. Block 855 may, for example, share any or all characteristics with block 255 of the example method 200 shown in FIG. 2 and discussed herein.

Figures 7G, 7H:
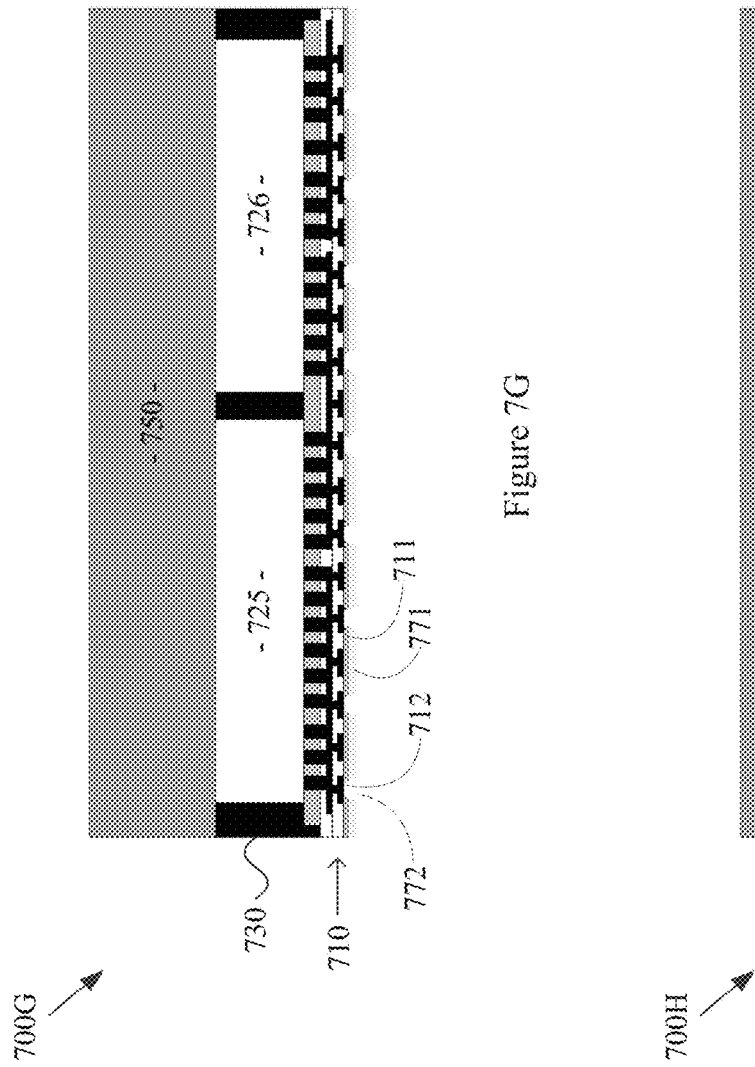

FIG. 7G provides an example illustration of various aspects of block 855. For example, the RDL dielectric layer 771 is formed and patterned on the base dielectric layer 711. The patterned RDL dielectric layer 771 may, for example, comprise vias 772 through the RDL dielectric layer 771, for example through which the base dielectric layer 711 may be etched (e.g., at block 860) and in which conductive traces (or portions thereof) may be formed (e.g., at block 865).

In general, block 855 may comprise forming and patterning a dielectric layer (e.g., an RDL dielectric layer), for example on the base dielectric layer. Accordingly, the scope of this disclosure should not be limited by characteristics of a particular dielectric layer or by characteristics of a particular manner of forming a dielectric layer.

The example method 800 may, at block 860, comprise etching the base dielectric layer (e.g., oxide layer, nitride layer, etc.), for example unmasked portions thereof, from the RD structure. Block 860 may comprise performing the etching in any of a variety of manners, non-limiting examples of which are presented herein. Block 860 may, for example, share any or all characteristics with block 260 of the example method 200 shown in FIG. 2 and discussed herein.

FIG. 7G provides an example illustration of various aspects of block 860. For example, portions of the base dielectric layer 711 that were shown below the first conductive traces 712 in FIG. 7F are removed from FIG. 7G. This, for example, enables a metal-to-metal contact between the first conductive traces 712 and the RDL traces formed at block 865.

In general, block 860 may, for example, comprise etching the base dielectric layer. Accordingly, the scope of this disclosure should not be limited by any particular manner of performing such etching.

The example method 800 may, at block 865, comprise forming redistribution layer (RDL) traces. Block 865 may comprise forming the RDL traces in any of a variety of manners, non-limiting examples of which are presented herein. Block 865 may, for example, share any or all characteristics with block 265 of the example method 200 shown in FIG. 2 and discussed herein.

FIGS. 7G and 7H provide an example illustration of various aspects of block 865, for example RDL trace forming aspects. For example, a first portion 781 of the RDL traces may be formed in the vias 772 of the RDL dielectric layer 771 and contacting the first conductive traces 712 of the RD structure 710 exposed by such vias 772. Also for example, a second portion 782 of the first RDL traces may be formed on the first RDL dielectric layer 771.

In general, block 865 may comprise forming redistribution layer (RDL) traces. Accordingly, the scope of this disclosure should not be limited by characteristics of any particular RDL traces or by characteristics of any particular manner of forming such RDL traces.

Note that although the example method 800, shows the formation of only one RDL dielectric layer at 855 and one RDL trace layer at block 865, such blocks may be repeated as many times as desired.

The example method 800 may, at block 885, comprise forming interconnection structures on the RDL traces. Block 885 may comprise forming the interconnection structures in any of a variety of manners, non-limiting examples of which are presented herein. For example, block 885 may share any or all characteristics with block 285 of the example method 200 shown in FIG. 2 and discussed herein.

Block 885 may, for example, comprise forming conductive pillars (e.g., metal pillars, copper pillars, solder-capped pillars, etc.) and/or conductive bumps (e.g., solder bumps, etc.) on the RDL traces. For example, block 885 may comprise plating conductive pillars, placing or pasting conductive bumps, etc.

Figure 7I:
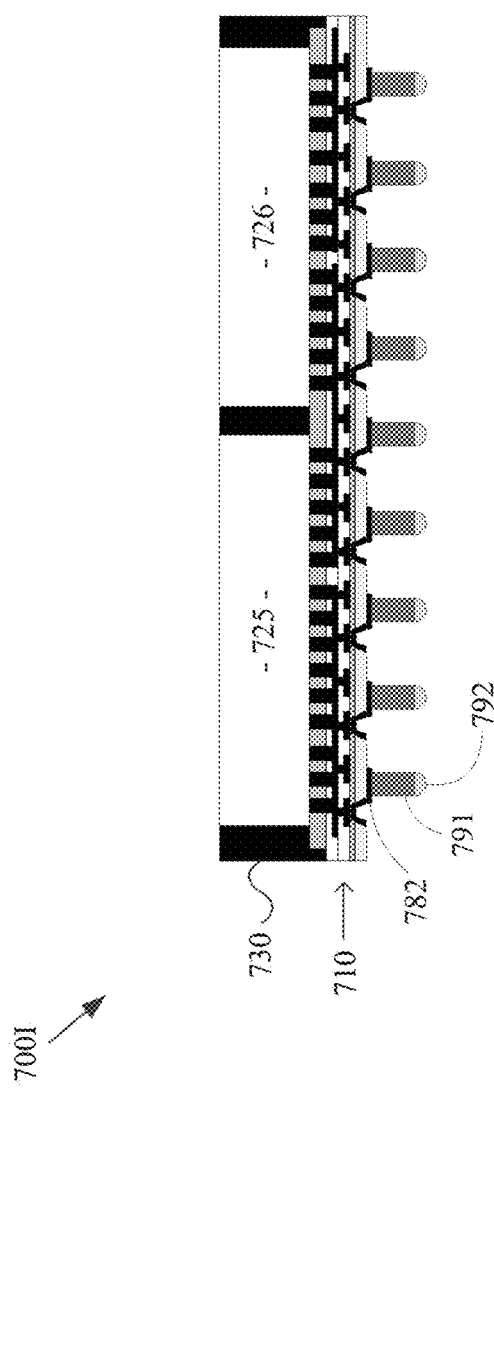

FIG. 7I provides an example illustration of various aspects of block 885, for example bump forming aspects. For example, interconnection structures 792 (e.g., shown as solder-capped metal pillars, for example copper pillars) are attached to the RDL traces 782.

Though the redistribution layer(s) formed at blocks 855-885, which may also be referred to as the frontside redistribution layer (RDL), are generally illustrated in FIG. 7 in a fan-in assembly (e.g., generally contained within the footprint of the die 725, 726), they may also be formed in a fan-out assembly, for example in which at least a portion of the interconnection structures 792 generally extend outside the footprint of the die 125, 126. Non-limiting examples of such an assembly are presented herein.

In general, block 885 may comprise forming interconnection structures, for example on the RDL traces and/or on the RDL dielectric layer. Accordingly, the scope of this disclosure should not be limited by characteristics of any particular interconnection structures or by any particular manner of forming interconnection structures.

The example method 800 may, at block 890, comprise debonding (or de-attaching) the wafer support that was attached at block 845. Block 890 may comprise performing such debonding in any of a variety of manners, non-limiting examples of which are presented herein. For example, block 890 may share any or all characteristics with block 290 of the example method 200 shown in FIG. 2 and discussed herein.

FIGS. 7H and 7I provide an example illustration of various aspects of block 890. For example, the wafer support 750 illustrated in FIG. 7H is removed in FIG. 7I.

In general, block 890 may comprise debonding the wafer support. Accordingly, the scope of this disclosure should not be limited by characteristics of any particular type of wafer support or by any particular manner of debonding a wafer support.

The example method 800 may, at block 895, comprise dicing the wafer. Block 895 may comprise dicing the wafer in any of a variety of manners, non-limiting examples of which are presented herein. Block 895 may, for example, share any or all characteristics with block 295 of the example method 200 shown at FIG. 2 and discussed herein.

The discussion herein has generally focused on discussing processing of a single die of the RD wafer. Such focus on a single die of the RD wafer is for illustrative clarity only. It should be understood that all of the process steps (or blocks) discussed herein may be performed on an entire wafer. For example, each of the illustrations provided at FIGS. 7A-7L and other figures herein may be replicated tens or hundreds of times on a single wafer. For example, until dicing, there might be no separation between one of the illustrated device assemblies and a neighboring device assembly of the wafer.

Block 895 may, for example, comprise dicing (e.g., mechanical punch-cutting, mechanical saw-cutting, later cutting, soft beam cutting, plasma cutting, etc.) the individual packages from the wafer. The end result of such dicing may, for example, be the package shown in FIG. 7. For example, the dicing may form side surfaces of the package comprising coplanar side surfaces of a plurality of components of the package. For example, any or all of side surfaces of the mold material 730, the RD structure 710 dielectric layers, the RDL dielectric layer 771, underfill 728, etc., may be coplanar.

In general, block 895 may comprise dicing the wafer. Accordingly, the scope of this disclosure should not be limited by characteristics of any particular manner of dicing a wafer.

The example method 800 may, at block 896, comprise preparing a substrate, or wafer or panel thereof, for attachment of the assembly 700I thereto. Block 896 may comprise preparing a substrate in any of a variety of manners, non-limiting examples of which are presented herein. Block 896 may, for example, share any or all aspects with blocks 205 and 210 of the example method 200 shown in FIG. 2 and discussed herein.

The substrate may, for example, comprise characteristics of any of a variety of substrates. For example, the substrate may comprise a package substrate, motherboard substrate, laminate substrate, molded substrate, semiconductor substrate, glass substrate, etc.). Block 896 may, for example, comprise preparing front side and/or backside surfaces of the substrate for electrical and/or mechanical attachment. Block 896 may, for example, leave a panel of substrates in a panel form at this stage and excise individual packages later, or may excise individual substrates from a panel at this stage.

Block 896 may also comprise receiving the substrate from an adjacent or upstream manufacturing station at a manufacturing facility, from another geographical location, etc. The substrate may, for example, be received already prepared or additional preparation steps may be performed.

Figure 7J:
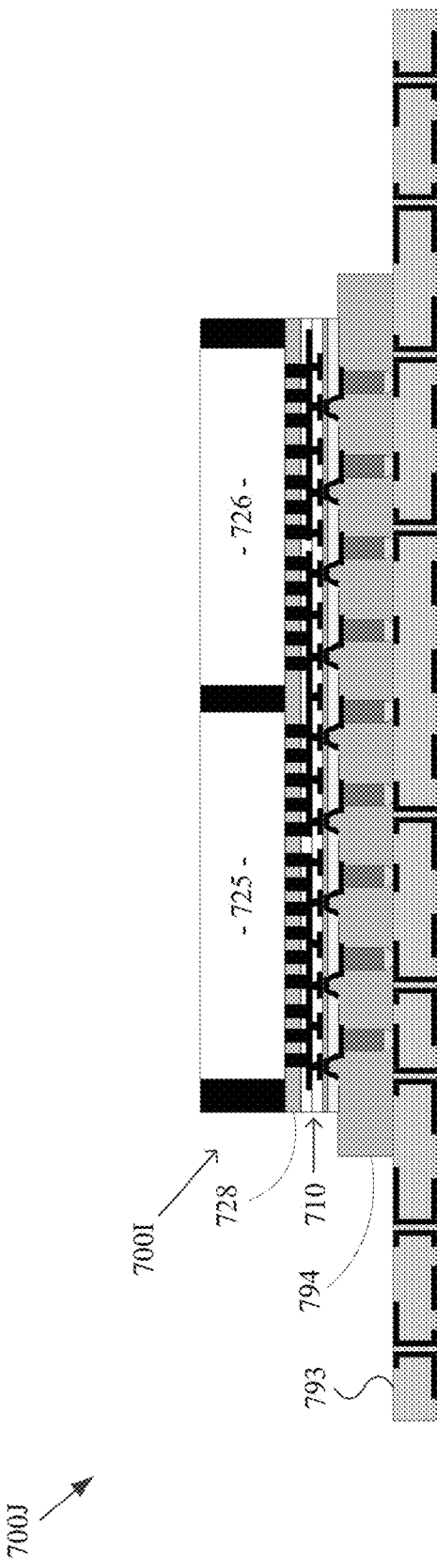

FIG. 7J provides an example illustration of various aspects of block 896. For example, the assembly 700J includes an example substrate 793 that was prepared for attachment.

In general, block 896 may comprise preparing a substrate, or wafer or panel thereof, for attachment of the assembly 700I thereto. Accordingly, the scope of various aspects of this disclosure should not be limited by characteristics of particular substrates or by characteristics of any particular manner of preparing a substrate.

The example method 800 may, at block 897, comprise attaching an assembly to the substrate. Block 897 may comprise attaching an assembly (e.g., an assembly 700I as exemplified at FIG. 7I or other assembly) in any of a variety of manners, non-limiting examples of which are presented herein. Block 897 may, for example, share any or all characteristics with block 220 of the example method 200 shown in FIG. 2 and discussed herein.

The assembly may comprise characteristics of any of a variety of assemblies, non-limiting examples of which are presented herein, for example in all of the figures and/or related discussions herein. Block 897 may comprise attaching the assembly in any of a variety of manners. For example, block 897 may comprise attaching the assembly to the substrate utilizing mass reflow, thermocompression bonding (TCB), conductive epoxy, etc.

FIG. 7J provides an example illustration of various aspects of block 897, for example assembly attachment aspects. For example, the assembly 700I shown at FIG. 7I is attached to the substrate 793.

Figure 7K:
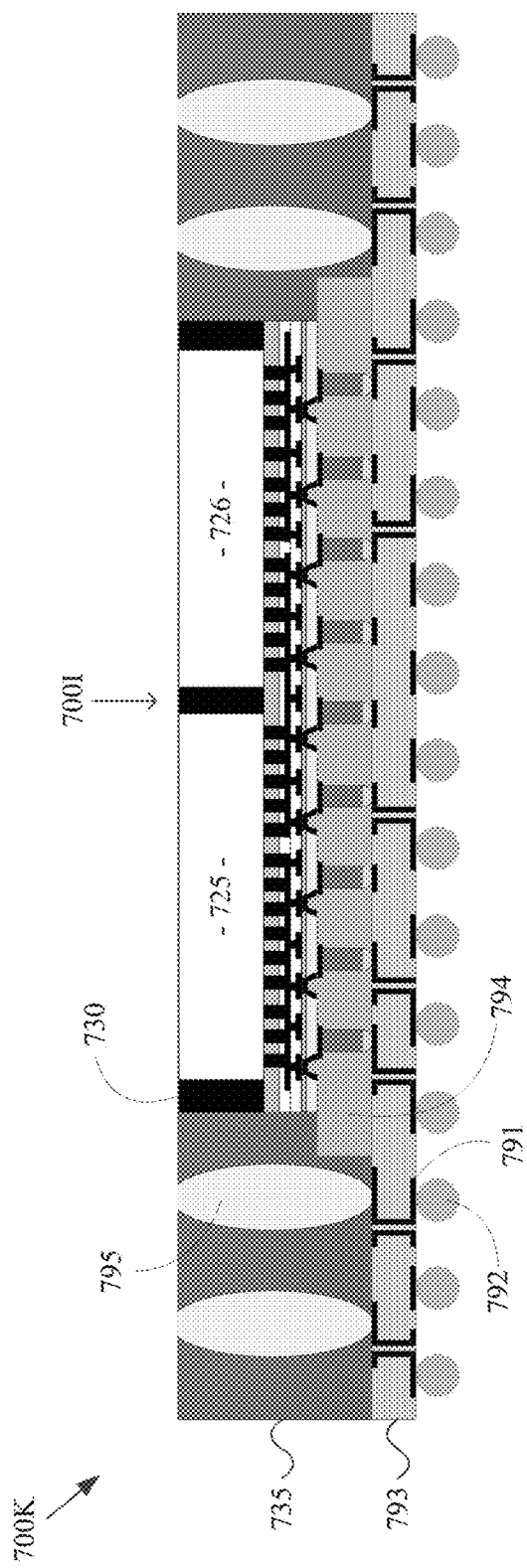
Figure 7L:
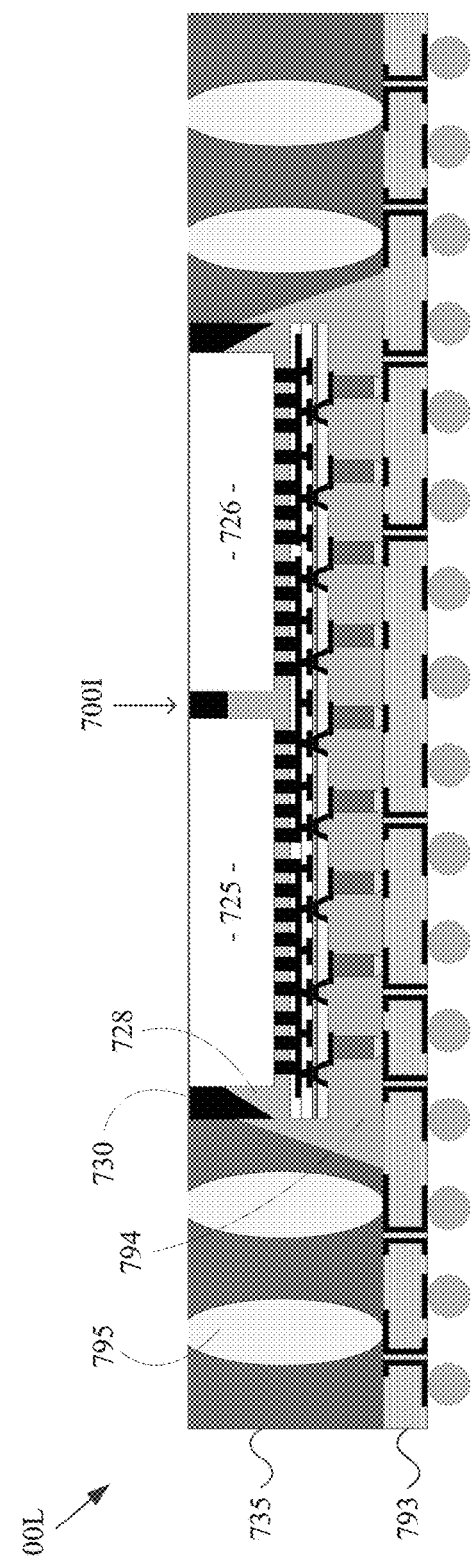

Though not shown in FIG. 7J, in various example implementations (e.g., as shown in FIGS. 7K and 7L), interconnection structures, for example through mold interconnection structures, may be formed on the substrate 793. In such example implementations, block 897 may share any or all characteristics with block 215 of the example method 200 shown in FIG. 2 and discussed herein, albeit with regard to forming the interconnection structures on the substrate 793. Note that such interconnection structures may be performed before or after the assembly attachment, or may also be performed before or after the underfilling at block 898.

In general, block 897 comprises attaching an assembly to the substrate. Accordingly, the scope of this disclosure should not be limited by characteristics of any particular assembly, substrate, or manner of attaching an assembly to a substrate.

The example method 800 may, at block 898, comprise underfilling the assembly on the substrate. Block 898 may comprise any of a variety of manners of underfilling, non-limiting examples of which are presented herein. Block 898 may, for example, share any or all characteristics with block 825 and/or with block 225 of the example method 200 shown in FIG. 2 and discussed herein.

For example, after assembly attachment at block 897, block 898 may comprise underfilling the attached assembly utilizing a capillary underfill. For example, the underfill may comprise a reinforced polymer material viscous enough to flow between the assembly and the substrate in a capillary action.

Also for example, block 897 may comprise underfilling the semiconductor die utilizing a non-conductive paste (NCP) and/or a non-conductive film (NCF) or tape while the assembly is being attached at block 897 (e.g., utilizing a thermocompression bonding process). For example, such underfill materials may be deposited (e.g., printed, sprayed, etc.) prior to attaching the assembly.

As with all of the blocks illustrated in the example method 800, block 898 may be performed at any location in the method 8900 flow so long as the space between the assembly and the substrate is accessible.

The underfilling may also occur at a different block of the example method 800. For example, the underfilling may be performed as part of the substrate molding block 899 (e.g., utilizing a molded underfill).

FIG. 7K provides an example illustration of various aspects of block 898, for example the underfilling aspects. The underfill 794 is positioned between the assembly 700I and the substrate 793.

Though the underfill 794 is generally illustrated to be flat, the underfill may rise up and form fillets on the sides of the assembly 700 and/or other components. In an example scenario, at least a fourth or at least a half of the assembly 700 side surfaces may be covered by the underfill material. In another example scenario, one or more or all of the entire side surfaces of the assembly 700I may be covered by the underfill material. Also for example, a substantial portion of the space directly between the assembly 700I and other components and/or between other components (shown in various figures) may be filled with the underfill material 794. For example, at least half of the space or all of the space between the assembly 700I and a laterally adjacent component may be filled with the underfill material.

As shown in FIG. 7J, the assembly 700J may comprise a first underfill 728 between the die 725, 726 and the RD structure 710, and a second underfill 794 between the RD structure 710 and the substrate 793. Such underfills 728, 794 may, for example, be different. For example, in an example scenario in which the distance between the die 725, 726 and the RD structure 710 is less than the distance between the RD structure 710 and the substrate 793, the first underfill 728 may generally comprise a smaller filler size (or have higher viscosity) than the second underfill 794. In other words, the second underfill 794 may be less expensive than the first underfill 728.

Also, the respective underfilling processes performed at block 898 and 825 may be different. For example, block 825 may comprise utilize a capillary underfill procedure, while block 898 may comprise utilizing a non-conductive paste (NCP) underfill procedure.

In another example, blocks 825 and 898 may comprise being performed simultaneously in a same underfilling process, for example after block 897. Additionally, as discussed herein, a molded underfill may also be utilized. In such an example scenario, block 899 may comprise performing the underfilling of either or both of blocks 825 and/or 898 during the substrate molding process. For example, block 825 may comprise performing a capillary underfill, while block 898 is performed at block 899 as a mold underfill process.

In general, block 898 may comprise underfilling the assembly and/or other components attached to the substrate at block 897. Accordingly, the scope of this disclosure should not be limited by characteristics of any particular type of underfill nor of any particular manner of performing underfilling.

The example method 800 may, at block 899, comprise molding the substrate. Block 899 may comprise performing such molding in any of a variety of manners, non-limiting examples of which are presented herein. Block 899 may, for example, share any or all characteristics with block 830 and/or block 230 of the example method 200 shown in FIG. 2 and discussed herein.

For example, block 899 may comprise molding over the top surface of the substrate, over the assembly attached at block 897, over TMV interconnection structures if formed on the substrate (e.g., conductive balls, ellipsoids, columns or pillars (e.g., plated pillars, wires or wirebond wires, etc.), etc.).

Block 899 may, for example, comprise utilizing transfer molding, compression molding, etc. Block 899 may, for example, comprise utilizing a panel-molding process in which a plurality of the substrates are connected in a panel and molded together, or block 899 may comprise molding the substrate individually. In a panel-molding scenario, after the panel molding, block 899 may comprise performing an excising process in which individual substrates are separated from the substrate panel.

The molding material may, for example, comprise any of a variety of characteristics. For example, the molding material (e.g., epoxy mold compound (EMC), epoxy resin molding compound, etc.) may comprise a relatively high modulus, for example to provide package support in a subsequent process. Also for example, the molding material may comprise a relatively low modulus, to provide package flexibility in a subsequent process.

Block 899 may, for example, comprise utilizing a mold material that is different from the mold material utilized at block 830. For example, block 899 may utilize a mold material with a lower modulus than the mold material utilized at block 830. In such a scenario, the central areas of the assembly may be relatively stiffer than the perimeter areas of the assembly, providing for the absorption of various forces in more robust areas of the assembly.

In an example scenario in which the mold material 735 of the assembly 700K and the mold material 730 of the assembly 700I are different and/or formed at different stages and/or formed utilizing different types of processes, block 899 (or another block) may comprise preparing the mold material 730 for adhesion to the mold material 735. For example, the mold material 730 may be physically or chemically etched. The mold material 730 may, for example, be plasma etched. Also for example, grooves, indentations, protrusions, or other physical features may be formed on the mold material 730. Further for example, an adhesive agent may be placed on the mold material 730.

Block 899 may, for example, utilize a different type of molding process than utilized at block 830. In an example scenario, block 830 may utilize a compression molding process, while block 899 utilizes a transfer molding process. In such an example scenario, block 830 may utilize a mold material that is specifically adapted to compression molding, and block 899 may utilize a mold material that is specifically adapted to transfer molding. Such molding materials may, for example, have distinctly different material characteristics (e.g., flow characteristics, cure characteristics, hardness characteristics, particle size characteristics, chemical compound characteristics, etc.).

As explained herein, for example with regard to block 898, the molding process of block 899 may provide underfill between the assembly 700I and the substrate 793 and/or may provide underfill between the die 725, 726 and the RD structure 710. In such an example, there may be uniformity of material between the molded underfill material and the mold material encapsulating the substrate 793 and assembly 700I and/or the mold material encapsulating the RD structure 710 and semiconductor die 725, 726.

FIG. 7K provides an example illustration of various aspects of block 899, for example the molding aspects. For example, the molded assembly 700K is shown with the mold material 735 covering the interconnection structures 795 and the assembly 700. Though the mold material 735, which may also be referred to herein as encapsulant, is shown leaving the top of the assembly 700I exposed, this need not be the case. For example, block 899 may completely cover the assembly 700I and need not be followed by a thinning (or grinding) operation to expose the top of the assembly 700I.

The mold material 735 may generally, for example, directly contact and cover portions of the assembly 700I that are not covered by the underfill 794. For example in a scenario in which at least a first portion of the sides of the assembly 700I is covered by underfill 794, the mold material 735 may directly contact and cover a second portion of the sides of the assembly 700I. Also, the mold material 735 may extend laterally to the edge of the substrate 793 and thus comprise a side surface that is coplanar with the substrate 793. Such an assembly may, for example, be formed with panel-molding, followed by singulation of separate packages from the panel.

In general, block 899 may comprise molding the substrate. Accordingly, the scope of this disclosure should not be limited by characteristics of any particular molding material, structure and/or technique.

The example method 800 may, at block 886, comprise forming interconnection structures on the substrate, for example on the side of the substrate opposite the side to which the assembly is attached at block 897. The interconnection structures may comprise characteristics of any of variety of types of interconnection structures, for example structures that may be utilized to connect a semiconductor package to another package or to a motherboard. For example, the interconnection structures may comprise conductive balls (e.g., solder balls) or bumps, conductive posts, etc.

FIG. 7K provides an example illustration of various aspects of block 886, for example the interconnection-forming aspects. For example, the interconnection structures 792 are illustrated attached to lands 791 of the substrate 793.

In general, block 886 may comprise forming interconnection structures on the substrate. Accordingly, the scope of this disclosure should not be limited by characteristics of particular interconnection structures or by any particular manner of forming such structures.

As discussed herein, the underfill 728 may cover at least a portion of the sides of the die 725, 726, and/or the underfill 794 may cover at least a portion of the sides of the assembly 700. FIG. 7L provides an illustrative example of such coverage. For example, the assembly 700I is shown with the underfill 728 contacting a portion of the sides of the die 725, 726. As discussed herein, during a dicing process, the underfill 728 may also be diced, resulting in an assembly 700I that comprises a planar side surface that includes a side surface of the RD structure 710, a side surface of the mold material 730 and a side surface of the underfill 728.

The assembly 700L, which may also be referred to as a package, is shown with the underfill 794 contacting a portion of the sides of the assembly 700I (e.g., sides of the RD structure 710, sides of the underfill 728, and sides of the mold material 730. Note that as discussed herein, the underfill 794 may, in various example implementations, comprise molded underfill that is the same material as the mold material 735. The mold material 735 is shown encapsulating the substrate 793, the interconnection structures 795, the underfill 794, and the assembly 700. Although in the example illustration, the tops of the assembly 700I and the interconnection structures 795 are exposed from the mold material 735, this need not be the case.

FIGS. 7 and 8 presented various example method aspects and variations thereof. Other example method aspects will now be presented with reference to additional figures.

As discussed herein in the discussion of FIGS. 7 and 8, block 835 may comprise grinding (or otherwise thinning) the mold material 730 to expose one or more of the die 725, 726. An example is provided at FIG. 7D.

As also discussed, the mold grinding (or thinning) at block 835 need not be performed or may be performed to an extent that still leaves the tops of the die 725, 726 covered with mold material 730. An example is provided at FIG. 9, in which the mold material 735 covers the tops of the die 725, 726 of the assembly 700I.

As also discussed herein, for example with regard to block 897 and FIGS. 7K and 7L, in various example implementations, interconnection structures may be formed on the substrate. An example is provided at FIG. 9. For example, though the tops of the die interconnection structures 795 are initially covered by the mold material 735, vias 940 are ablated in the mold material 735 to reveal the interconnection structures 795.

Also, as discussed herein in the discussion of FIGS. 7 and 8, in various example implementations, TMV interconnection structures need not be formed on the substrate. An example is provided at FIG. 10A. As shown in FIG. 10A, as opposed to FIG. 7K, there are no TMV interconnection structures 795 formed. Also as shown in FIG. 10A, as opposed to block FIG. 1K, the mold material 735 does not cover interconnection structures.

Also for example, as explained herein, the mold grinding (or thinning) at block 899 may be skipped or performed to an extent that leaves the tops of the assembly 700I and/or at least one of the die 725, 726 covered with mold material 735. FIG. 10A provides an example illustration of such processing. Generally, the FIG. 10A assembly 1000A is similar to the FIG. 7K assembly 700K, less the interconnection structures 795 and with mold material 735 covering the assembly 700I.

Additionally, as explained herein, the mold grinding (or thinning) at block 899 may be performed to an extent that exposes the assembly 700I and/or one or more of the tops of the die 725, 726 thereof from the mold material 735 (and/or mold material 730). FIG. 10B provides an example illustration of such processing. Generally, the FIG. 10B assembly 1000B is similar to the FIG. 7K assembly 700K, less the interconnection structures 795.

Figure 11A:
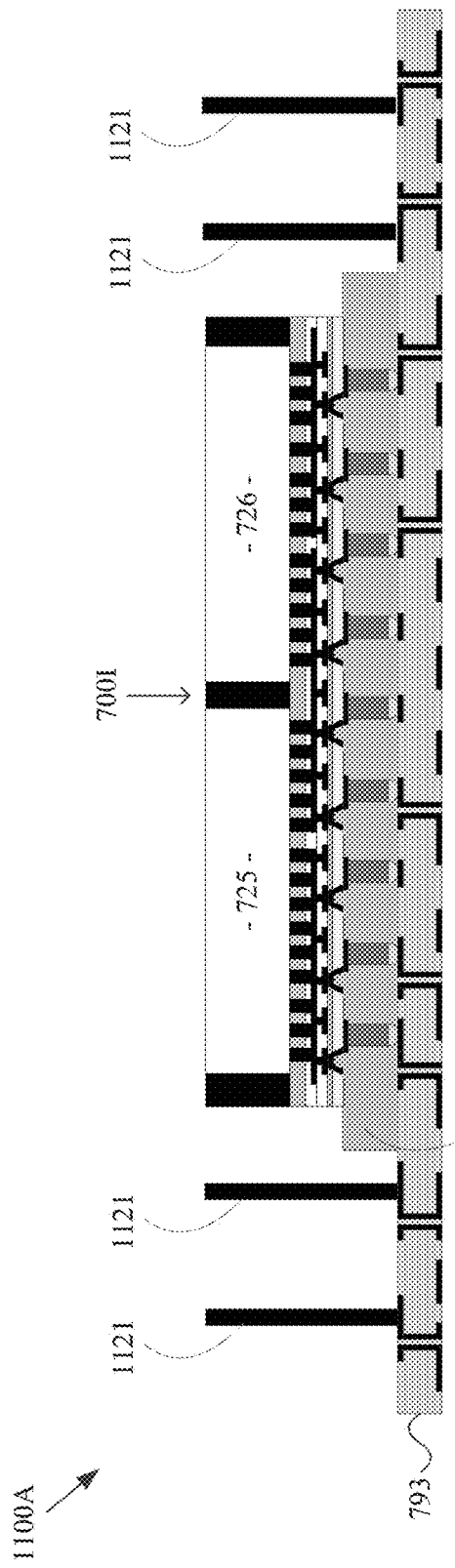

In another example, as explained herein in the discussion of block 897, the TMV interconnections may comprise any of a variety of structures, for example a conductive pillar (e.g., plated post or pillar, vertical wire, etc.). FIG. 11A provides an example illustration of conductive pillars 1121 attached to the substrate 793. The conductive pillars 1121 may, for example, be plated on the substrate 793. The conductive pillars 1121 may also, for example, comprise wires (e.g., wire-bond wires) attached (e.g., wire-bond attached, soldered, etc.) to the substrate 793 and extending vertically. The conductive pillars 1121 may, for example, extend from the substrate 793 to a height greater than a height of the die 725, 726, equal to the height of one or more of the die 725, 726, less than a height of the die 725, 726, etc. Note that any number of rows of the pillars 1121 may be formed. Generally, the FIG. 11A assembly 1100A is similar to the FIG. 7K assembly 700K (less the mold compound 735) with conductive pillars 1121 as interconnection structures instead of elongated conductive balls 795.

Figure 11B:
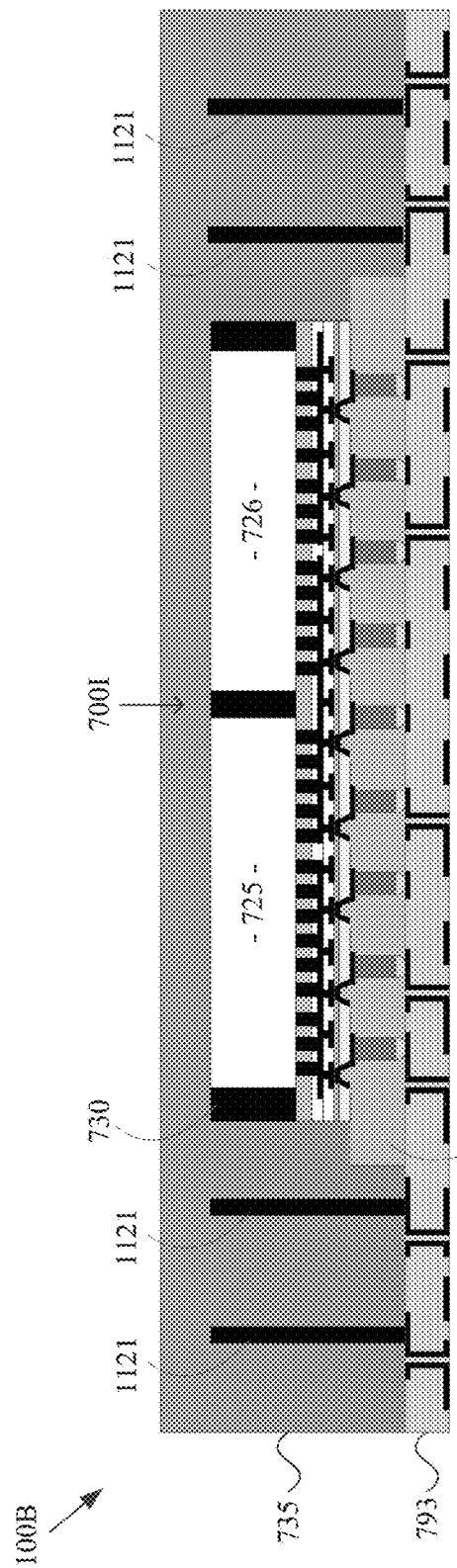

Continuing the example, FIG. 11B illustrates the substrate 793, conductive pillars 1121, assembly 700I (e.g., semiconductor die 725, 726), and underfill 794 covered with mold material 735. The molding may, for example, be performed in accordance with block 899 of the example method 800. Generally, the FIG. 11B assembly 1100B is similar to the FIG. 7K assembly 700K with conductive pillars 1121 as interconnection structures instead of elongated conductive balls 795, and with mold material 735 that has not been thinned or has not been thinned enough to expose the assembly 700I.

Still continuing the example, FIG. 11C illustrates the mold material 735 having been thinned (e.g., ground) to a desired thickness. The thinning may, for example, be performed in accordance with block 899 of the example method 800. Note, for example, that the conductive pillars 1121 and/or the assembly 700I (e.g., including mold material 730 and/or semiconductor die 725, 726 may also be thinned. For example, the thinning of the mold material 735 may expose the top ends of the conductive pillars 1121. If instead, however, the thinning of the mold material 735 does not expose the top ends of the conductive pillars 1121, a mold ablating operation may be performed. Note that although the assembly 1100C is shown with the tops of the semiconductor die 725, 726 of the assembly 700I exposed, the tops need not be exposed.

Generally, the FIG. 11C assembly 1100C is similar to the FIG. 7K assembly 700K with conductive pillars 1121 as interconnection structures instead of elongated conductive balls 795.

Continuing the example, the assembly 1100C shown in FIG. 11C may be further processed by forming a redistribution layer (RDL) 1132 over the mold material 735 and the assembly 700 (e.g., including the mold material 730 and/or semiconductor die 725, 726 thereof). FIG. 11D shows an example of such processing. The redistribution layer 1132 may also be referred to herein as the backside redistribution (RDL) layer 1132. Though such backside RDL forming is not explicitly shown in one of the blocks of the example method 800, such operation may be performed in any of the blocks, for example after the block 899 mold grinding operation (if performed).

As shown in FIG. 11D, a first backside dielectric layer 1133 may be formed and patterned on the mold material 735 and the assembly 700I (e.g., including the mold material 730 and/or semiconductor die 725, 726 thereof). The first backside dielectric layer 1133 may, for example, be formed and patterned in a same or similar manner to the RDL dielectric layer 771 formed at block 855, albeit on a different surface. For example, the first backside dielectric layer 1133 may be formed on the mold material 735 and/or on the assembly 700I (e.g., including the mold material 730 and/or semiconductor die 725, 726 thereof), for example directly on exposed backside surfaces of the die 725, 726, on mold material 730 and/or 735 covering the backside surfaces of the die 725, 726, etc., and vias 1134 may be formed (e.g., by etching, ablating, etc.) in the first backside dielectric layer 1133 to expose at least the tops of the conductive pillars 1121.

Backside traces 1135 may be formed on the first backside dielectric layer 1133 and in the vias 1134 of the first backside dielectric layer 1133. The backside traces 1135 may thus be electrically connected to the conductive pillars 1121. The backside traces 1135 may, for example, be formed in a same or similar manner to the RDL traces 782 formed at block 865. At least some, if not all, of the backside traces 1135 may, for example, extend from the conductive pillars 1121 to locations directly above the assembly 700I (e.g., including the mold material 730 and/or semiconductor die 725, 726 thereof). At least some of the backside traces 1135 may also, for example, extend from the conductive pillars 1121 to locations that are not directly above the assembly 700I (e.g., including the mold material 730 and/or semiconductor die 725, 726 thereof).

A second backside dielectric layer 1136 may be formed and patterned on the first backside dielectric layer 1133 and backside traces 1135. The second backside dielectric layer 1136 may, for example, be formed and patterned in a same or similar manner to the RDL dielectric layer 771 formed at block 855, albeit on a different surface. For example, the second backside dielectric layer 1136 may be formed over the first backside dielectric layer 1133 and over the backside traces 1135, and vias 1137 may be formed (e.g., by etching, ablating, etc.) in the second backside dielectric layer 1136 to expose contact areas of the backside traces 1135.

Backside interconnection pads 1138 (e.g., ball contact pads, lands, terminals, etc.) may be formed on the second backside dielectric layer 1136 and/or in the vias 1137 of the second backside dielectric layer 1136. The backside interconnection pads 1138 may thus be electrically connected to the backside traces 1135. The backside interconnection pads 1138 may, for example, be formed in a same or similar manner to the RDL traces formed at block 865. The backside interconnection pads 1138 may, for example, be formed by forming metal contact pads and/or forming under bump metallization (e.g., to enhance subsequent attachment to the backside traces 1135 by other interconnection structures).

Though the backside RDL layer 1132 is shown with two backside dielectric layers 1133, 1136 and one layer of backside traces 1135, it should be understood that any number of dielectric and/or trace layers may be formed.

Though not shown in FIG. 11D, interconnection structures may be formed on the substrate 793, for example on a side of the substrate 793 opposite the assembly 700I and mold material 735, as discussed herein for example with regard to block 886 and FIG. 7K.

In another example implementation, a substrate (e.g., a laminate substrate, package substrate, etc.) may be attached above the assembly 700I (e.g., including the semiconductor die 725, 726, and mold material 730) and the mold material 735, for example instead of or in addition to the backside RDL discussed herein with regard to FIGS. 11A-11D.

Figure 12A:
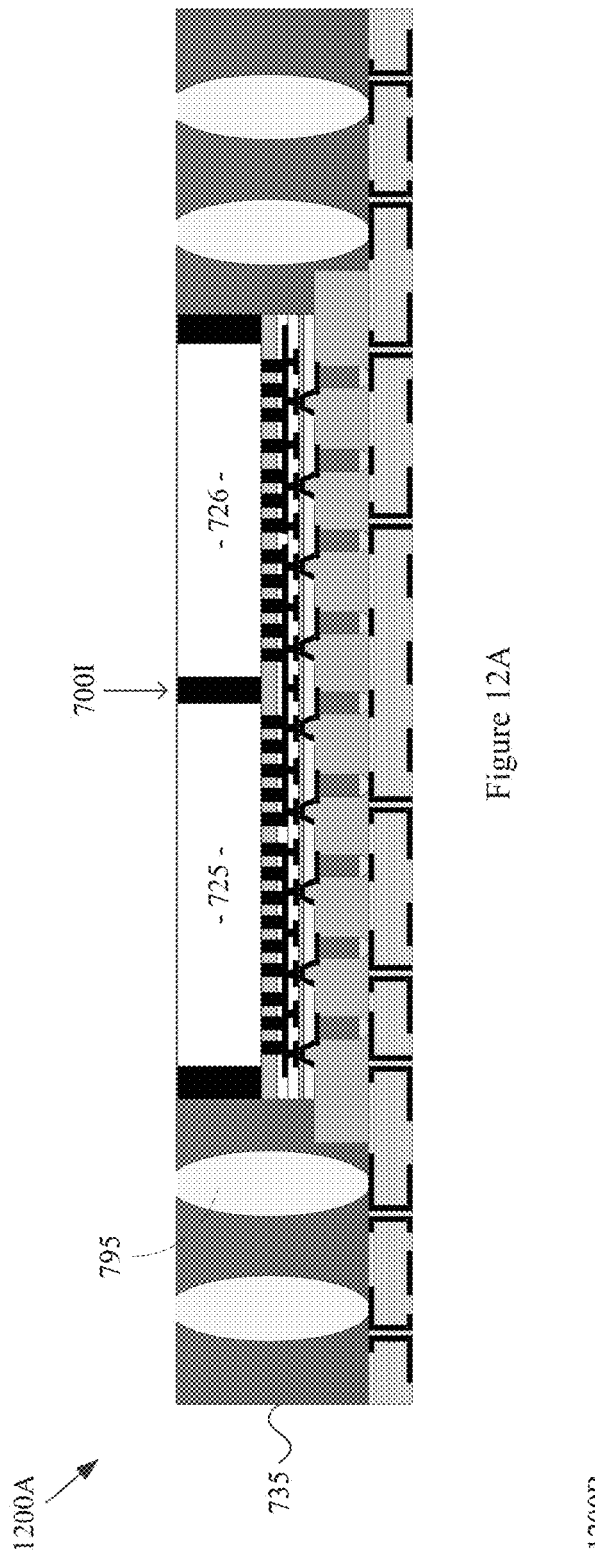
FIGS. 12A-12B show cross-sectional views illustrating an example semiconductor package and an example method of making a semiconductor package, in accordance with various aspects of the present disclosure.

For example, as illustrated in FIG. 12A, the interconnection structures 795 may be formed at a height that will extend to at least the height of the assembly 700. Note that this height is not necessarily present, for example in a scenario in which the backside substrate has its own interconnection structures or in which additional interconnection structures are utilized between the interconnection structures 795 and the backside substrate. The interconnection structures 795 may, for example, be attached in a same or similar manner as that discussed herein with regard to block 897 and FIG. 7K.

Continuing the example, as illustrated in FIG. 12A, the assembly 1200A may be molded with a mold material 735 and the mold material 735 may be thinned if necessary. Such molding and/or thinning may, for example, be performed in a same or similar manner to that discussed herein with regard to block 899, and FIG. 7K.

Figure 12B:
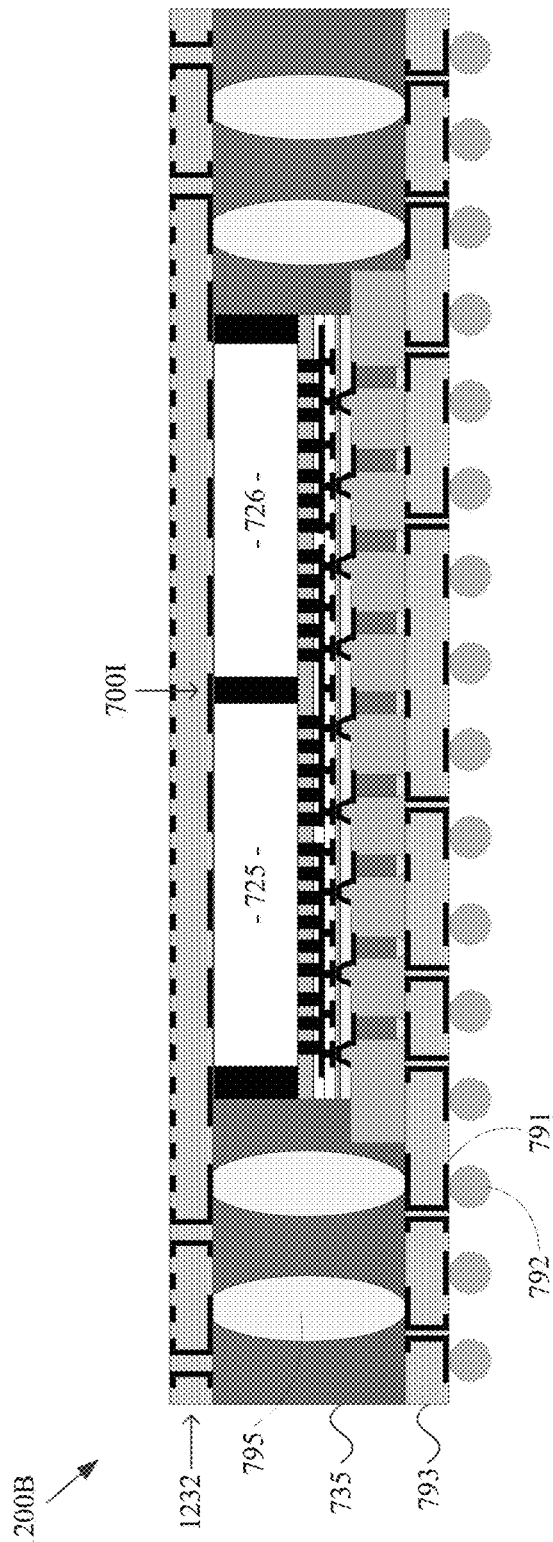

As shown in FIG. 12B, a backside substrate 1232 may be attached. For example, the backside substrate 1232 may be electrically connected to the interconnection structures 795 and/or mechanically attached to the mold material 735 and/or the assembly 700I (e.g., the mold material 730 and/or semiconductor die 725, 726). The backside substrate 1232 may, for example, be attached in panel form and/or single package form, and may for example be attached before or after singulation.

Figure 13:
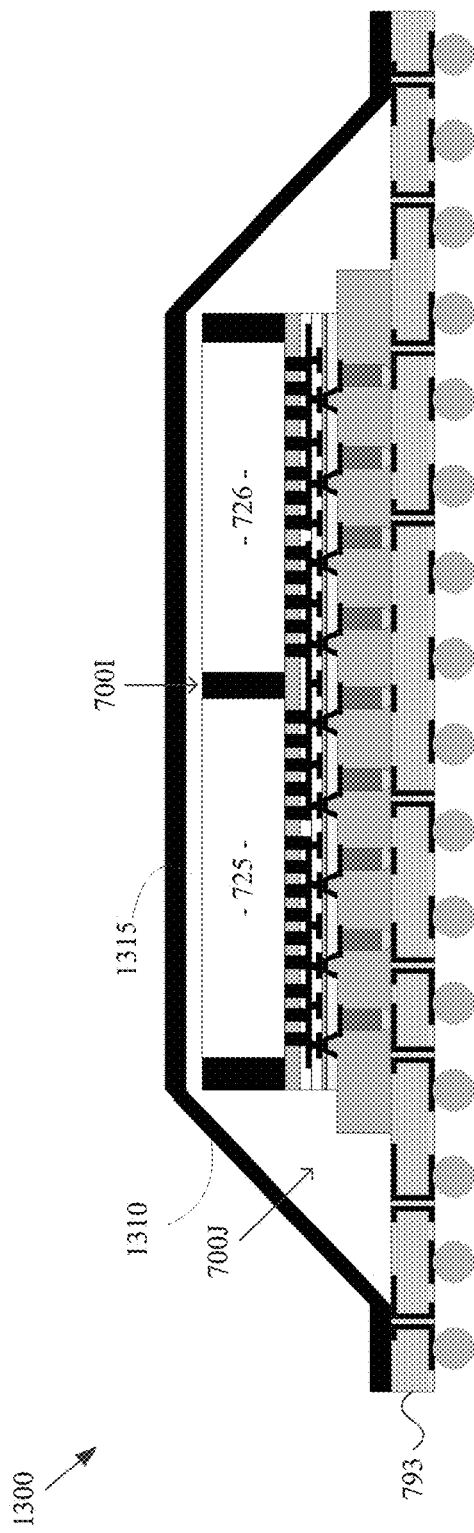
FIG. 13 shows a cross-sectional view illustrating an example semiconductor package and an example method of making a semiconductor package, in accordance with various aspects of the present disclosure.

As discussed herein, after the assembly 700I is attached to the substrate 793, the substrate 793 and/or assembly 700I may be covered with a mold material. Alternatively, or in addition, the substrate 793 and/or assembly 700I may be covered with a lid or stiffener. FIG. 13 provides an illustrative example. FIG. 13 generally shows the assembly 700J of FIG. 7J, with the addition of a lid 1310 (or stiffener).

The lid 1310 may, for example, comprise metal and provide electromagnetic shielding and/or heat dissipation. For example, the lid 1310 may be electrically coupled to a ground trace on the substrate 793 to provide shielding. The lid 1310 may, for example, be coupled to the substrate 793 with solder and/or conductive epoxy. Though not shown, thermal interface material may be formed in a gap 1315 between the assembly 700I and the lid 1310.

Figure 14:
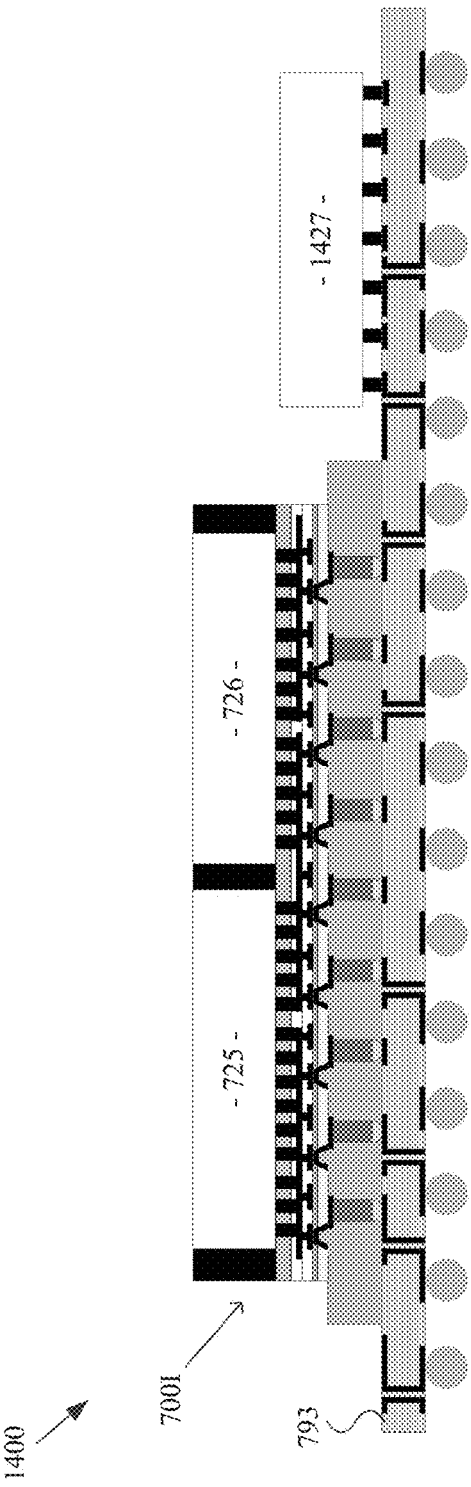
FIG. 14 shows a cross-sectional view illustrating an example semiconductor package and an example method of making a semiconductor package, in accordance with various aspects of the present disclosure.

Though most of the examples shown and discussed herein have generally only shown the assembly 700I attached to the substrate 793, other components (e.g., active and/or passive components) may also be attached to the substrate 793. For example, as shown in FIG. 14, a semiconductor die 1427 may be attached to the substrate 793 (e.g., flip-chip bonded, wire bonded, etc.). The semiconductor die 1427 is attached to the substrate 793 in a manner that is laterally adjacent to the assembly 700I. After such attachment, any of the packaging structures discussed herein (e.g., interconnection structures, moldings, lids, etc.) may then be formed.

Figure 15:
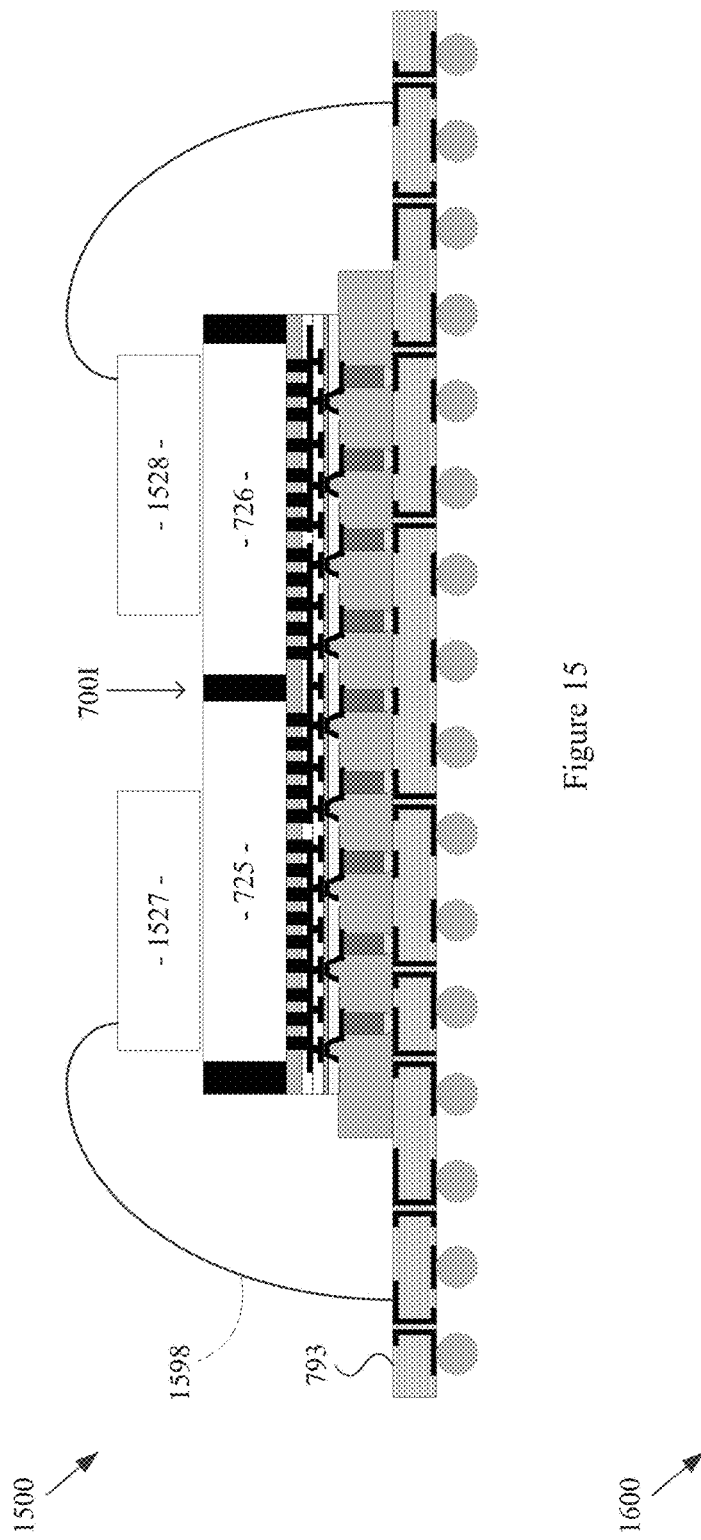
FIG. 15 shows a cross-sectional view illustrating an example semiconductor package and an example method of making a semiconductor package, in accordance with various aspects of the present disclosure.

In another example implementation, other components may be coupled to the top side of the assembly 700I, in a vertical stacking assembly. FIG. 15 shows an example of one such assembly 1500C. A third die 1527 and a fourth die 1528 (e.g., the inactive sides thereof) may be attached to the top of the assembly 700I. Such attachment may, for example, be performed using adhesive. Bond pads on the active sides of the third die 1527 and the fourth die 1528 may then be wire-bonded to the substrate 793. Note that in a scenario in which an RDL and/or substrate is attached over the assembly 700, the third die 1527 and/or fourth die 1528 may be flip-chip bonded to such RDL and/or substrate. After such attachment, any of the packaging structures discussed herein (e.g., interconnection structures, moldings, lids, etc.) may then be formed.

Figure 16:
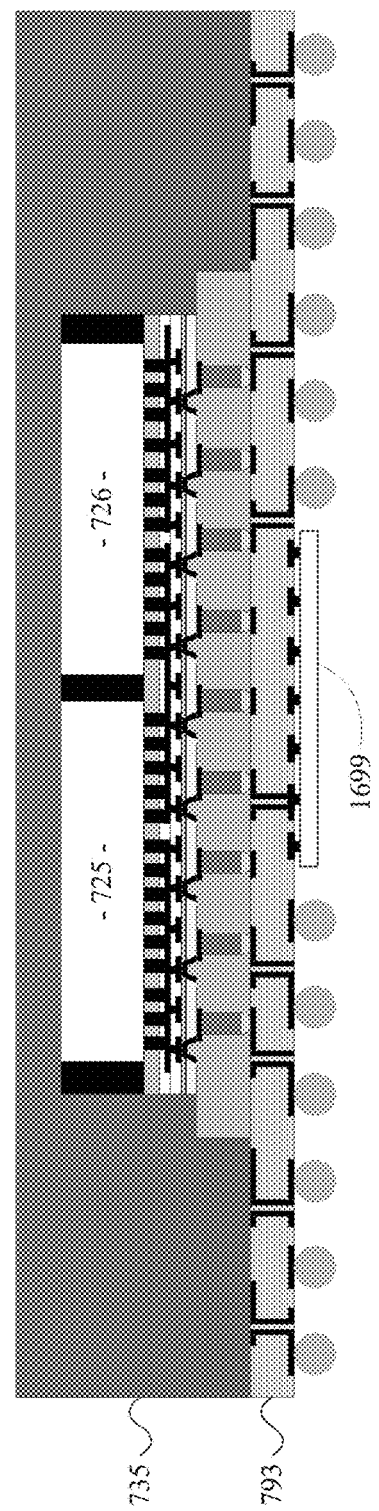
FIG. 16 shows a cross-sectional view illustrating an example semiconductor package and an example method of making a semiconductor package, in accordance with various aspects of the present disclosure.

In yet another example implementation, another component may be coupled to the bottom side of the substrate. FIG. 16 shows an example of one such assembly. A third die 1699 is attached to the bottom side of the substrate 793, for example in a gap between interconnection structures on the bottom side of the substrate 793. After such attachment, any of the packaging structures discussed herein (e.g., interconnection structures, moldings, lids, etc.) may then be formed.

The example methods and assemblies shown in FIGS. 8-16 and discussed herein are merely non-limiting examples presented to illustrate various aspects of this disclosure. Such methods and assemblies may also share any or all characteristics with the methods and assemblies shown and discussed in the following co-pending United States patent applications: U.S. patent application Ser. No. 13/753,120, filed Jan. 29, 2013, and titled "SEMICONDUCTOR DEVICE AND METHOD OF MANUFACTURING SEMICONDUCTOR DEVICE"; U.S. patent application Ser. No. 13/863,457, filed on Apr. 16, 2013, and titled "SEMICONDUCTOR DEVICE AND MANUFACTURING METHOD THEREOF"; U.S. patent application Ser. No. 14/083,779, filed on Nov. 19, 2013, and titled "SEMICONDUCTOR DEVICE WITH THROUGH-SILICON VIA-LESS DEEP WELLS"; U.S. patent application Ser. No. 14/218,265, filed Mar. 18, 2014, and titled "SEMICONDUCTOR DEVICE AND MANUFACTURING METHOD THEREOF"; U.S. patent application Ser. No. 14/313,724, filed Jun. 24, 2014, and titled "SEMICONDUCTOR DEVICE AND MANUFACTURING METHOD THEREOF"; U.S. patent application Ser. No. 14/444,450, Jul. 28, 2014, and titled "SEMICONDUCTOR DEVICE WITH THIN REDISTRIBUTION LAYERS"; U.S. patent application Ser. No. 14/524,443, filed Oct. 27, 2014, and titled "SEMICONDUCTOR DEVICE WITH REDUCED THICKNESS"; U.S. patent application Ser. No. 14/532,532, filed Nov. 4, 2014, and titled "INTERPOSER, MANUFACTURING METHOD THEREOF, SEMICONDUCTOR PACKAGE USING THE SAME, AND METHOD FOR FABRICATING THE SEMICONDUCTOR PACKAGE"; U.S. patent application Ser. No. 14/546,484, filed Nov. 18, 2014, and titled "SEMICONDUCTOR DEVICE WITH REDUCED WARPAGE"; and U.S. patent application Ser. No. 14/671,095, filed Mar. 27, 2015, and titled "SEMICONDUCTOR DEVICE AND MANUFACTURING METHOD THEREOF;" the contents of each of which are hereby incorporated herein by reference in their entirety The discussion herein included numerous illustrative figures that showed various portions of a semiconductor package assembly. For illustrative clarity, such figures did not show all aspects of each example assembly. Any of the example assemblies presented herein may share any or all characteristics with any or all other assemblies presented herein. For example and without limitation, any of the example assemblies shown and discussed with regard to FIGS. 1-7, or portions thereof, may be incorporated into any of the example assemblies discussed with regard to FIGS. 8-16. Conversely, any of the assemblies shown and discussed with regard to FIGS. 8-16 may incorporated into the assemblies shown and discussed with regard to FIGS. 1-7.

In summary, various aspects of this disclosure provide a semiconductor device or package structure and a method for making thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
   a front side redistribution structure ("FSRDS") comprising:
      a top FSRDS side;
      a bottom FSRDS side;
      a lateral FSRDS side between the top FSRDS side and the bottom FSRDS side;
      a first FSRDS dielectric layer; and
      a first FSRDS conductive layer comprising a first FSRDS conductive trace;
   a semiconductor die comprising a front die side and a back die side, the front die side facing toward and coupled to the top FSRDS side, the front die side comprising a conductive pad that is electrically coupled to the first FSRDS conductive layer;
   a stacked component interconnection structure ("SCIS") comprising a top SCIS side and a bottom SCIS side, the bottom SCIS side coupled to the top FSRDS side and electrically coupled to the first FSRDS conductive layer, the top SCIS side extending vertically at least as high as the back die side;
   an encapsulating material on the top FSRDS side and laterally surrounding the semiconductor die, the encapsulating material comprising:
      a top encapsulating material side;
      a bottom encapsulating material side facing the front side redistribution structure; and
      a lateral encapsulating material side between the top encapsulating material side and the bottom encapsulating material side;
   a back side redistribution structure ("BSRDS") comprising:
      a top BSRDS side;
      a bottom BSRDS side coupled to the top SCIS side;
      a first BSRDS dielectric layer on the back die side and on the top encapsulating material side; and
      a first BSRDS conductive layer comprising a first BSRDS conductive trace that is electrically coupled to the stacked component interconnection structure; and
   an underfill material between and in contact with the front die side and the top FSRDS side;
   wherein the front side redistribution structure comprises a build-up redistribution structure, and the back side redistribution structure comprises a laminate substrate.

2. The semiconductor device of claim 1, wherein the stacked component interconnection structure comprises a copper-core solder structure.

3. The semiconductor device of claim 1, wherein the stacked component interconnection structure comprises an elongated conductive ball.

4. The semiconductor device of claim 1, wherein:
   the stacked component interconnection structure comprises a core of a first metal surrounded by a second metal; and
   the encapsulating material laterally surrounds an entirety of the core.

5. The semiconductor device of claim 1, wherein the back die side is exposed from the encapsulating material.

6. The semiconductor device of claim 1, wherein the bottom BSRDS side is mechanically attached to the back die side.

7. The semiconductor device of claim 1, wherein the bottom BSRDS side is mechanically attached to the encapsulating material.

8. The semiconductor device of claim 1, wherein:
   the back side redistribution structure comprises a lateral BSRDS side between the top BSRDS side and the a bottom BSRDS side; and
   the lateral FSRDS side, the lateral encapsulating material side, and the lateral BSRDS side are coplanar.

9. The semiconductor device of claim 1, wherein:
   the semiconductor die comprises a lateral die side between the front die side and the back die side; and
   the underfill material is in contact with the lateral die side.

10. A semiconductor device comprising:
    a first side redistribution structure ("FSRDS") comprising:
       a first FSRDS side;
       a second FSRDS side opposite the first FSRDS side;
       a lateral FSRDS side between the first FSRDS side and the second FSRDS side;
       a first FSRDS dielectric layer; and
       a first FSRDS conductive layer comprising a first FSRDS conductive trace;
    a semiconductor die comprising a first die side, a second die side opposite the first die side, and a lateral die side between the first die side and the second die side, the second die side facing toward and coupled to the first FSRDS side;
    a stacked component interconnection structure ("SCIS") comprising a first SCIS side and a second SCIS side opposite the first SCIS side, the second SCIS side coupled to the first FSRDS side and electrically coupled to the first FSRDS conductive layer, the stacked component interconnect structure vertically spanning an entirety of the semiconductor die;
    an encapsulating material on the first FSRDS side and laterally surrounding the semiconductor die, the encapsulating material comprising:
       a first encapsulating material side;
       a second encapsulating material side opposite the first encapsulating material side and facing the first side redistribution structure; and
       a lateral encapsulating material side between the first encapsulating material side and the second encapsulating material side;
    a second side redistribution structure ("SSRDS") comprising:
       a first SSRDS side;
       a second SSRDS side opposite the first SSRDS side and coupled to the first SCIS side;
       a lateral SSRDS side between the first SSRDS side and the second SSRDS side;
       a first SSRDS dielectric layer; and
       a first SSRDS conductive layer comprising a first SSRDS conductive trace that is electrically coupled to the stacked component interconnection structures; and
    an underfill material directly vertically between the first die side and the first FSRDS side;
    wherein the underfill material laterally extends beyond the lateral die side; and wherein:
one of the first side redistribution structure and the second side redistribution structure comprises a build-up redistribution structure; and
another of the first side redistribution structure and the second side redistribution structure comprises a laminate substrate.

11. The semiconductor device of claim 10, wherein the second side redistribution structure comprises a laminate substrate.

12. The semiconductor device of claim 10, wherein the semiconductor die comprises a die pad on the second die side.

13. The semiconductor device of claim 10, wherein the lateral FSRDS side, the lateral encapsulating material side, and the lateral SSRDS side are coplanar.

14. The semiconductor device of claim 10, wherein the stacked component interconnection structure comprises a copper-core solder structure.

15. The semiconductor device of claim 10, wherein underfill material contacts and covers at least a portion of the lateral die side.

16. The semiconductor device of claim 10, wherein the second SSRDS side is mechanically attached to the first die side.

17. A method of making a semiconductor device, the method comprising:
providing a first side redistribution structure ("FSRDS") comprising:
a first FSRDS side;
a second FSRDS side opposite the first FSRDS side;
a lateral FSRDS side between the first FSRDS side and the second FSRDS side;
a first FSRDS dielectric layer; and
a first FSRDS conductive layer comprising a first FSRDS conductive trace;
providing a semiconductor die comprising a first die side, a second die side opposite the first die side, and a lateral die side between the first die side and the second die side, the second die side facing toward and coupled to the first FSRDS side;
providing a stacked component interconnection structure ("SCIS") comprising a first SCIS side and a second SCIS side opposite the first SCIS side, the second SCIS side coupled to the first FSRDS side and electrically coupled to the first FSRDS conductive layer, the stacked component interconnect structure vertically spanning an entirety of the semiconductor die;
providing an encapsulating material on the first FSRDS side and laterally surrounding the semiconductor die, the encapsulating material comprising:
a first encapsulating material side;
a second encapsulating material side opposite the first encapsulating material side and facing the first side redistribution structure; and
a lateral encapsulating material side between the first encapsulating material side and the second encapsulating material side; and
providing a second side redistribution structure ("SSRDS") comprising:
a first SSRDS side;
a second SSRDS side opposite the first SSRDS side and coupled to the first SCIS side;
a lateral SSRDS side between the first SSRDS side and the second SSRDS side;
a first SSRDS dielectric layer; and
a first SSRDS conductive layer comprising a first SSRDS conductive trace that is electrically coupled to the stacked component interconnection structure,
providing an underfill material directly vertically between the first die side and the first FSRDS side such that the underfill material laterally extends beyond the lateral die side;
wherein:
one of the first side redistribution structure and the second side redistribution structure comprises a build-up redistribution structure; and
another of the first side redistribution structure and the second side redistribution structure comprises a laminate substrate.

18. The method of claim 17, wherein the second side redistribution structure comprises a laminate substrate.

19. The method of claim 17, comprising forming the lateral FSRDS side, the lateral encapsulating material side, and the lateral SSRDS side to be coplanar.

20. The method of claim 17, providing the underfill material directly such that the underfill material contacts and covers at least a portion of the lateral die side.

* * * * *